(12) United States Patent
LePoudre et al.

(10) Patent No.: US 10,808,951 B2
(45) Date of Patent: *Oct. 20, 2020

(54) SYSTEMS AND METHODS FOR PROVIDING COOLING TO A HEAT LOAD

(71) Applicant: Nortek Air Solutions Canada, Inc., Saskatoon (CA)

(72) Inventors: Philip Paul LePoudre, Saskatoon (CA); Manfred Gerber, Saskatoon (CA); Davood Ghadiri Moghaddam, Richmond Hill (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 27 days.

This patent is subject to a terminal disclaimer.

(21) Appl. No.: 16/083,280

(22) PCT Filed: Feb. 14, 2017

(86) PCT No.: PCT/CA2017/050180
§ 371 (c)(1),
(2) Date: Sep. 7, 2018

(87) PCT Pub. No.: WO2017/152268
PCT Pub. Date: Sep. 14, 2017

(65) Prior Publication Data
US 2019/0113247 A1    Apr. 18, 2019

Related U.S. Application Data

(63) Continuation-in-part of application No. PCT/CA2016/050507, filed on May 2, 2016, which is
(Continued)

(51) Int. Cl.
*F28F 7/00* (2006.01)
*F24F 5/00* (2006.01)
(Continued)

(52) U.S. Cl.
CPC ....... *F24F 5/0035* (2013.01); *H05K 7/20309* (2013.01); *H05K 7/20327* (2013.01); *H05K 7/20827* (2013.01); *F24F 2003/1435* (2013.01)

(58) Field of Classification Search
CPC ............ F24F 5/0035; F24F 2003/1435; H05K 7/20309; H05K 7/20327; H05K 7/20827
(Continued)

(56) References Cited

U.S. PATENT DOCUMENTS

| | | | |
|---|---|---|---|
| 1,015,831 A | 1/1912 | Pielock et al. | |
| 2,186,844 A | 1/1940 | Smith | |

(Continued)

FOREIGN PATENT DOCUMENTS

| | | |
|---|---|---|
| AU | 2011286700 A1 | 12/2012 |
| AU | 2014231672 B2 | 3/2018 |

(Continued)

OTHER PUBLICATIONS

Philip LePoudre et al., U.S. Appl. No. 15/574,205, filed Nov. 15, 2017, Specification (Year: 2017).*

(Continued)

*Primary Examiner* — Davis D Hwu
(74) *Attorney, Agent, or Firm* — Schwegman Lundberg & Woessner, P.A.

(57) ABSTRACT

Conditioning systems and methods for providing cooling to a heat load can include an evaporative cooler arranged in a scavenger plenum with a pre-cooler upstream and a recovery coil downstream of the evaporative cooler. Outdoor or scavenger air can be conditioned in the evaporative cooler such that the conditioned scavenger air can provide cooling to a cooling fluid circulating through the recovery coil. The reduced-temperature cooling fluid can provide liquid cooling or air cooling for an enclosed space (for example, a data center) or for one or more devices that are enclosed or open (Continued)

to the atmosphere. Given the design and arrangement of the pre-cooler, evaporative cooler and recovery coil in the plenum, the system can operate in multiple modes. The pre-cooler can be configured to circulate a cooling fluid to condition the scavenger air. The pre-cooler fluid circuit can be coupled or de-coupled from a process cooling fluid circuit.

22 Claims, 13 Drawing Sheets

Related U.S. Application Data a continuation-in-part of application No. PCT/CA2016/050252, filed on Mar. 8, 2016, said application No. PCT/CA2017/050180 is a continuation-in-part of application No. PCT/CA2016/050252, filed on Mar. 8, 2016.

(60) Provisional application No. 62/162,487, filed on May 15, 2015, provisional application No. 62/382,176, filed on Aug. 31, 2016.

(51) Int. Cl.
   *H05K 7/20* (2006.01)
   *F24F 3/14* (2006.01)

(58) Field of Classification Search
   USPC .......................................................... 165/80.4
   See application file for complete search history.

(56) References Cited

U.S. PATENT DOCUMENTS

| | | |
|---|---|---|
| 2,290,465 A | 7/1942 | Crawford et al. |
| 2,562,811 A | 7/1951 | Muffly |
| 2,946,201 A | 7/1960 | Munters |
| 2,968,165 A | 1/1961 | Norback |
| 3,009,684 A | 11/1961 | Munters |
| 3,018,231 A | 1/1962 | Valentine et al. |
| 3,144,901 A | 8/1964 | Meek |
| 3,247,679 A | 4/1966 | Meckler |
| 3,291,206 A | 12/1966 | Nicholson |
| 3,401,530 A | 9/1968 | Meckler |
| 3,467,072 A | 9/1969 | Toesca |
| 3,735,559 A | 5/1973 | Salemme |
| 4,011,731 A | 3/1977 | Meckler |
| 4,113,004 A | 9/1978 | Rush et al. |
| 4,180,985 A | 1/1980 | Northrup, Jr. |
| 4,233,796 A | 11/1980 | Mazzoni et al. |
| 4,235,081 A | 11/1980 | Dowling |
| 4,257,169 A | 3/1981 | Pierce |
| 4,259,849 A | 4/1981 | Griffiths |
| 4,373,347 A | 2/1983 | Howell et al. |
| 4,430,864 A | 2/1984 | Mathiprakasam |
| 4,474,021 A | 10/1984 | Harband |
| 4,538,426 A | 9/1985 | Bock |
| 4,594,860 A | 6/1986 | Coellner et al. |
| 4,691,530 A | 9/1987 | Meckler |
| 4,700,550 A | 10/1987 | Rhodes |
| 4,719,761 A | 1/1988 | Cromer |
| 4,723,417 A | 2/1988 | Meckler |
| 4,729,428 A | 3/1988 | Yasutake et al. |
| 4,729,774 A | 3/1988 | Cohen et al. |
| 4,841,733 A | 6/1989 | Dussault et al. |
| 4,887,438 A | 12/1989 | Meckler |
| 4,900,448 A | 2/1990 | Bonne et al. |
| 4,905,479 A | 3/1990 | Wilkinson |
| 4,909,810 A | 3/1990 | Nakao et al. |
| 4,930,322 A | 6/1990 | Ashley et al. |
| 4,936,107 A | 6/1990 | Kitagaki et al. |
| 4,939,906 A | 7/1990 | Spatz et al. |
| 4,941,324 A | 7/1990 | Peterson et al. |
| 4,982,575 A | 1/1991 | Besik |
| 5,003,961 A | 4/1991 | Besik |
| 5,020,334 A | 6/1991 | Wilkinson |
| 5,020,335 A | 6/1991 | Albers et al. |
| 5,022,241 A | 6/1991 | Wilkinson |
| 5,120,445 A | 6/1992 | Colman |
| 5,131,238 A | 7/1992 | Meckler |
| 5,148,374 A | 9/1992 | Coellner |
| 5,170,633 A | 12/1992 | Kaplan |
| 5,176,005 A | 1/1993 | Kaplan |
| 5,181,387 A * | 1/1993 | Meckler .................. F02G 1/043 62/176.1 |
| 5,191,771 A | 3/1993 | Meckler |
| 5,297,398 A | 3/1994 | Meckler |
| 5,311,929 A | 5/1994 | Verret |
| 5,325,676 A | 7/1994 | Meckler |
| 5,337,574 A | 8/1994 | Dick |
| 5,351,497 A | 10/1994 | Lowenstein |
| 5,353,606 A | 10/1994 | Yoho et al. |
| 5,373,704 A | 12/1994 | Mcfadden |
| 5,387,376 A | 2/1995 | Gasser |
| 5,448,895 A | 9/1995 | Coellner et al. |
| 5,471,852 A | 12/1995 | Meckler |
| 5,482,625 A | 1/1996 | Shimizu et al. |
| 5,496,397 A | 3/1996 | Fischer et al. |
| 5,502,975 A | 4/1996 | Brickley et al. |
| 5,517,828 A | 5/1996 | Calton et al. |
| 5,526,651 A | 6/1996 | Worek et al. |
| 5,542,968 A | 8/1996 | Belding et al. |
| 5,551,245 A | 9/1996 | Calton et al. |
| 5,564,281 A | 10/1996 | Calton et al. |
| 5,579,647 A | 12/1996 | Calton et al. |
| 5,580,369 A | 12/1996 | Belding et al. |
| 5,632,954 A | 5/1997 | Coellner et al. |
| 5,638,900 A | 6/1997 | Lowenstein et al. |
| 5,649,428 A | 7/1997 | Calton et al. |
| 5,650,221 A | 7/1997 | Belding et al. |
| 5,653,115 A | 8/1997 | Brickley et al. |
| 5,660,048 A | 8/1997 | Belding et al. |
| 5,661,983 A | 9/1997 | Groten et al. |
| 5,685,897 A | 11/1997 | Belding et al. |
| 5,701,762 A | 12/1997 | Akamatsu et al. |
| 5,718,286 A | 2/1998 | Damsohn et al. |
| 5,727,394 A | 3/1998 | Belding et al. |
| 5,732,562 A | 3/1998 | Moratalla |
| 5,749,230 A | 5/1998 | Coellner et al. |
| 5,758,508 A | 6/1998 | Belding et al. |
| 5,758,511 A | 6/1998 | Yoho et al. |
| 5,761,915 A | 6/1998 | Rao |
| 5,761,923 A | 6/1998 | Maeda |
| 5,791,153 A | 8/1998 | Belding et al. |
| 5,791,157 A | 8/1998 | Maeda |
| 5,816,065 A | 10/1998 | Maeda |
| 5,825,641 A | 10/1998 | Mangtani |
| 5,826,434 A | 10/1998 | Belding et al. |
| 5,826,641 A | 10/1998 | Bierwirth et al. |
| 5,832,736 A | 11/1998 | Yoshioka et al. |
| 5,860,284 A | 1/1999 | Goland et al. |
| 5,890,372 A | 4/1999 | Belding et al. |
| 5,911,273 A | 6/1999 | Brenner et al. |
| 5,931,016 A | 8/1999 | Yoho |
| 5,943,874 A | 8/1999 | Maeda |
| 5,946,931 A | 9/1999 | Lomax et al. |
| 5,950,447 A | 9/1999 | Maeda et al. |
| 5,992,160 A | 11/1999 | Bussjager et al. |
| 6,003,327 A | 12/1999 | Belding et al. |
| 6,018,953 A | 2/2000 | Belding et al. |
| 6,018,954 A | 2/2000 | Assaf |
| 6,029,462 A | 2/2000 | Denniston |
| 6,029,467 A | 2/2000 | Moratalla |
| 6,050,100 A | 4/2000 | Belding et al. |
| 6,079,481 A | 6/2000 | Lowenstein et al. |
| 6,094,835 A | 8/2000 | Cromer |
| 6,138,470 A | 10/2000 | Potnis et al. |
| 6,141,979 A | 11/2000 | Dunlap |
| 6,145,588 A | 11/2000 | Martin et al. |
| 6,156,102 A | 12/2000 | Conrad et al. |
| 6,176,101 B1 | 1/2001 | Lowenstein |
| 6,178,762 B1 | 1/2001 | Flax |

(56) References Cited

U.S. PATENT DOCUMENTS

| | | |
|---|---|---|
| 6,199,388 B1 | 3/2001 | Fischer |
| 6,199,392 B1 | 3/2001 | Maeda |
| 6,237,354 B1 | 5/2001 | Cromer |
| 6,269,650 B1 | 8/2001 | Shaw |
| 6,318,106 B1 | 11/2001 | Maeda |
| RE37,464 E | 12/2001 | Meckler |
| 6,363,218 B1 | 3/2002 | Lowenstein et al. |
| 6,412,295 B2 | 7/2002 | Weiss et al. |
| 6,442,951 B1 | 9/2002 | Maeda et al. |
| 6,494,053 B1 | 12/2002 | Forkosh |
| 6,497,107 B2 | 12/2002 | Maisotsenko et al. |
| 6,532,763 B1 | 3/2003 | Gupte |
| 6,546,746 B2 | 4/2003 | Forkosh et al. |
| 6,568,466 B2 | 5/2003 | Lowenstein et al. |
| 6,575,228 B1 | 6/2003 | Ragland et al. |
| 6,598,862 B2 | 7/2003 | Merrill et al. |
| 6,635,104 B2 | 10/2003 | Komkova et al. |
| 6,644,059 B2 | 11/2003 | Maeda et al. |
| 6,684,649 B1 | 2/2004 | Thompson |
| 6,709,492 B1 | 3/2004 | Spadaccini et al. |
| 6,720,990 B1 | 4/2004 | Walker et al. |
| 6,739,142 B1 | 5/2004 | Korin |
| 6,745,826 B2 | 6/2004 | Lowenstein et al. |
| 6,751,964 B2 | 6/2004 | Fischer |
| 6,800,118 B2 | 10/2004 | Kusunose et al. |
| 6,841,601 B2 | 1/2005 | Serpico et al. |
| 6,848,265 B2 | 2/2005 | Lowenstein et al. |
| 6,854,278 B2 | 2/2005 | Maisotsenko et al. |
| 6,864,005 B2 | 3/2005 | Mossman |
| 6,935,416 B1 | 8/2005 | Tsunoda et al. |
| 6,973,795 B1 | 12/2005 | Moffitt |
| 6,976,365 B2 | 12/2005 | Forkosh et al. |
| 6,978,633 B2 | 12/2005 | Yamazaki |
| 7,000,427 B2 | 2/2006 | Mathias et al. |
| 7,017,356 B2 | 3/2006 | Moffitt |
| 7,092,006 B2 | 8/2006 | Walker et al. |
| 7,093,452 B2 | 8/2006 | Chee et al. |
| 7,093,649 B2 | 8/2006 | Dawson |
| RE39,288 E | 9/2006 | Assaf |
| 7,178,355 B2 | 2/2007 | Moffitt |
| 7,181,918 B2 | 2/2007 | Reinders et al. |
| 7,231,967 B2 | 6/2007 | Haglid |
| 7,269,966 B2 | 9/2007 | Lowenstein et al. |
| 7,306,650 B2 | 12/2007 | Slayzak et al. |
| 7,331,376 B2 | 2/2008 | Gagnon et al. |
| 7,340,906 B2 | 3/2008 | Moffitt |
| 7,389,646 B2 | 6/2008 | Moffitt |
| 7,389,652 B1 | 6/2008 | Fair |
| 7,593,033 B2 | 9/2009 | Walker et al. |
| 7,602,414 B2 | 10/2009 | Walker et al. |
| 7,605,840 B2 | 10/2009 | Walker et al. |
| 7,717,404 B2 | 5/2010 | Hasegawa et al. |
| 7,719,565 B2 | 5/2010 | Walker et al. |
| 7,737,224 B2 | 6/2010 | Willis et al. |
| 7,753,991 B2 | 7/2010 | Kertzman |
| 7,781,034 B2 | 8/2010 | Yializis et al. |
| 7,817,182 B2 | 10/2010 | Walker et al. |
| D638,925 S | 5/2011 | Charlebois et al. |
| 7,942,387 B2 | 5/2011 | Forkosh |
| 7,966,841 B2 | 6/2011 | Lowenstein et al. |
| 8,002,023 B2 | 8/2011 | Murayama |
| 8,033,532 B2 | 10/2011 | Yabu |
| 8,137,436 B2 | 3/2012 | Calis et al. |
| 8,157,891 B2 | 4/2012 | Montie et al. |
| 8,318,824 B2 | 11/2012 | Matsuoka et al. |
| 8,469,782 B1 | 6/2013 | Roy |
| 8,550,151 B2 | 10/2013 | Murayama et al. |
| 8,769,971 B2 | 7/2014 | Kozubal et al. |
| 8,783,053 B2 | 7/2014 | McCann |
| 8,887,523 B2 | 11/2014 | Gommed et al. |
| 8,899,061 B2 | 12/2014 | Reytblat |
| 8,915,092 B2 | 12/2014 | Gerber et al. |
| 8,920,699 B2 | 12/2014 | Marutani et al. |
| 8,943,848 B2 | 2/2015 | Phannavong et al. |
| 8,966,924 B2 | 3/2015 | Pichai |
| 9,021,821 B2 | 5/2015 | Dunnavant |
| 9,027,764 B2 | 5/2015 | Murutani et al. |
| 9,109,808 B2 | 8/2015 | Gerber et al. |
| 9,188,349 B2 | 11/2015 | Warmerdam et al. |
| 9,234,665 B2 | 1/2016 | Erb et al. |
| 9,243,810 B2 | 1/2016 | Vandermeulen et al. |
| 9,273,877 B2 | 3/2016 | Vandermeulen |
| 9,429,332 B2 | 8/2016 | Vandermeulen et al. |
| 9,810,439 B2 | 11/2017 | Coutu et al. |
| 9,816,760 B2 | 11/2017 | LePoudre et al. |
| 9,909,768 B2 | 3/2018 | Gerber et al. |
| 10,197,310 B2 * | 2/2019 | Ghadiri Moghaddam ................ F24F 3/1423 |
| 2001/0003902 A1 | 6/2001 | Kopko |
| 2002/0005271 A1 | 1/2002 | Weiss et al. |
| 2002/0038552 A1 | 4/2002 | Maisotsenko et al. |
| 2003/0014983 A1 | 1/2003 | Maisotsenko et al. |
| 2003/0037905 A1 | 2/2003 | Weng |
| 2003/0070787 A1 | 4/2003 | Moffitt |
| 2003/0121271 A1 | 7/2003 | Dinnage et al. |
| 2004/0000152 A1 | 1/2004 | Fischer |
| 2004/0061245 A1 | 4/2004 | Maisotsenko et al. |
| 2004/0134211 A1 | 7/2004 | Lee et al. |
| 2004/0134212 A1 | 7/2004 | Lee et al. |
| 2004/0168462 A1 | 9/2004 | Assaf |
| 2004/0226685 A1 | 11/2004 | Gagnon et al. |
| 2005/0056042 A1 | 3/2005 | Bourne et al. |
| 2005/0072303 A1 | 4/2005 | Weidenmann |
| 2005/0230080 A1 | 10/2005 | Paul et al. |
| 2005/0249901 A1 | 11/2005 | Yializis et al. |
| 2005/0262862 A1 | 12/2005 | Moffitt |
| 2006/0021615 A1 | 2/2006 | Kertzman |
| 2006/0032258 A1 * | 2/2006 | Pruitt ................ F24F 5/001 62/310 |
| 2006/0042295 A1 | 3/2006 | Assaf |
| 2006/0205301 A1 | 9/2006 | Klare et al. |
| 2007/0029685 A1 | 2/2007 | Lin |
| 2007/0056894 A1 | 3/2007 | Connors, Jr. |
| 2007/0095519 A1 | 5/2007 | Hombucher |
| 2007/0234743 A1 | 10/2007 | Assaf |
| 2007/0279861 A1 | 12/2007 | Doll et al. |
| 2008/0023182 A1 | 1/2008 | Beamer et al. |
| 2008/0066888 A1 | 3/2008 | Tong et al. |
| 2008/0085437 A1 | 4/2008 | Dean et al. |
| 2008/0099184 A1 | 5/2008 | Han |
| 2008/0283217 A1 | 11/2008 | Gagnon et al. |
| 2009/0095162 A1 | 4/2009 | Hargis et al. |
| 2009/0126913 A1 | 5/2009 | Lee et al. |
| 2009/0133866 A1 | 5/2009 | Campbell et al. |
| 2009/0193974 A1 | 8/2009 | Montie et al. |
| 2009/0294110 A1 | 12/2009 | Foust |
| 2009/0324929 A1 | 12/2009 | Yamakawa et al. |
| 2010/0090356 A1 | 4/2010 | Sines et al. |
| 2010/0170655 A1 | 7/2010 | Kronvall et al. |
| 2010/0170776 A1 | 7/2010 | Ehrenberg et al. |
| 2010/0192605 A1 | 8/2010 | Fang et al. |
| 2010/0200068 A1 | 8/2010 | D'arcy et al. |
| 2010/0275629 A1 | 11/2010 | Erickson |
| 2010/0300123 A1 | 12/2010 | Park et al. |
| 2010/0319370 A1 | 12/2010 | Kozubal et al. |
| 2011/0056384 A1 | 3/2011 | Kadota |
| 2011/0192579 A1 | 8/2011 | Sotokawa et al. |
| 2011/0223486 A1 | 9/2011 | Zhang et al. |
| 2011/0232485 A1 | 9/2011 | Ellsworth |
| 2011/0232633 A1 | 9/2011 | Lima |
| 2011/0259572 A1 | 10/2011 | Muratani et al. |
| 2011/0308265 A1 | 12/2011 | Phannavong et al. |
| 2012/0000227 A1 | 1/2012 | Matsuura et al. |
| 2012/0016700 A1 | 1/2012 | Jabbour et al. |
| 2012/0031133 A1 | 2/2012 | Kuwabara et al. |
| 2012/0061045 A1 | 3/2012 | Huizing |
| 2012/0073791 A1 | 3/2012 | Dubois |
| 2012/0085112 A1 | 4/2012 | Wintemute |
| 2012/0106073 A1 | 5/2012 | Wu et al. |
| 2012/0125020 A1 | 5/2012 | Vandermeulen et al. |
| 2012/0125021 A1 | 5/2012 | Vandermeulen et al. |
| 2012/0125023 A1 | 5/2012 | Kopko et al. |
| 2012/0125031 A1 | 5/2012 | Vandermeulen et al. |
| 2012/0125405 A1 | 5/2012 | Vandermeulen et al. |

(56) References Cited

U.S. PATENT DOCUMENTS

| | | |
|---|---|---|
| 2012/0125581 A1 | 5/2012 | Allen et al. |
| 2012/0131934 A1 | 5/2012 | Vandermeulen et al. |
| 2012/0131937 A1 | 5/2012 | Vandermeulen et al. |
| 2012/0131938 A1 | 5/2012 | Vandermeulen et al. |
| 2012/0131939 A1 | 5/2012 | Vandermeulen et al. |
| 2012/0131940 A1 | 5/2012 | Vandermeulen et al. |
| 2012/0132513 A1 | 5/2012 | Vandermeulen et al. |
| 2012/0162918 A1 | 6/2012 | Thyni et al. |
| 2012/0167600 A1 | 7/2012 | Dunnavant |
| 2012/0168369 A1 | 7/2012 | Van Medevoort et al. |
| 2012/0180505 A1 | 7/2012 | Gerber et al. |
| 2012/0186281 A1 | 7/2012 | Vandermeulen et al. |
| 2012/0247132 A1 | 10/2012 | Lakdawala et al. |
| 2012/0298340 A1 | 11/2012 | Al-Otaibi |
| 2013/0056177 A1 | 3/2013 | Coutu et al. |
| 2013/0186121 A1 | 7/2013 | Erb et al. |
| 2013/0199220 A1 | 8/2013 | Ma et al. |
| 2013/0240438 A1 | 9/2013 | Willis et al. |
| 2013/0248147 A1 | 9/2013 | Wintemute et al. |
| 2013/0283837 A1 | 10/2013 | Takahashi et al. |
| 2013/0340449 A1 | 12/2013 | Kozubal et al. |
| 2014/0054004 A1 | 2/2014 | LePoudre et al. |
| 2014/0054013 A1 | 2/2014 | Lepoudre et al. |
| 2014/0083648 A1 | 3/2014 | Wawryk |
| 2014/0138851 A1 | 5/2014 | Kim et al. |
| 2014/0190037 A1 | 7/2014 | Erb et al. |
| 2014/0190198 A1 | 7/2014 | Slessman et al. |
| 2014/0245769 A1 | 9/2014 | Vandermeulen et al. |
| 2014/0260367 A1 | 9/2014 | Coutu et al. |
| 2014/0260369 A1 | 9/2014 | Lepoudre |
| 2014/0260373 A1 | 9/2014 | Gerber et al. |
| 2014/0260399 A1 | 9/2014 | Vandermeulen |
| 2014/0262125 A1 | 9/2014 | Erb et al. |
| 2014/0262144 A1 | 9/2014 | Erb et al. |
| 2014/0326433 A1 | 11/2014 | Kozubal |
| 2014/0340842 A1 | 11/2014 | Towner et al. |
| 2015/0096714 A1 | 4/2015 | Dagley et al. |
| 2015/0184876 A1 | 7/2015 | Vandermeulen et al. |
| 2015/0292754 A1 | 10/2015 | Mongar |
| 2015/0323203 A1 | 11/2015 | Gerber et al. |
| 2016/0054012 A1 | 2/2016 | Lepoudre et al. |
| 2016/0084512 A1 | 3/2016 | Erb et al. |
| 2016/0187010 A1 | 6/2016 | Vandermeulen et al. |
| 2016/0209087 A1 | 7/2016 | Reytblat et al. |
| 2016/0290666 A1 | 10/2016 | Coutu et al. |
| 2016/0298865 A1 | 10/2016 | Gerber et al. |
| 2016/0327345 A1 | 11/2016 | Lowenstein |
| 2017/0241655 A1 | 8/2017 | Lepoudre et al. |
| 2018/0073753 A1 | 3/2018 | Lepoudre et al. |
| 2018/0128510 A1* | 5/2018 | LePoudre ............... F24F 13/30 |
| 2018/0135880 A1 | 5/2018 | Ghadiri Moghaddam et al. |
| 2018/0187918 A1 | 7/2018 | Lepoudre et al. |

FOREIGN PATENT DOCUMENTS

| | | |
|---|---|---|
| AU | 2015230799 B2 | 3/2018 |
| AU | 2013305427 B2 | 4/2018 |
| CA | 2283089 A1 | 11/2000 |
| CA | 2801352 A1 | 12/2011 |
| CA | 2798928 A1 | 2/2012 |
| CA | 2843763 A1 | 3/2013 |
| CA | 2904224 A1 | 9/2014 |
| CH | 193732 A | 10/1937 |
| CN | 1163389 A | 10/1997 |
| CN | 1343292 A | 4/2002 |
| CN | 1456855 A | 11/2003 |
| CN | 1517610 A | 8/2004 |
| CN | 1518477 A | 8/2004 |
| CN | 1666081 A | 9/2005 |
| CN | 1711448 A | 12/2005 |
| CN | 200958820 Y | 10/2007 |
| CN | 101368754 A | 2/2009 |
| CN | 201203217 Y | 3/2009 |
| CN | 101405559 A | 4/2009 |
| CN | 101421580 A | 4/2009 |
| CN | 101469090 A | 7/2009 |
| CN | 101918777 A | 12/2010 |
| CN | 102076401 A | 5/2011 |
| CN | 201906567 U | 7/2011 |
| CN | 102149979 A | 8/2011 |
| CN | 102165268 A | 8/2011 |
| CN | 102232015 A | 11/2011 |
| CN | 102345909 A | 2/2012 |
| CN | 102395419 A | 3/2012 |
| CN | 102548727 A | 7/2012 |
| CN | 102549361 A | 7/2012 |
| CN | 102933931 A | 2/2013 |
| CN | 103069246 A | 4/2013 |
| CN | 103245018 A | 8/2013 |
| CN | 203116208 U | 8/2013 |
| CN | 103827595 A | 5/2014 |
| CN | 104048434 A | 9/2014 |
| CN | 203893703 U | 10/2014 |
| CN | 104136855 A | 11/2014 |
| CN | 104583706 A | 4/2015 |
| CN | 103261801 B | 11/2015 |
| CN | 105121989 A | 12/2015 |
| CN | 105164474 A | 12/2015 |
| CN | 105164484 A | 12/2015 |
| CN | 105202795 A | 12/2015 |
| CN | 105283715 A | 1/2016 |
| CN | 101512238 A | 8/2016 |
| CN | 103827595 B | 4/2017 |
| CN | 105164484 B | 6/2017 |
| CN | 105121989 B | 9/2017 |
| CN | 107249715 A | 10/2017 |
| CN | 107300230 A | 10/2017 |
| CN | 107560482 A | 1/2018 |
| CN | 107850335 A | 3/2018 |
| CN | 107923647 A | 4/2018 |
| CN | 108027221 A | 5/2018 |
| CN | 109073265 A | 12/2018 |
| DE | 10143092 A1 | 3/2003 |
| EP | 0448991 A2 | 10/1991 |
| EP | 0661502 A2 | 7/1995 |
| EP | 0678321 A2 | 10/1995 |
| EP | 1108575 A1 | 6/2001 |
| EP | 2397787 A2 | 12/2011 |
| EP | 2751493 B1 | 3/2018 |
| FR | 2291457 A1 | 6/1976 |
| GB | 1354502 A | 6/1974 |
| GB | 2015384 A | 9/1979 |
| IN | 201717044889 A | 3/2018 |
| IN | 201717044890 A | 3/2018 |
| IN | 201817002765 A | 4/2018 |
| IN | 201817037404 A | 12/2018 |
| JP | 6152594 A | 3/1986 |
| JP | 05157282 A | 6/1993 |
| JP | 09196482 A | 7/1997 |
| JP | 10170177 A | 6/1998 |
| JP | 2004116419 A | 4/2004 |
| JP | 2004257588 A | 9/2004 |
| JP | 2008070046 A | 3/2008 |
| JP | 2009275955 A | 11/2009 |
| SG | 10201809840VA | 12/2018 |
| SG | 11201807692V | 2/2020 |
| SG | 10201913923WA | 3/2020 |
| TW | I271499 B | 1/2007 |
| WO | WO-9641107 A1 | 12/1996 |
| WO | WO-1996041107 A1 | 12/1996 |
| WO | WO-1999014535 A1 | 3/1999 |
| WO | WO-0135039 A1 | 5/2001 |
| WO | WO-0171260 A1 | 9/2001 |
| WO | WO-03049835 A1 | 6/2003 |
| WO | WO-2004065875 A1 | 8/2004 |
| WO | WO-2008037079 A1 | 4/2008 |
| WO | WO-2008053367 A2 | 5/2008 |
| WO | WO-2008089484 A1 | 7/2008 |
| WO | WO-2009000974 A1 | 12/2008 |
| WO | WO-2009094032 A1 | 7/2009 |
| WO | WO-2009158030 A1 | 12/2009 |
| WO | WO-2010006968 A1 | 1/2010 |
| WO | WO-2011062808 A1 | 5/2011 |
| WO | WO-2011161547 A2 | 12/2011 |

(56) References Cited

FOREIGN PATENT DOCUMENTS

| | | |
|---|---|---|
| WO | WO-2011161547 A3 | 12/2011 |
| WO | WO-2012018089 A1 | 2/2012 |
| WO | WO-2012042553 A1 | 4/2012 |
| WO | WO-2012087273 A1 | 6/2012 |
| WO | WO-2012097445 A1 | 7/2012 |
| WO | WO-2012167366 A1 | 12/2012 |
| WO | WO-2013029148 A1 | 3/2013 |
| WO | WO-2013094206 A1 | 6/2013 |
| WO | WO-2013107554 A1 | 7/2013 |
| WO | WO-2013192397 A1 | 12/2013 |
| WO | WO-2014029003 A1 | 2/2014 |
| WO | WO-2014029004 A1 | 2/2014 |
| WO | WO-2014107790 A1 | 7/2014 |
| WO | WO-2014138846 A1 | 9/2014 |
| WO | WO 2014138847 A1 | 9/2014 |
| WO | WO-2014138851 A1 | 9/2014 |
| WO | WO-2014138859 A1 | 9/2014 |
| WO | WO-2014138860 A1 | 9/2014 |
| WO | WO-2014142277 A1 | 9/2014 |
| WO | WO-2015192249 A1 | 12/2015 |
| WO | WO-2016026042 A1 | 2/2016 |
| WO | WO-2016183667 A1 | 11/2016 |
| WO | WO-2016183668 A1 | 11/2016 |
| WO | WO-2016207864 A1 | 12/2016 |
| WO | WO-2017152268 A1 | 9/2017 |

OTHER PUBLICATIONS

Philip LePoudre et al., U.S. Appl. No. 15/574,205, filed Nov. 15, 2017, Drawings (Year: 2017).*
Philip LePoudre et al., U.S. Appl. No. 15/574,205, filed Nov. 15, 2017, Claims (Year: 2017).*
U.S. Appl. No. 15/574,201, filed Nov. 15, 2017, Using Liquid to Air Membrane Energy Exchanger for Liquid Cooling.
U.S. Appl. No. 15/574,205, filed Nov. 15, 2017, Systems and Methods for Managing Conditions in Enclosed Space.
U.S. Appl. No. 15/814,153, filed Nov. 15, 2017, Systems and Methods for Providing Cooling to a Heat Load.
"U.S. Appl. No. 15/574,201, Non Final Office Action dated Jan. 15, 2020", 8 pgs.
"U.S. Appl. No. 15/574,201, Non Final Office Action dated Jan. 29, 2019", 6 pgs.
"U.S. Appl. No. 15/574,201, Notice of Allowance dated May 21, 2020", 5 pgs.
"U.S. Appl. No. 15/574,201, Notice of Allowance dated Aug. 20, 2019", 7 pgs.
"U.S. Appl. No. 15/574,201, Response Filed Jan. 7, 2019 to Restriction Requirement dated Sep. 5, 2018", 8 pgs.
"U.S. Appl. No. 15/574,201, Response filed May 15, 2020 to Non Final Office Action dated Jan. 15, 2020", 13 pgs.
"U.S. Appl. No. 15/574,201, Response filed Jul. 29, 2019 to Non-Final Office Action dated Jan. 29, 2019", 12 pgs.
"U.S. Appl. No. 15/574,201, Restriction Requirement dated Sep. 5, 2018", 6 pgs.
"U.S. Appl. No. 15/574,205, Corrected Notice of Allowability dated Apr. 17, 2020", 2 pgs.
"U.S. Appl. No. 15/574,205, Non Final Office Action dated Jun. 17, 2019", 3 pgs.
"U.S. Appl. No. 15/574,205, Non Final Office Action dated Sep. 11, 2018", 6 pgs.
"U.S. Appl. No. 15/574,205, Notice of Allowance dated Feb. 13, 2019", 6 pgs.
"U.S. Appl. No. 15/574,205, Notice of Allowance dated Apr. 9, 2020", 5 pgs.
"U.S. Appl. No. 15/574,205, Notice of Allowance dated Dec. 2, 2019", 5 pgs.
"U.S. Appl. No. 15/574,205, Response filed Jan. 11, 2019 to Non-Final Office Action dated Sep. 11, 2018", 12 pgs.
"U.S. Appl. No. 15/574,205, Response filed Nov. 18, 2019 to Non-Final Office Action dated Jun. 17, 2019", 8 pgs.
"U.S. Appl. No. 15/814,153, Non Final Office Action dated Oct. 9, 2019", 16 pgs.
"U.S. Appl. No. 15/814,153, Response filed Apr. 9, 2020 to Non Final Office Action dated Oct. 9, 2019", 15 pgs.
"U.S. Appl. No. 15/814,153, Response filed Jul. 15, 2019 to Restriction Requirement dated May 15, 2019", 9 pgs.
"U.S. Appl. No. 15/814,153, Restriction Requirement dated May 15, 2019", 6 pgs.
"Chinese Application Serial No. 201680038134.X, Office Action dated Apr. 7, 2020", w/o English Translation, 13 pgs.
"Chinese Application Serial No. 201680038134.X, Office Action dated Jul. 8, 2019", w/ English Translation, 30 pgs.
"Chinese Application Serial No. 201680038134.X, Response filed Jan. 23, 2020 to Office Action dated Jul. 8, 2019", w/ English claims, 32 pgs.
"Chinese Application Serial No. 201680038135.4, Office Action dated Aug. 26, 2019", w/ English Translation, 23 pgs.
"Chinese Application Serial No. 201680038135.4, Response filed Mar. 10, 2020 to First Office Action dated Aug. 26, 2019", w/ English Translation, 12 pgs.
"Chinese Application Serial No. 201780027034.1, Office Action dated Apr. 13, 2020", w/ English Translation, 35 pgs.
"European Application Serial No. 16795581.4, Extended European Search Report dated Feb. 12, 2019", 9 pgs.
"European Application Serial No. 16795581.4, Response filed Aug. 6, 2018 to Communication Pursuant to Rules 161(2) and 162 EPC dated Jan. 26, 2018", 16 pgs.
"European Application Serial No. 16795581.4, Response filed Sep. 11, 2019 to Extended European Search Report dated Feb. 12, 2019", 14 pgs.
"European Application Serial No. 16795582.2, Extended European Search Report dated Nov. 20, 2018", 8 pgs.
"European Application Serial No. 16795582.2, Response filed Jun. 17, 2019 to Extended European Search Report dated Nov. 20, 2018", 16 pgs.
"European Application Serial No. 16795582.2, Response filed Jul. 17, 2018 to Communication Pursuant to Rules 161(2) and 162 EPC dated Jan. 8, 2018", 12 pgs.
"European Application Serial No. 17762365.9, Extended European Search Report dated Oct. 17, 2019", 8 pgs.
"European Application Serial No. 17762365.9, Response filed Apr. 25, 2019 to Communication Pursuant to Rules 161 and 162 dated Oct. 16, 2018", 12 pgs.
"International Application Serial No. PCT/CA2015/050570, International Search Report dated Sep. 1, 2015", 5 pgs.
"International Application Serial No. PCT/CA2015/050570, Written Opinion dated Sep. 1, 2015", 4 pgs.
"International Application Serial No. PCT/CA2016/050252, International Preliminary Report on Patentability dated Nov. 30, 2017", 6 pgs.
"International Application Serial No. PCT/CA2016/050252, International Search Report dated May 26, 2016", 3 pgs.
"International Application Serial No. PCT/CA2016/050252, Written Opinion dated May 26, 2016", 4 pgs.
"International Application Serial No. PCT/CA2016/050507, International Preliminary Report on Patentability dated Nov. 30, 2017", 5 pgs.
"International Application Serial No. PCT/CA2016/050507, International Search Report dated Jul. 21, 2016", 3 pgs.
"International Application Serial No. PCT/CA2016/050507, Written Opinion dated Jul. 21, 2016", 3 pgs.
"International Application Serial No. PCT/CA2017/050180, International Preliminary Report on Patentability dated Sep. 20, 2018", 6 pgs.
"International Application Serial No. PCT/CA2017/050180, International Search Report dated Apr. 26, 2017", 3 pgs.
"International Application Serial No. PCT/CA2017/050180, Written Opinion dated Apr. 26, 2017", 4 pgs.
"Munters PFC Polymer Fluid Cooler", Munters Corp., (Sep. 2015), 2 pgs.
"Oasis PFC Polymer Fluid Cooler Product Information", Munters Corp., (Nov. 2013), 2 pgs.

(56) References Cited

OTHER PUBLICATIONS

"Singaporean Application Serial No. 11201709404P, Response filed Jul. 22, 2019 to Written Opinion dated Feb. 22, 2019", in English, 62 pgs.
"Singaporean Application Serial No. 11201709404P, Witten Opinion dated Feb. 22, 2019", in English, 8 pgs.
"AAONAIRE Energy Recovery Units Users Information Manual", AAON, Inc., (Aug. 2006), 16 pgs.
"Advances in Desiccant-Based Dehumidification", American Standard, TRANE Engineers Newsletter, vol. 34-4, (2005), 8 pgs.
"Chapter 8—Heating, Ventilating, and Air Conditioning (HVAC) Demonstration", HVAC Demonstration, (published prior to Feb. 21, 2014), 16 pgs.
"Dehumidification Solutions", Des Champs Laboratories, Inc., (2001), 18 pgs.
"Desi-WringerTM Precision Desiccant Dehumidification Systems", Des Champs Technologies, (2007), 12 pgs.
"Energy Recovery—Fresh in Air Quality", SEMCO Inc., (published before Apr. 12, 2012), 131 pgs.
"European Application Serial No. 17762365.9, Response filed May 15, 2020 to Extended European Search Report dated Oct. 17, 2019", 13 pgs.
"Meeting Programs", ASHRAE Technical Committee, (1997-2001), 13 pgs.
"Two-Wheel Desiccant Dehumidification System—Technology for Dehumidification and Improving Indoor Air Quality", Federal Technology Alert, (Apr. 1997), 24 pgs.
Abdel-Salam, Mohamed R. H., et al., "Experimental Study of Effects of Phase-Change Energy and Operating Parameters on Performances of Two-Fluid and Three-Fluid Liquid-to-Air Membrane Energy Exchangers". ASHRAE Transactions, vol. 122, Part 1, (Jan. 2016), 134-145.
Abdel-Salam, Mohamed R. H., et al., "Performance testing of 2-fluid and 3-fluid liquid-to-air membrane energy exchangers for HVAC applications in cold-dry climates", International Journal of Heat and Mass Transfer. 106, (2017), 12 pgs.
Abdel-Salam, Mohamed R. H., et al., "Performance testing of a novel 3-fluid liquid-to-air membrane energy exchanger (3-fluid LAMEE) under desiccant solution regeneration operating conditions", International Journal of Heat and Mass Transfer, 95, (2015), 14 pgs.
Acker, William, "Industrial Dehumidification: Water Vapor Load Calculations and System Descriptions", HPAC Heating/Piping/Air Conditioning. (Mar. 1999), 49-59.
Bellia, L., et al., "Air Conditioning Systems With Desiccant Wheel for Italian Climates", International Journal on Architectural Science, vol. 1 No. 4, (2000), 193-213.
Bergero, Stefano, et al., "On the performances of a hybrid air-conditioning system in different climatic conditions", Energy 36(8), (2011), 13 pgs.
Bergero, Stefano, et al., "Performance analysis of a liquid desiccant and membrane contactor hybrid air-conditioning system", Energy and Buildings 42, (2010), 11 pgs.
Chant, Eileen E., et al., "A Steady-State Simulation of an Advanced Desiccant-Enhanced Cooling and Dehumidification System", ASHRAE Transactions: Research, (Jul. 1992), 339-347.
Coad, William J., "Conditioning Ventilation Air for Improved Performance and Air Quality", HPAC Heating/Piping/Air Conditioning, (Sep. 1999), 6 pgs.
Diblasio, Robert, "Desiccants in Hospitals—Conditioning a Research Facility", Engineered Systems, (Sep. 1995), 4 pgs.
Downing, et al., "Operation and Maintenance for Quality Indoor Air", Proc. of the 7th Symposium on Improving Building Systems in Hot and Humid Climates, Ft. Worth, TX, (Oct. 9, 1990), 5 pgs.
Downing, Chris, "Humidity Control—No Place Like Home", Engineered Systems, (1996), 4 pgs.
Erb, Blake, et al., "Experimental Measurements of a Run-Around Membrane Energy Exchanger (RAMEE) with Comparison to a Numerical Model", ASHRAE Transactions, vol. 115, Part 2, (2009), 689-705.

Fischer, J., et al., "Active Desiccant Dehumidification Module Integration Wth Rooftop Packaged HVAC Units—Final Report Phase 3B", Oak Ridge National Laboratory, Final Report: Phase 3B, (Mar. 2002), 36 pgs.
Fischer, John C., "Optimizing IAQ, Humidity Control, and Energy Efficiency in School Environments Through the Application of Desiccant-Based Total Energy Recovery Systems", IAQ Atlanta: Paths to Better Building Environments/Environmental Effects on Heath and Productivity, (1996), 16 pgs.
Harriman, III, et al., "Dehumidification and Cooling Loads From Ventilation Air", ASHRAE Journal, (Nov. 1997), 7 pgs.
Harriman, III, et al., "Evaluating Active Desiccant Systems for Ventilating Commercial Buildings", ASHRAE Journal, (Oct. 1999), 7 pgs.
Harriman, III, et al., "New Weather Data for Energy Calculations", ASHRAE Journal, (Mar. 1999), 7 pgs.
Jeong, et al., "Energy Conservation Benefits of a Dedicated Outdoor Air System with Parallel Sensible Cooling by Ceiling Radiant Panels", ASHRAE Transactions; vol. 109 Part 2, (2003), 10 pgs.
Karniadakis, George E., et al., "Minimum-dissipation transport enhancement by flow destabilization: Reynolds' analogy revisited", J. Fluid Mech vol. 192, (1988), 365-391.
Kosar, Douglas R., et al., "Dehumidification Issues of Standard 62-1989", ASHRAE Journal, (Mar. 1998), 71-75.
Larson, Michael David, et al., "The Performance of Membranes in a Newly Proposed Run-Around Heat and Moisture Exchanger", MS Thesis in Mechanical Engineering, University of Saskatchewan, Saskatoon, Canada, [Online] Retrieved from the internet: <URL: http://libran.usask.ca/theses/available/etd-12192006-094159/umestricted/LarsonThesis.pdf>, (Dec. 2006), 177 pgs.
Lepoudre, P., et al., "Channel Flow with Sinusoidal Screen Insert", Dept. of Mech Engineering, Univ. of Saskatchewan, Proceedings of the 19th Annual Conference of the CFD Society of Canada, Montreal, (Apr. 2011), 6 pgs.
Mahmud, Khizir, "Design and Performance Testing of Counter-Cross-Flow Run-Around Membrane Energy Exchanger System", MS Thesis in Mechanical Engineering, University of Saskatchewan, Saskatoon, Canada, [Online] Retrieved form the internet: <URL: http://libranusask.ca/theses/ available/ etd-09092009-223833/ unrestricted/KhizirMahmud2009-Sep-28a.pdf>, (Sep. 2009), 168 pgs.
Mahmud, Khizir, et al., "Performance testing of a counter-cross-flow run-around membrane energy exchanger (RAMEE) system for HVAC applications", Energy and Buildings, 42, (2010), 9 pgs.
McGahey, Kevin, et al., "Desiccants: Benefits for the Second Century of Air Conditioning", Proceedings of the 10th Symposium on Improving Building Systems in Hot and Humid Climates, Ft. Worth, Texas, (May 14, 1996), 9 pgs.
McGahey, Kevin, "New Commercial Applications for Desiccant-Based Cooling", ASHRAE Journal, (Jul. 1998), 41-45.
Mumma, Stanley A., et al., "Achieving Dry Outside Air in an Energy-Efficient Manner", ASHRAE Transactions 2001, vol. 107, Part 1, (2001), 8 pgs.
Mumma, Stanley A., "Dedicated Outdoor Air-Dual Wheel System Control Requirements", ASHRAE Transactions, vol. 107, Part 1, (2001), 9 pgs.
Mumma, Stanley A., et al., "Extension of the Multiple Spaces Concept of ASH RAE Standard 62 to Include Infiltration, Exhaust/Exfiltration, Interzonal Transfer, and Additional Short-Circuit Paths", ASHRAE Transactions: Symposia, (1998), 1232-1241.
Mumma, Stanley A, "Overview of Integrating Dedicated Outdoor Air Systems Wth Parallel Terminal Systems", ASHRAE Transactions vol. 107, Part 1, (2001), 7 pgs.
Nimmo, B. G., et al., "DEAC: Desiccant Enhancement of Cooling-Based Dehumidification", ASHRAE Transactions: Symposia, (1993), 842-848.
Qin, C. K., et al., "Engine-driven Desiccant-assisted Hybrid Air-conditioning System", 23rd World Gas Conference, Amsterdam, (2006), 15 pgs.
Ryan, K., et al., "Three-dimensional transition in the wake of bluff elongated cylinders", J. Fluid Mech., vol. 538, (2005), 29 pgs.
Scofield, C. Mike, et al., "HVAC Design for Classrooms: Divide and Conquer", Heating/Piping/Air Conditioning, (May 1993), 53-59.

(56) References Cited

OTHER PUBLICATIONS

Sevigny, Scoot P., et al., "Air Handling Unit Direct Digital Control System Retrofit to Provide Acceptable Indoor Air Quality and Global Energy Optimization", Energy Engineering, vol. 94, No. 5, (1997), 24-43.
Shank, Kurt M., et al., "Selecting the Supply Air Conditions for a Dedicated Outdoor Air System Working in Parallel with Distributed Sensible Cooling Terminal Equipment", ASHRAE Transactions, vol. 107, Part 1, (2001), 10 pgs.
Smith, Christopher S., et al., "Outdoor Air, Heat Wheels and JC Penny: A New Approach to Retail Ventilation", Proc. of the 11th Symposium on Improving Building Systems in Hot and Humid Climates, Ft. Worth, Texas, (Jun. 2, 1998), 1 pg.
Smith, James C., "Schools Resolve IAQ/Humidity Problems with Desiccant Preconditioning", Heating/Piping/Air Conditioning, (Apr. 1996), 6 pgs.
Sonin, Ain A., et al., "Optimization of Flow Design in Forced Flow Electrochemical Systems, with Special Application to Electrodialysis", Ind. Eng. Chem, Process Des. Develop vol. 13, No. 3, (1974), 8 pgs.
Swails, James F., et al., "A Cure for Growing Pains", Consulting Specifying Engineer, [Online] Retrieved from the Internet: <URL: https://www.csemag.com>, (Jun. 1997), 4 pgs.
Turpin, Joanna, "Dehumidification: The Problem No One Wants to Talk About", [Online] Retrieved from the internet: <URL: http//www.esmagazine.com/copyrighVde12c1c879ba8010VgnVCM100000f932a8c0_?>, (Apr. 5, 2000), 6 pgs.
Vali, Alireza, "Modeling a Run-Around Heat and Moisture Exchanger Using Two Counter/Cross Flow Exchangers", MS Thesis in Mechanical Engineering, University of Saskatchewan, Saskatoon, Canada, [Online] Retrieved from the Internet: <URL: http://library.usask.ca/theses/mailable/etd-06032009-15-J.6-J.-1./unrestricted/Vali.AlirezaThesis.pdf>, (2009), 193 pgs.
Vali, Alireza, et al., "Numerical model and effectiveness correlations for a run-around heat recovery system with combined counter and cross flow exchangers", International Journal of Heat and Mass Transfer 52, (2009), 14 pgs.
Woods, J, et al., "Desiccant Enhanced Evaporative Air Conditioning: Parametric Analysis and Design", 2nd International Conference on Building Energy and Environment (COBEE), (Oct. 2012), 10 pgs.
Yborra, Stephen C., "Field Evaluation of Desiccant-Integrated HVAC Systems: A Review of Case Studies in Multiple Commercial/Institutional Building Types", Proc. of the 11th Symposium on Improving Building Systems in Hot and Humid Climates, Ft. Worth, (Texas, (Jun. 2, 1998), 10 pgs.
U.S. Appl. No. 14/830,492, filed Aug. 19, 2015, Liquid to Air Membrane Energy Exchangers.
U.S. Appl. No. 15/739,016, filed Dec. 21, 2017, Three-Fluid Liquid to Air Membrane Energy Exchanger.
U.S. Appl. No. 13/449,598, U.S. Pat. No. 9,810,439, filed Apr. 18, 2012, Energy Exchange System for Conditioning Air in an Enclosed Structure.
U.S. Appl. No. 15/185,180, filed Jun. 17, 2016, Energy Exchange System for Conditioning Air in an Enclosed Structure.
U.S. Appl. No. 13/702,596, U.S. Pat. No. 9,234,665, filed Apr. 15, 2013, Liquid-To-Air Membrane Energy Exchanger.
U.S. Appl. No. 14/957,795, filed Dec. 3, 2015, Liquid-To-Air Membrane Energy Exchanger.
U.S. Appl. No. 16/351,046, filed Mar. 12, 2019, Liquid-To-Air Membrane Energy Exchanger.
U.S. Appl. No. 13/737,473, filed Jan. 9, 2013, System and Method for Providing Conditioned Air to an Englosed Structure.
U.S. Appl. No. 13/797,152, U.S. Pat. No. 9,816,760, filed Mar. 12, 2013, Liquid Panel Assembly.
U.S. Appl. No. 15/590,685, filed May 9, 2017, Liquid Panel Assembly.
U.S. Appl. No. 13/797,062, filed Mar. 12, 2013, Membrane Support Assembly for an Energy Exchanger.
U.S. Appl. No. 14/187,413, filed Feb. 24, 2014, Evaporative Cooling System With Liquid-To-Air Membrane Energy Exchanger.
U.S. Appl. No. 13/801,280, U.S. Pat. No. 9,109,808, filed Mar. 12, 2013, Variable Desiccant Control Energy Exchange System and Method.
U.S. Appl. No. 14/804,953, U.S. Pat. No. 9,909,768, filed Jul. 21, 2015, Variable Desiccant Control Energy Exchange System and Method.
U.S. Appl. No. 15/185,155, filed Jun. 17, 2016, Variable Desiccant Control Energy Exchange System and Method.
U.S. Appl. No. 16/661,463, filed Oct. 23, 2019, Variable Desiccant Control Energy Exchange System and Method.
U.S. Appl. No. 14/192,019, filed Feb. 27, 2014, Energy Exchange Assembly With Microporous Membrane.
U.S. Appl. No. 14/190,715, filed Feb. 26, 2014, Membrane-Integrated Energy Exchange Assembly.
U.S. Appl. No. 16/431,397, filed Jun. 4, 2019, Membrane-Integrated Energy Exchange Assembly.
U.S. Appl. No. 14/171,951, filed Feb. 4, 2014, Control System and Method for a Liquid Desiccant Air Delivery System.
U.S. Appl. No. 16/784,822, filed Feb. 7, 2020, Control System and Method for a Liquid Desiccant Air Delivery System.
"U.S. Appl. No. 15/814,153, Non Final Office Action dated Jul. 6, 2020", 12 pgs.

* cited by examiner

SYSTEMS AND METHODS FOR PROVIDING COOLING TO A HEAT LOAD

This application is a U.S. National Stage Filing under 35 U.S.C. § 371 of International Patent Application No. PCT/CA2017/050180, filed on Feb. 14, 2017, and published on Sep. 14, 2017 as WO 2017/152268 A1, which claims the benefit of U.S. Provisional Patent Application No. 62/382,176, filed on Aug. 31, 2016, the benefit of priority of which are claimed hereby. International Application No. PCT/CA2017/050180 is a continuation-in-part of International Application No. PCT/CA2016/050252, filed on Mar. 8, 2016, and a continuation-in-part of International Application No. PCT/CA2016/050507, filed on May 2, 2016. International Application No. PCT/CA2016/050252 claims the benefit of priority of U.S. Provisional Patent Application No. 62/162,487, filed on May 15, 2015. International Application No. PCT/CA2016/050507 is a continuation-in-part of International Application No. PCT/CA2016/050252, and claims the benefit of priority of U.S. Provisional Patent Application No. 62/162,487. Each of the above-listed applications is hereby incorporated by reference herein in its entirety.

CLAIM OF PRIORITY

This application claims the benefit of U.S. Provisional Patent Application No. 62/382,176, filed on Aug. 31, 2016, the benefit of priority of which is claimed hereby, and which is incorporated by reference herein in its entirety.

This application is a continuation-in-part of International Application No. PCT/CA2016/050252, filed on Mar. 8, 2016, and a continuation-in-part of International Application No. PCT/CA2016/050507, filed on May 2, 2016. International Application No. PCT/CA2016/050252 claims the benefit of priority of U.S. Provisional Patent Application No. 62/162,487, filed on May 15, 2015. International Application No. PCT/CA2016/050507 is a continuation-in-part of International Application No. PCT/CA2016/050252, filed on Mar. 8, 2016, and claims the benefit of priority of U.S. Provisional Patent Application No. 62/162,487, filed on May 15, 2015, and the benefit of priority of PCT/CA2016/050252. Each of the above-listed applications is hereby incorporated by reference herein in its entirety.

BACKGROUND

The present application relates to conditioning systems and methods for providing cooling to a heat load. In an example, the heat load can be from an enclosed space, for example, a data center, and cooling can be provided by cooling the air or heat-generating components in the enclosed space with liquid or air cooling. In an example, the heat load can be from one or more devices or other piece of equipment that may or may not be arranged within an enclosed space.

There are many applications where cooling is critical, such as, for example, data centers. A data center usually consists of computers and associated components working continuously (24 hours per day, 7 days per week). The electrical components in a data center can produce a lot of heat, which then needs to be removed from the space. Air-conditioning systems in data centers can often consume more than 40% of the total energy.

With the current data centers' air-conditioning systems and techniques and significant improvements in IT components operating conditions and processing capacity, servers can roughly operate at 50% of their capacity. This capacity limitation is due, in part, to the cooling systems not being able to cool the servers efficiently and the servers reach their high temperature limit before reaching their maximum processing capacity. High density data center cooling seeks to cool servers more effectively and increase the density of the data centers. Consequently, this will result in savings in data center operating cost and will increase the data center overall capacity.

The high density data center cooling can be achieved by using liquid cooling technologies to reject the heat at the server. Data center liquid cooling affects the data center energy consumption in two ways: (1) utilizing maximum server processing capacity and data center processing density which will result in lower cooling power consumption per kW of processing power in the data center, and (2) generally liquid-cooling systems are more energy efficient than data centers air-cooling systems. The liquid cooling technology can capture up to 100% of the heat at the server which can eliminate the need for data centers air-cooling systems. The data center liquid cooling can save up to 90% in data centers cooling costs and up to 50% in data centers operating costs. Also, data center liquid cooling can increase the servers processing density by up to 100%, which can result in significant savings.

Overview

The present inventors recognize, among other things, an opportunity for improved performance in providing cooling to a heat load using a conditioning system having an evaporative cooler in combination with an upstream pre-cooler and a downstream recovery coil. The heat load can be from an enclosed space or from one or more devices. In an example, the conditioning system can produce cold water (or other type of cooling fluid) for providing liquid cooling or air cooling to the enclosed space. In an example, the conditioning system can produce cold water (or other type of cooling fluid) for providing liquid cooling to a device or other piece of equipment not arranged within an enclosed space.

The three components of the conditioning system can be arranged inside a scavenger air plenum configured to receive an outdoor or scavenger air stream and direct the air stream through the plenum. The evaporative cooler can condition the outdoor air such that the conditioned air can pass through the recovery coil disposed downstream of the evaporative cooler and cool water circulating through the recovery coil. The reduced-temperature water exiting the recovery coil can be used for liquid cooling or air cooling for the heat load. The pre-cooler can be located upstream of the evaporative cooler and can be configured to selectively pre-condition the scavenger air depending on the outdoor air conditions. The reduced-temperature water or cold water can also be referred to herein as process water or cold process water, since this is the water produced by the conditioning system and used for providing liquid cooling or air cooling to the heat load.

The inclusion and arrangement of these three components (pre-cooler, evaporative cooler, and recovery coil) in the scavenger air plenum allows the conditioning system to operate in multiple modes depending in part on the outdoor air conditions and an amount of cooling needed for the heat load. In an economizer mode, the pre-cooler and the evaporative cooler can be bypassed since the outdoor air conditions are such that the scavenger air does not need to be conditioned or cooled prior to the recovery coil. In a normal or evaporation mode, the pre-cooler can be bypassed but the evaporative cooler can be used to condition the scavenger air prior to the recovery coil. In an enhanced mode, the pre-cooler can be used to pre-condition the scavenger air prior to passing the scavenger air through the evaporative cooler.

Examples according to the present application can include conditioning systems for providing liquid or air cooling to a data center having IT components.

Examples according to the present application can include conditioning systems having any type of evaporative cooler configured to condition a scavenger air stream using an evaporative fluid. In some examples, the evaporative fluid in the evaporative cooler (for example, water) can be collected and used for providing liquid cooling or air cooling. In those examples, the evaporative cooler can directly produce cold water for liquid cooling or air cooling, in combination with the recovery coil. In some examples, the evaporative fluid in the evaporative cooler is not collected, in which case the evaporative cooler indirectly produces cold water by conditioning the scavenger air prior to passing the scavenger air through the recovery coil, and the recovery coil directly produces the cold water for liquid cooling or air cooling.

Examples according to the present application can include conditioning systems having an evaporative cooler that operates in an adiabatic mode in which the evaporative fluid in the evaporative cooler recirculates through the evaporate cooler in a closed fluid circuit confined to the evaporative cooler. In some cases, the evaporative cooler can switch back and forth from the adiabatic process to the configuration in which the evaporative fluid from the evaporative cooler can be collected for use as the cold process water (or other fluid) for liquid cooling or air cooling.

Examples according to the present application can include various designs of the cooling fluid circuit for the pre-cooler. In some examples, the cooling fluid for the pre-cooler can be coupled with the process cooling fluid (i.e. the cold water produced in the recovery coil and, in some cases, the evaporative cooler) such that the pre-cooler uses the water flowing through the recovery coil or evaporative cooler. In other examples, the cooling fluid for the pre-cooler can be partially decoupled such that the fluid circuit through the pre-cooler can be separate from the process fluid circuit through the recovery coil or evaporative cooler within the plenum, but the cooling fluid for the pre-cooler can be taken from a reservoir or main supply of cold water produced by the recovery coil or evaporative cooler. In yet other examples, the cooling fluid for the pre-cooler can be wholly decoupled such that the cooling fluid circuit for the pre-cooler can be separate from the process cooling circuit.

Examples according to the present application can include conditioning systems having multiple cooling units with each cooling unit having the evaporative cooler and recovery coil, and optionally the pre-cooler. The pre-cooler can be an optional component that can be included depending on the climate where the conditioning system is to be installed. By providing a partially decoupled or wholly decoupled pre-cooler design, each cooling unit can have a standard cooling capacity independent of whether a pre-cooler is included and how much it operates.

Examples according to the present application can include a liquid-cooling system for a data center, the liquid cooling system having a Liquid-to-Air Membrane Energy Exchanger (LAMEE) as an evaporative cooler, which can reduce the data center cooling energy consumption compared to conventional air cooling data centers techniques. The liquid cooling system can be significantly smaller in size and lighter compared to other direct evaporative coolers (DEC), including air-cooling DECs. The liquid-cooling system as described herein can reduce the water consumption in comparison with other evaporative cooling systems and can reduce the operating cost of the data center. Data centers liquid cooling can be effective since a typical liquid, such as water, at the same volume flow rate as air, has almost 350 times higher thermal capacity than the air. The system can include a cooling fluid circuit connected to the cooling fluid flow path of the LAMEE and recovery coil and extending from the plenum into the data center. The cooling fluid circuit can be used to deliver reduced temperature water from the LAMEE and recovery coil (or a reduced temperature coolant) to the data center to provide cooling to the data center without moving air from the data center through the cooling system.

Examples according to the present application can include an air-cooling system for a data center or other enclosed space, the air-cooling system having a LAMEE as an evaporative cooler. The LAMEE and the recovery coil can collectively produce cold water that can be used to cool a process air stream. A process air plenum can receive the hot process air from the enclosed space. The cold water from the LAMEE and the recovery coil can be delivered into the process air plenum to provide air cooling to the hot process air. In an example, the cold water can circulate through a liquid-to-air heat exchanger configured to cool the hot process air with the cold water.

Conditioning systems having the three components described above can operate in multiple modes for both air cooling and liquid cooling, as well as for the various pre-cooler designs. The inclusion of a pre-cooler in the conditioning systems can eliminate the need for supplemental mechanical cooling in some cooling applications.

This overview is intended to provide an overview of subject matter in the present application. It is not intended to provide an exclusive or exhaustive explanation of the invention. The detailed description is included to provide further information about the present application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present application relates to conditioning systems and methods for providing cooling to a heat load. The heat load can be any type of device or system that generates heat. The device or system can be enclosed or open to the atmosphere. In an example, the heat load can be from a data center. The conditioning systems and methods of the present application include an evaporative cooler arranged in a scavenger air plenum with a pre-cooler arranged upstream of the evaporative cooler and a recovery coil arranged downstream of the evaporative cooler. The conditioning systems of the present application can use outdoor air (scavenger air) that can be conditioned in the evaporative cooler such that the scavenger air can provide cooling to a cooling fluid circulating through the recovery coil. The reduced-temperature cooling fluid exiting the recovery coil can be used to provide liquid cooling or air cooling to the heat load.

The design and arrangement of the three components (pre-cooler, evaporative cooler and recovery coil) in the scavenger air plenum can allow for the conditioning systems described herein to operate in multiple modes, depending in part on the outdoor air conditions. The recovery coil can be used in each of the modes to reduce a temperature of the cooling fluid. The evaporative cooler and pre-cooler can be optionally used, depending on the operating mode. In an example, the evaporative cooler can cool the scavenger air, as well as an evaporative fluid that can be collected and provide liquid cooling or air cooling in combination with the cooling fluid from the recovery coil. In another example, the evaporative cooler can be configured primarily to condition the scavenger air, which can then cool the cooling fluid in the recovery coil, and the evaporative fluid from the evaporative cooler is not collected for process cooling. In an example, the evaporative cooler can be configured to selectively operate in an adiabatic mode with a closed evaporative fluid cooling circuit. The various modes of operation are described below. Various types of evaporative coolers usable in the conditioning systems of the present application are described below.

The pre-cooler can be configured to circulate a cooling fluid in order to condition the scavenger air prior to passing the scavenger air through the evaporative cooler. The inclusion of the pre-cooler can eliminate the need for supplemental mechanical cooling in some cooling applications. In an example, the cooling fluid circuit for the pre-cooler can be coupled with the cooling fluid circuit for the evaporative cooler and recovery coil (process cooling fluid), which is used to provide liquid or air cooling to the heat load. In another example, the cooling fluid circuit for the pre-cooler can be partially or wholly decoupled from the process cooling fluid circuit.

Figure 1A:
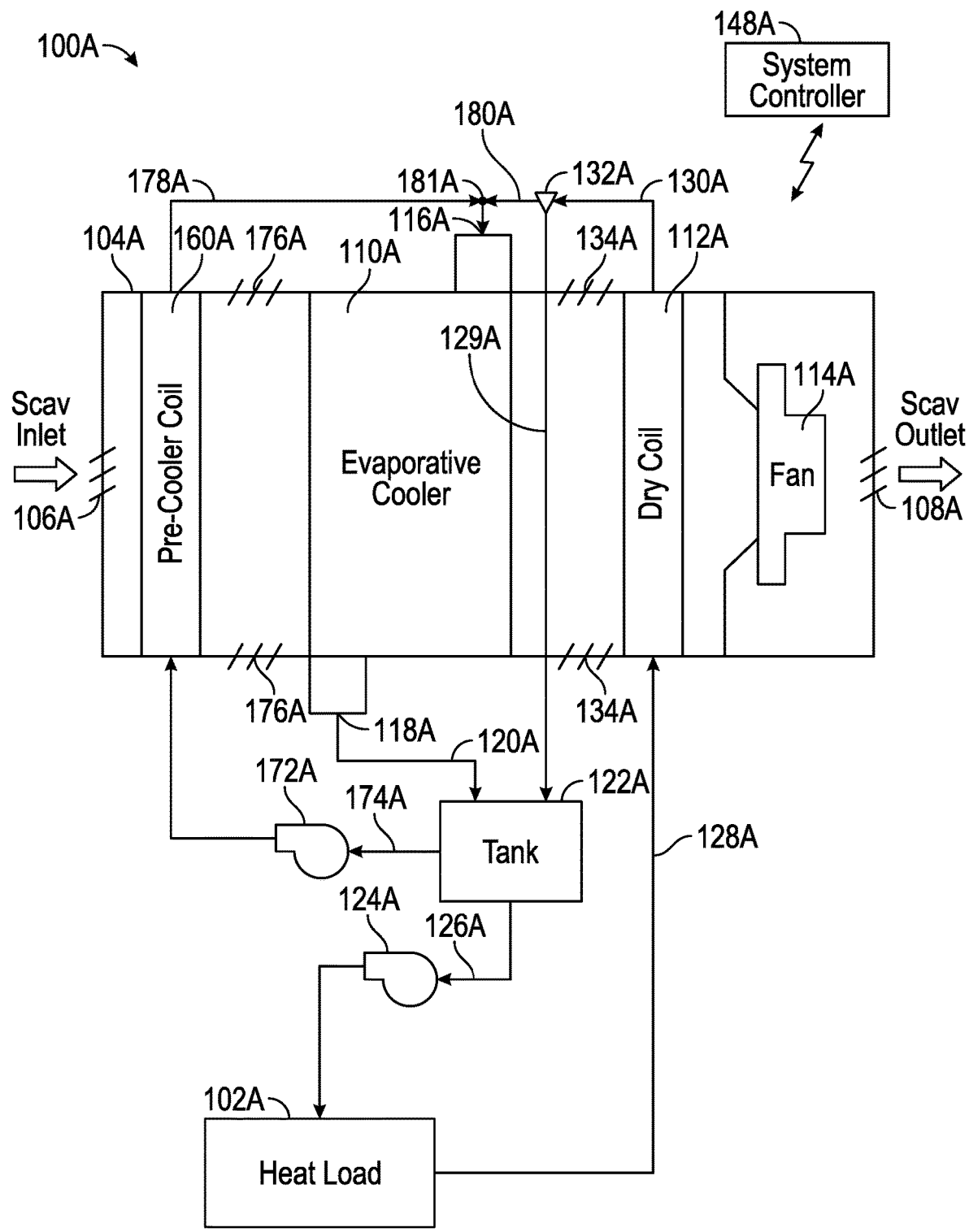
FIG. 1A is a schematic of an example conditioning system for providing liquid cooling.

FIG. 1A illustrates an example conditioning system 100A for providing cooling to a heat load 102A. The conditioning system 100A can include a scavenger air plenum 104A which can include an air inlet 106A and an air outlet 108A through which a scavenger air stream can flow. The plenum 104A can also be referred to as a housing, cabinet or structure, and can be configured to house one or more components used to condition air or water. Because the plenum 104A can house the components configured to provide cooling, the plenum 104A can also be referred to herein as a cooling system or cooling unit. The plenum 104A can be disposed outside of an enclosed space having the heat load 102A or located external to the devices that produce the heat load 102A.

The cooling system 104A can include a pre-cooler 160A, an evaporative cooler 110A, a dry coil (or cooling coil) 112A, and a fan (or fan array) 114A, all of which can be arranged inside the cooling system or plenum 104A. The dry coil or cooling coil 112A can also be referred to herein as a recovery coil. The pre-cooler 160A can also be referred to herein as a pre-cooling coil, a pre-cooler coil, a pre-conditioner or a dry coil. The pre-cooler 160A can be referred to herein as a first cooling component (upstream of the evaporative cooler 110A) and the dry coil 112A can be referred to herein as a second cooling component (downstream of the evaporative cooler 110A). In some examples, a filter (not shown) can be arranged inside the scavenger plenum 104A near the air inlet 106A. A filter can similarly be included in the scavenger plenum of other example conditioning systems in accordance with this disclosure.

The scavenger air entering the plenum 104A can pass through a pre-cooler 160A to precondition the scavenger air. The pre-cooler 160A is discussed further below. The scavenger air exiting the pre-cooler 160A can then pass through the evaporative cooler 110A. The evaporative cooler 110A can be configured to condition the scavenger air passing there through using an evaporative fluid, such as water. The evaporative cooler 110A can use the cooling potential in both the air and the evaporative fluid to reject heat. In an example, as scavenger air flows through the evaporative cooler 110A, the evaporative fluid, or both the scavenger air and the evaporative fluid, can be cooled to a temperature approaching the wet bulb (WB) temperature of the air leaving the pre-cooler 160A. Due to the evaporative cooling process in the evaporative cooler 110A, a temperature of the evaporative fluid at an outlet 118A of the evaporative cooler 110A can be less than a temperature of the evaporative fluid at an inlet 116A of the evaporative cooler 110A; and a temperature of the scavenger air at an outlet of the evaporative cooler 110A can be less than a temperature of the scavenger air at an inlet of the evaporative cooler 110A. In some cases, a temperature reduction of the evaporative fluid can be significant, whereas in other cases, the temperature reduction can be minimal. Similarly, a temperature reduction of the scavenger air can range between minimal and significant. In some cases, the scavenger air temperature can increase across the evaporative cooler 110A. Such temperature reduction of one or both of the evaporative fluid and the scavenger air can depend in part on the outdoor air conditions (temperature, humidity), operation of the pre-cooler 160A, and operation of the evaporative cooler 110A. For example, as described below and shown in FIG. 1B, in an example, the evaporative cooler 110B can selectively operate adiabatically, in which case a temperature of the evaporative fluid circulating through the evaporative cooler 110B can remain relatively constant or undergo minimal changes.

The evaporative cooler 110A can be any type of evaporative cooler configured to exchange energy between an air stream and a cooling fluid through evaporation of a portion of the fluid into the air. Evaporative coolers can include direct-contact evaporation devices in which the working air stream and the liquid water (or other fluid) stream that is evaporated into the air to drive heat transfer are in direct contact with one another. In what is sometimes referred to as "open" direct-contact evaporation devices, the liquid water may be sprayed or misted directly into the air stream, or, alternatively the water is sprayed onto a filler material or wetted media across which the air stream flows. As the unsaturated air is directly exposed to the liquid water, the water evaporates into the air, and, in some cases, the water is cooled.

Such direct-contact evaporation devices can also include what is sometimes referred to as a closed circuit device. Unlike the open direct-contact evaporative device, the closed system has two separate fluid circuits. One is an external circuit in which water is recirculated on the outside of the second circuit, which is tube bundles (closed coils) connected to the process for the hot fluid being cooled and returned in a closed circuit. Air is drawn through the recirculating water cascading over the outside of the hot tubes, providing evaporative cooling similar to an open circuit. In operation the heat flows from the internal fluid circuit, through the tube walls of the coils, to the external circuit and then by heating of the air and evaporation of some of the water, to the atmosphere.

These different types of evaporative coolers can also be packaged and implemented in specific types of systems. For example, a cooling tower can include an evaporative cooling device such as those described above. A cooling tower is a device that processes working air and water streams in generally a vertical direction and that is designed to reject waste heat to the atmosphere through the cooling of a water stream to a lower temperature. Cooling towers can transport the air stream through the device either through a natural draft or using fans to induce the draft or exhaust of air into the atmosphere. Cooling towers include or incorporate a direct-contact evaporation device/components, as described above.

Examples of evaporative coolers usable in the conditioning systems of the present application can also include other types of evaporative cooling devices, including liquid-to-air membrane energy exchangers. Unlike direct-contact evaporation devices, a liquid-to-air membrane energy exchanger (LAMEE) separates the air stream and the liquid water stream by a permeable membrane, which allows water to evaporate on the liquid water stream side of the membrane and water vapor molecules to permeate through the membrane into the air stream. The water vapor molecules permeated through the membrane saturate the air stream and the associated energy caused by the evaporation is transferred between the liquid water stream and the air stream by the membrane.

Membrane exchangers may have some advantages over other types of evaporative coolers. For example, the LAMEE may eliminate or mitigate maintenance requirements and concerns of conventional cooling towers or other systems including direct-contact evaporation devices, where the water is in direct contact with the air stream that is saturated by the evaporated water. For example, the membrane barriers of the LAMEE inhibit or prohibit the transfer of contaminants and micro-organisms between the air and the liquid stream, as well as inhibiting or prohibiting the transfer of solids between the water and air. The use of a LAMEE as the evaporative cooler in the conditioning system is described further below, including in reference to the conditioning system of FIG. 4. However, as noted above, depending upon the application and a number of factors, examples according to this disclosure can include any type of evaporative cooler configured to exchange energy between an air stream and a cooling fluid through evaporation of a portion of the fluid into the air.

Figure 1B:
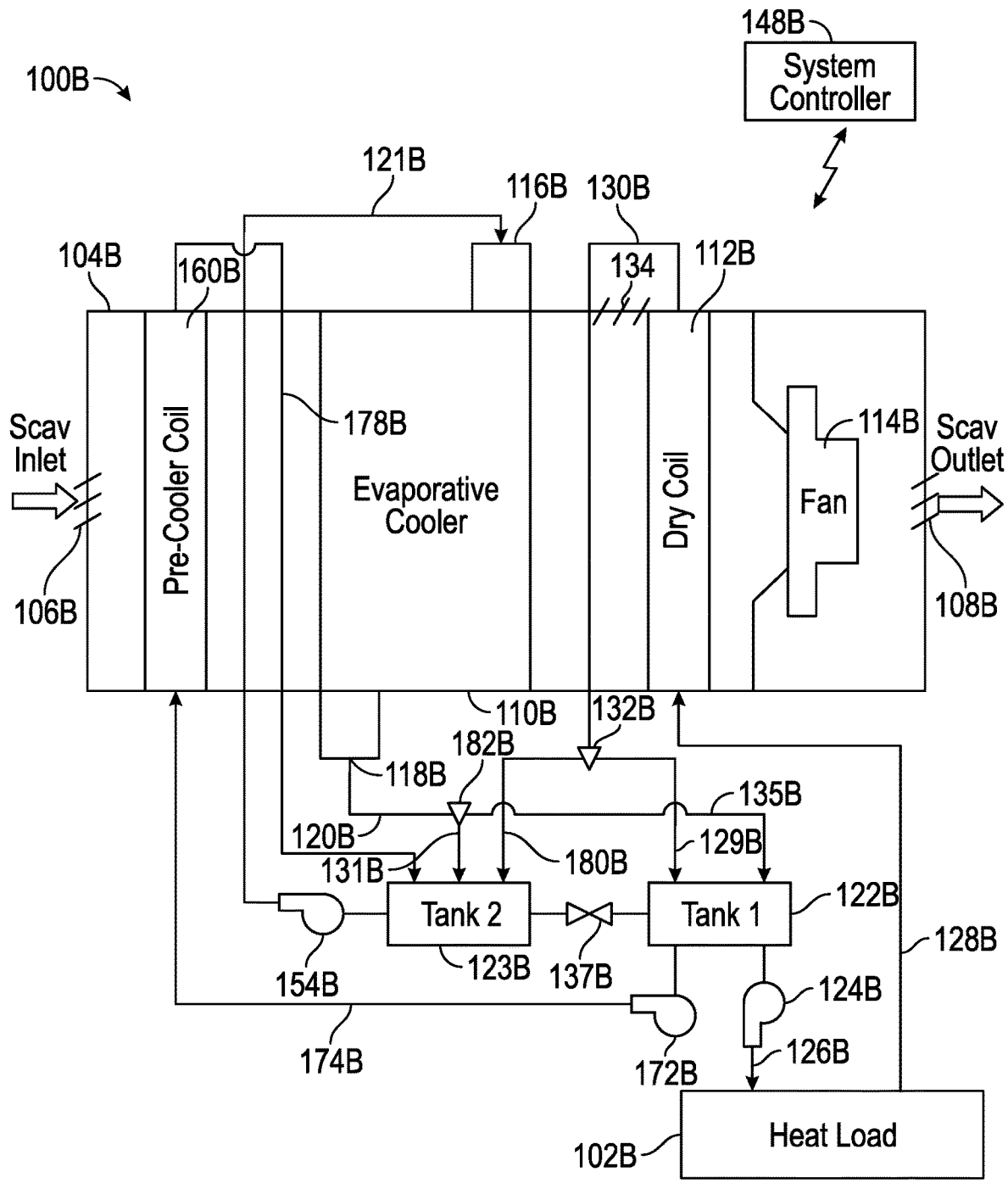
FIG. 1B is a schematic of an example conditioning system for providing liquid cooling.

In an example, as shown in FIG. 1A, the evaporative fluid from the evaporative cooler 110A can be collected and delivered to a tank 122A and thus can be used to provide cooling for the heat load 102A. In other examples described herein, the evaporative fluid from the evaporative cooler 110A is not collected for cooling the heat load 102A. See, for example, conditioning system 1100 in FIG. 11 and described below. In yet other examples, the conditioning system can be configured to switch between the configuration shown in FIG. 1A (in which the evaporative fluid exiting the evaporative cooler 110A is collected and transported to the tank 122A) and operating the evaporative cooler 110A adiabatically to circulate the evaporative fluid through the evaporative cooler 110A only. This is shown in FIG. 1B and described below.

In an example, the evaporative fluid in the evaporative cooler 110A can be water or predominantly water. In the conditioning system 100A of FIG. 1A, the cooling fluid is described as being water but the inlet 116A and outlet 118A can be described as a cooling fluid inlet and a cooling fluid outlet since a fluid in addition to, or as an alternative to, water can circulate through the evaporative cooler 110A. It is recognized that other types of evaporative cooling fluids can be used in combination with water or as an alternative to water in the other conditioning systems described herein.

The dry coil or recovery coil 112A can be arranged inside the plenum 104A downstream of the evaporative cooler 110A. The recovery coil 112A can cool a cooling fluid circulating through the recovery coil 112A using the cooling potential of the scavenger air. The scavenger air exiting the evaporative cooler 110A can be relatively cool and additional sensible heat from the cooling fluid passing through the recovery coil 112A can be rejected into the scavenger air. The recovery coil 112A can produce a reduced-temperature cooling fluid that can provide cooling to the heat load 102A. The reduced-temperature cooling fluid exiting the recovery coil 112A can flow to the evaporative cooler 110A or to a water tank 122A. The flow path of the cooling fluid to and from the recovery coil 112A is described below. The scavenger air exiting the recovery coil 112A can be directed out of the plenum 104A using the fan 114A and can exit the plenum 104A at the outlet 108A as exhaust.

In an example, the cooling fluid circulating through the recovery coil 112A can be water. In an example, the cooling fluid circulating through the recovery coil 112A can be the same fluid as the evaporative fluid in the evaporative cooler 110A.

As provided above, in an example, the evaporative fluid in the evaporative cooler 110A can be water. In an example, as shown in FIG. 1A, the reduced-temperature water from the outlet 118A of the evaporative cooler 110A can be used to provide cooling to the heat load 102A. The reduced-temperature water can flow from the outlet 118A to the water tank 122A via a water line 120A. Although not shown in FIG. 1A, the water tank 122A can include a make-up valve and a drain valve to maintain the water level and hardness level inside the tank 122A. The water tank 122A can include one or more temperature sensors in or around the water tank 122A to monitor a temperature of the water in the tank 122A. In an example, a control of the conditioning system 100A can be based, in part, on a measured temperature of the water in the tank 122A compared to a set point water temperature. In an example, the set point water temperature can be pre-determined based on an estimated quantity of the heat load 102A. In an example, the set point water temperature can vary during operation of the conditioning system 100A, based in part on operation of the data center or other devices that produce the heat load 102A.

The water from the water tank 122A can be pumped with a pump 124A to the heat load 102A via a water line 126A. Alternatively, the water from the tank 122A can be pumped to a cold water supply main configured to feed the cold water to the heat load 102A. As described further below, the reduced-temperature water can provide cooling to the heat load 102A by transporting the water to the heat load 102A. In an example in which the head load 102A includes hot air from an enclosed space, the design of the conditioning system 100A can eliminate the steps of moving hot supply air from the enclosed space through the cooling system 104A and then back to the enclosed space. The reduced-temperature water can provide cooling to the heat load 102A using any known methods to reject heat from air or one or more devices, such methods can include, but are not limited to, liquid immersing technology, cold plate technology, rear door heat exchangers, cooling distribution units (CDU), and cooling coils. In an example, the water can directly cool one or more components producing the heat load 102A. The one or more components can include, but are not limited to, electrical components. In an example in which the heat load 102A comes from an enclosed space, the water can pass through one or more cooling coils placed in a path of the supply air in the enclosed space, and the water in the cooling coils can sensibly cool the supply air.

After the water provides cooling to the heat load 102A, the water can be recirculated back through the cooling system 104A. The water can be at an increased-temperature after providing cooling to the heat load 102A because the rejected heat from the heat load 102A has been picked up by the water. The increased-temperature water can be transported to the dry coil 112A through a water line 128A. Alternatively, the water can be transported to a hot water return configured to transport the increased-temperature water back to the dry coil 112A. As provided above, the dry coil 112A can cool the water using the scavenger air exiting the evaporative cooler 110A.

The water can exit the dry coil 112A at a reduced temperature through a water line 130A, which can be split, using a bypass valve 132A, into a water line 180A to the evaporative cooler 110A and a water line 129A to the tank 122A. The bypass valve 132A can control how much of the water exiting the dry coil 112A is sent to the evaporative cooler 110A and how much is sent to the tank 122A, depending on an operating mode of the conditioning system 100A.

In an economizer mode, the bypass valve 132A can be open such that all of the water from the dry coil 112A can bypass the evaporative cooler 110A and go directly to the tank 122A. The economizer mode or winter mode can enable the conditioning system 100A to cool the water using the scavenger air and dry coil 112A, without having to run the evaporative cooler 110A. In that situation, there may be no need for evaporation inside the evaporative cooler 110A since the cold outdoor air (scavenger air) can pass through the dry coil 112A and sufficiently cool the water. The dry coil 112A can also be referred to herein as an economizer coil since it can be a primary cooling source for the water in the economizer mode. Three modes of operation are described further below for operating the conditioning system 100A.

In another example, instead of the bypass valve 132A controlling a flow between the evaporative cooler 110A and the tank 122A, the conditioning system can include two separate tanks or two separate tank sections. This is described below in reference to FIGS. 1B and 6.

The pre-cooler 160A, located upstream of the evaporative cooler 110A, can be used to pre-condition the scavenger air entering the plenum 104A, prior to passing the scavenger air through the evaporative cooler 110A. The pre-cooler 160A can be effective when the temperature of the water entering the pre-cooler 160A is lower than the outdoor air dry bulb temperature. The pre-cooler 160A can be used in typical summer conditions as well as in extreme summer conditions when the outdoor air is hot and humid. The pre-cooler 160A can depress the outdoor air wet bulb temperature, thus pre-cooling the scavenger air and heating the water. The pre-cooler 160A can provide more cooling potential in the evaporative cooler 110A.

In an example as shown in FIG. 1A, the pre-cooler 160A can use water from the tank 122A to condition the scavenger air. A pump 172A can pump water from the tank 122A to the pre-cooler 160A through a water line 174A. (Thus the reduced temperature water in the tank 122A can leave the tank 122A through two different water lines—line 126A to the heat load 102A and line 174A to the pre-cooler 160A.) In other examples, one water line and one pump can be used to deliver water out of the tank 122A and a split valve can be used to control the delivery of water to the heat load 102A and to the pre-cooler 160A.

In an example, reduced temperature water is described above as being delivered to the heat load (an enclosed space or a device) for providing liquid cooling. In other examples, instead of delivering water from the tank 122A to the heat load, the reduced temperature water can be delivered to a liquid to liquid heat exchanger (LLHX) to use the water to reduce a temperature of a secondary coolant circulating through the LLHX. The secondary coolant can be configured to provide cooling to the enclosed space or one or more devices, and the coolant can receive the heat rejected from the enclosed space or one or more devices, resulting in a temperature increase of the secondary coolant. The reduced temperature water can provide cooling to the increased temperature secondary coolant such that the secondary coolant can be delivered back to the enclosed space or one or more devices for continued cooling. Reference is made to International Application No. PCT/CA2016/050252, filed on Mar. 8, 2016, which is incorporated by reference herein and discloses an example of a design with a secondary coolant and LLHX.

Because the pre-cooler 160A uses water from the tank 122A as the cooling fluid in the pre-cooler 160A, the design of the pre-cooler 160A as shown in FIG. 1A can be referred to herein as a coupled pre-cooler. In other words, the pre-cooler 160A is designed and configured to use a portion of the reduced-temperature water produced by the recovery coil 112A or the evaporative cooler 110A (and intended for cooling the heat load 102A) as the cooling fluid for the pre-cooler 160A. In other examples illustrated and described herein, a cooling fluid circuit for the pre-cooler 160A can be partially or wholly decoupled from the process circuit for the evaporative cooler 110A and recovery coil 112A. In that case, the pre-cooler 160A can have an external cooling circuit partially or wholly separate from the reduced-temperature water produced by the evaporative cooler 110A or recovery coil 112A for process cooling.

In an example, and as shown in FIG. 1A, the plenum 104A can include two sets of bypass dampers—first dampers 176A between the pre-cooler 160A and the evaporative cooler 110A, and second dampers 134A between the evaporative cooler 110A and the dry coil 112A. The use of the bypass dampers 176A and 134A to direct the flow of scavenger air into the plenum 104A can depend on the outdoor air conditions. Although the first and second bypass dampers 176A and 134A are each shown as having a pair of dampers on opposing sides of the plenum 104A, it is recognized that one or both of the first 176A and second 134A bypass dampers can be a single damper on one side of the plenum 104A.

The conditioning system 100A can operate in at least three modes and selection of the mode can depend, in part, on the outdoor air conditions and the quantity of the heat load 102A. When the outdoor air is cold, the conditioning system 100A can operate in a first mode, an economizer mode, and the pre-cooler 160A and the evaporative cooler 110A can be bypassed. The scavenger air can enter the plenum 104A through the dampers A134 and pass through the dry coil 112A. This can protect the evaporative cooler 110A and avoid running the evaporative cooler 110A when it is not needed. In the first mode or economizer mode, the scavenger air can be cool enough such that the dry coil 112A can provide all cooling to the cooling fluid (water) delivered to the tank 122A to provide cooling to the heat load 102, without needing to operate the evaporative cooler 110A.

In a second operating mode, which can also be referred to as a normal mode or an evaporation mode, the pre-cooler 160A can be bypassed but the evaporative cooler 110A can be used. The evaporation mode can operate during mild conditions, such as spring or fall, when the temperature or humidity is moderate, as well as during some summer conditions. The scavenger air may be able to bypass the pre-cooler 160A, while still meeting the cooling load. The scavenger air can enter the plenum 104A through dampers 176A, and then can pass through the evaporative cooler 110A and the dry coil 112A. The conditioning system 100A can modulate between a normal mode and an economizer mode to limit power consumption and based on outdoor air conditions. In another example, the dampers 176A can be excluded from the system 100A or the dampers 176A may not be used in some cases. In such example, during the second operating mode, the scavenger air can enter through the inlet 106A and pass through the pre-cooler 160A but the pre-cooler 160A can be turned off such that the water or cooling fluid is not circulating through the pre-cooler 160A.

In a third operating mode, which can also be referred to as an enhanced mode or a super-evaporation mode, the conditioning system 100A can run using both the pre-cooler 160A and the dry coil 112A. Under extreme conditions, or when the outdoor air is hot or humid, the cooling system 104A can provide pre-cooling to the scavenger air, using the pre-cooler 160A, before the scavenger air enters the evaporative cooler 110A. The pre-cooler 160A can be used to improve the cooling power of the system 104A, allowing the evaporative cooler 110A to achieve lower discharge temperatures at the outlet 118A of the evaporative cooler 110A. The pre-cooler 160A can reduce or eliminate a need for supplemental mechanical cooling.

The water exiting the pre-cooler 160A can be directed to the inlet 116A of the evaporative cooler 110A through a water line 178A. A junction 181A of the water lines 178A and 180A is shown in FIG. 1A. It is recognized that the water lines 178A and 180A do not have to merge or join together prior to the inlet 116A and two separate water lines can be in fluid connection with the inlet 116A.

As provided above, the cooling fluid circuit of the pre-cooler 160A of FIG. 1A can be coupled with the evaporative cooler 110A since the cooling fluid for the pre-cooler 160A comes from the water in the tank 122A, which is produced by the evaporative cooler 110A. The pre-cooler 160A is further coupled in the design of FIG. 1A given that the cooling fluid, after exiting the pre-cooler 160A, flows through the evaporative cooler 110A.

The conditioning system 100A can include a system controller 148A to control operation of the conditioning system 100A and control an amount of cooling provided from the cooling system 104A to the heat load 102A. The system controller 148A can be manual or automated, or a combination of both. The conditioning system 100A can be operated so that a temperature of the water in the tank 122A can be equal to a set point temperature that can be constant or variable. In a conditioning system 100A including a LLHX and a secondary coolant loop, the conditioning system 100A can be operated so that a temperature of the coolant leaving the LLHX can be equal to a set point temperature that can be constant or variable. Controlling to the temperature of the coolant can be in addition to or as an alternative to controlling to the temperature of the water in the tank 122A or the water leaving the tank 122A. The set point temperature can be determined based in part on the cooling requirements of the heat load 102A. Water or coolant delivered to the heat load 102A from the cooling system 104A can cool the air in an enclosed space or cool one or more electrical components that can be enclosed or open to the atmosphere. The conditioning system 100A can be controlled to reduce overall water usage and power consumption, and increase heat rejection from the heat load 102A. The system controller 148A is described in further detail below.

Operation of the conditioning system 100A can be aimed at increasing the portion of sensible heating between the water and the scavenger air and decreasing the portion of latent heating between the water and the scavenger air. Water evaporation inside the evaporative cooler 110A can be optimized to minimize water consumption in the cooling system 104A by at least one of using cooling coils before or after the evaporative cooler 110A and modulating a scavenger air flow rate through the system 104A. A greater portion of the heat load can be rejected in the dry coil 112A downstream of the evaporative cooler 110A, if the water returning to the system 104A is at a higher temperature. As a result, the scavenger air temperature at an outlet of the dry coil 112A can be higher. The evaporative cooler 110A can consume less water when the latent portion of the work performed in the evaporative cooler 110A is reduced.

In an example, the conditioning system 100A can be operated in an economizer mode in which the evaporative cooler 110A is turned off and bypassed so long as the set point temperature of the water delivered to the tank 122A can be met using the dry coil 112A. However, if the water in the tank is at a temperature above the set point, the conditioning system 100A can be operated in a normal mode which includes using the evaporative cooler 110A to cool the water. Similarly, if the set point temperature cannot be achieved in the normal mode, an enhanced mode can include using the pre-cooler 160A to condition the scavenger air before the scavenger air enters the evaporative cooler 110A.

The reduced-temperature water from the recovery coil 112A or evaporative cooler 110A can be part of a cooling fluid circuit that can extend from the plenum 104A and be delivered to the heat load 102A. After the water provides cooling to the heat load 102A, the water can be recirculated through the cooling system 104A. One or both of the tank 122A and pump 124A can be located physically in the cooling system or plenum 104A, or one or both of the tank 122A and pump 124A can be physically located in an enclosed space that produces the heat load 102A. Alternatively, one or both of the tank 122A and pump 124A can be located in a structure separate from the cooling system or plenum 104A and the heat load 102A. Each of the water lines 129A, 130A, 178A and 180A can be inside or outside the plenum 104A, or partially inside and partially outside the plenum 104A. A location of the other water lines relative to the plenum 104A can depend in part on whether the tank 122A is inside or outside of the plenum 104A.

As provided above, the water line 126A can transport the water from the tank 122A to a cold water supply main, which can deliver the water to the heat load 102A. As described further below, in an example, the heat load 102A can utilize multiple cooling systems 104A for cooling and the cold water supply can be fluidly connected to each cooling system 104A.

The system controller 148A can include hardware, software, and combinations thereof to implement the functions attributed to the controller herein. The system controller 148A can be an analog, digital, or combination analog and digital controller including a number of components. As examples, the controller 148A can include ICB(s), PCB(s), processor(s), data storage devices, switches, relays, etcetera. Examples of processors can include any one or more of a microprocessor, a controller, a digital signal processor (DSP), an application specific integrated circuit (ASIC), a field-programmable gate array (FPGA), or equivalent discrete or integrated logic circuitry. Storage devices, in some examples, are described as a computer-readable storage medium. In some examples, storage devices include a temporary memory, meaning that a primary purpose of one or more storage devices is not long-term storage. Storage devices are, in some examples, described as a volatile memory, meaning that storage devices do not maintain stored contents when the computer is turned off Examples of volatile memories include random access memories (RAM), dynamic random access memories (DRAM), static random access memories (SRAM), and other forms of volatile memories known in the art. The data storage devices can be used to store program instructions for execution by processor(s) of the controller 148A. The storage devices, for example, are used by software, applications, algorithms, as examples, running on and/or executed by the controller 148A. The storage devices can include short-term and/or long-term memory, and can be volatile and/or non-volatile. Examples of non-volatile storage elements include magnetic hard discs, optical discs, floppy discs, flash memories, or forms of electrically programmable memories (EPROM) or electrically erasable and programmable (EEPROM) memories.

The system controller 148A can be configured to communicate with the conditioning system 100A and components thereof via various wired or wireless communications technologies and components using various public and/or proprietary standards and/or protocols. For example, a power and/or communications network of some kind may be employed to facilitate communication and control between the controller 148A and the conditioning system 100A. In one example, the system controller 148A can communicate with the conditioning system 100A via a private or public local area network (LAN), which can include wired and/or wireless elements functioning in accordance with one or more standards and/or via one or more transport mediums. In one example, the system 100A can be configured to use wireless communications according to one of the 802.11 or Bluetooth specification sets, or another standard or proprietary wireless communication protocol. Data transmitted to and from components of the system 100A, including the controller 148A, can be formatted in accordance with a variety of different communications protocols. For example, all or a portion of the communications can be via a packet-based, Internet Protocol (IP) network that communicates data in Transmission Control Protocol/Internet Protocol (TCP/IP) packets, over, for example, Category 5, Ethernet cables.

The system controller 148A can include one or more programs, circuits, algorithms or other mechanisms for controlling the operation of the conditioning system 100A. For example, the system controller 148A can be configured to modulate the speed of the fan 114A and/or control actuation of the valve 132A to direct cooling fluid from the outlet of the dry coil 112A to either the inlet 116A of evaporative cooler 110A or the tank 122A. The system controller 148A can also be configured to operate the system 100A in the three modes described above.

A system controller is not specifically shown in all of the figures for the various conditioning systems described below. However, it is recognized that the other conditioning systems can include a system controller that operates similar to the system controller 148A of FIG. 1A described above.

The cooling system 104A can maximize the cooling potential in the evaporative cooler 110A and modulate the scavenger air through the plenum 104A based on the outdoor air conditions. The economizer mode, for example, in winter, can provide a reduction in water usage and power consumption compared to conventional cooling systems.

The cooling system 104A can utilize reduced-temperature water (from the dry coil 112A or the evaporative cooler 110A) to provide cooling to the heat load 102A. In an example, the heat load 102A can be a data center or other enclosed space. The reduced-temperature water can be transported from the cooling system 104A, which is disposed outside of the data center, to the data center or other enclosed space. In contrast, for existing air cooling designs, process air from the data center can be delivered to the cooling system which can be configured as a larger unit for two air flow paths—the process air and the scavenger air. Thus more energy is used in those designs to move the process air from the data center to the cooling system and then condition the process air. In the systems described herein, less energy by comparison can be used to deliver the reduced-temperature water from the cooling system to the data center. Moreover, water has a higher thermal capacity than air; thus a lower flow rate of water can be used, compared to air, to reject a certain amount of heat directly from one or more electrical components in the data center (or other components needing cooling) or from the air in the data center.

In an example, the heat load 102A can be a device that can be in an enclosed space or a device that can be open to the atmosphere. The reduced-temperature water or coolant from the cooling system 104A can be delivered to the device. The cooling system 104A can be located separate from and remote to the device and the reduced-temperature water or coolant can be transported or delivered to the device. In an example, the device is not in an enclosed space, such that the device can be open to the atmosphere and an exterior of the device can be exposed to outdoor air. The conditioning system 100A can be configured such that the reduced-temperature water or coolant from the cooling system 104A can be delivered to an inlet of the device at an inlet temperature. The cooling liquid can reject heat from the device such that the water or coolant leaving the device at an outlet can be at an outlet temperature that is higher than the inlet temperature. The increased-temperature liquid exiting the device can be recirculated back to the cooling system 104A where the water or coolant can be cooled again, as described above.

In an example, the device can include any type of equipment or component that generates heat or any type of equipment or component that uses a fluid for heat rejection. The reduced-temperature water or coolant from the cooling system 104A can reject heat from the device using any known method, including those described above and shown herein. In an example, the reduced-temperature water or coolant can directly cool the device. The reduced-temperature water or coolant from the cooling system 104A can circulate through channels formed in the device. In an example, the reduced-temperature water or coolant can be circulated through a liquid to liquid heat exchanger (LLHX) inside the device and the water or coolant can pick up heat from a second fluid circulating through the LLHX to reduce a temperature of the second fluid. The device can include, but is not limited to, industrial equipment, commercial equipment, a chiller, a condenser coil, or any equipment (or in any process) using a cooling tower for heat rejection. The device can include any type of equipment or component that can use water or another cooling fluid to reject heat from the equipment/component or from a liquid in, or associated with, the equipment/component.

It is recognized that the cooling system 104A can be used to provide cooling to more than one device, depending on a quantity of the heat load for each of the devices and a cooling capacity of the system 104A. In an example, the device can include a plurality of pieces of industrial equipment; each piece of equipment can receive reduced-temperature water or coolant which can come from a central cooling system 104A or from a separate cooling system 104A dedicated to each piece of equipment.

The term "providing cooling to a heat load" as used herein refers to using the reduced-temperature water (or other type of coolant) from the recovery coil 112A (and in some cases the evaporative cooler 110A) to provide cooling to air in an enclosed space or to provide cooling to one or more devices or components (within an enclosed space or open to the atmosphere). The term "providing cooling to a heat load" as used herein can also refer to using the reduced-temperature water (or other type of coolant) to reduce a temperature of a secondary coolant in a liquid to liquid heat exchanger, the secondary coolant being used to receive heat rejected from the enclosed space or one or more devices. The devices or components can be directly cooled with the reduced-temperature water or coolant, the air around the components can be cooled (if contained within an enclosed space), or a combination can be used. Although the present application focuses on a data center as an example of an enclosed space with a heat load, the systems and methods disclosed herein for cooling can be used in other examples of enclosed spaces, including for example, a telecommunication room, industrial applications and commercial spaces. The systems and methods disclosed herein can be used in any application using water for cooling and then a cooling tower, or any application using dry coolers in combination with a supplemental heat rejection system for high scavenger air dry bulb temperatures. Reference is made to International Application No. PCT/CA2016/050252, filed on Mar. 8, 2016, which is incorporated by reference herein and provides further examples of cooling applications that can utilize the methods and systems disclosed herein.

FIG. 1B illustrates another example conditioning system 100B for providing liquid cooling to a heat load 102B. The conditioning system 100B can be similar in many aspects to the conditioning system 100A of FIG. 1A and can include a pre-cooler 160B, an evaporative cooler 110B, a dry coil 112B and a fan 114B, all of which can be arranged within a scavenger plenum 104B as described above for the system 100A. However, in contrast to the conditioning system 100A of FIG. 1A, the conditioning system 100B can have two separate water tanks, as well as an additional pump and flow path to the evaporative cooler 110B. As described below, the design in FIG. 1B can allow for additional operating modes of the system 100B, as compared to the system 100A. The system 100B can include a system controller 148B that can be similar to the system controller 148A described above for the system 100A.

The conditioning system 100B can include a first tank 122B and a second tank 123B. The first tank 122B can be generally configured to provide liquid cooling to a heat load 102 and the second tank 123B can be generally configured as the water supply for the evaporative cooler 110B. However, each of tanks 122B and 123B can receive water from the evaporative cooler 110B and the recovery coil 112B, depending on an operating mode of the system 100B.

In an example, the first tank 122B can be fluidly connected to the heat load 102B such that the reduced-temperature water can flow from the tank 122B to the heat load 102B through a water line 126B using a pump 124B, as configured with the system 100A. In another example, water can drain out of the tank 122B to another external collection reservoir, where it can then be pumped to the heat load 102B. This can eliminate a supply pump (124B) inside the cooling unit 104B.

The increased-temperature water leaving the heat load 102B can be returned to the recovery coil 112B (via a water line 128B) in order to cool the increased temperature water, which can then exit the recovery coil 112B through a water line 130B. The flow path into and out of the recovery coil 112B can be the same as in the system 100A. However, a bypass valve 132B can control distribution of the reduced-temperature water either to the first tank 122B through a water line 129B or to the second tank 123B through a water line 180B. This is different from the system 100A in which the bypass valve 132A can direct water in the water line 130A to the evaporative cooler 110A directly, rather than to the second tank 123B as shown in FIG. 1B. As provided below, a position of the valve 132B can depend on the operating mode of the system 100B.

The second tank 123B can provide water to an inlet 116B of the evaporative cooler 110B using a pump 154B and a water line 121B. The separation of the two tanks 122B and 123B in the design of FIG. 1B can replace the junction 181A of the design of FIG. 1A. Moreover, the design of FIG. 1B having the two tanks 122B and 123B can facilitate operation of the evaporative cooler 110B in an evaporation mode and an adiabatic mode, as described further below.

After flowing through the evaporative cooler 110B, the water can exit the evaporative cooler 110B through a water line 120B. A bypass valve 182B can control the distribution of water from the evaporative cooler 110B to the first tank 122B (via a water line 135B) and the second tank 123B (via a water line 131B). The valve 182B is not included in the design of FIG. 1A and is described further below in reference to the operating modes of the system 100B.

As provided above in reference to the system 100A, the pre-cooler 160B can selectively be used depending on the outdoor air conditions and an operating mode of the system 100B. Similar to the design of the system 100A, the pre-cooler 160B can receive reduced-temperature water from the first tank 122B using a pump 172B and water line 174B. The water can exit the pre-cooler 160B at an increased temperature. In contrast to the design of the system 100A, the increased-temperature water from the pre-cooler 160B can be directed to the second tank 123B through a water line 178B, rather than through the evaporative cooler 110B. Similar to the design of the system 100A, the pre-cooler 160B of the system 100B, as shown in FIG. 1B, can have a coupled design and the cooling fluid for the pre-cooler 160B can come from the first tank 122B. In other examples, the pre-cooler 160B can be partially or fully decoupled (see, for example, FIGS. 3-6).

In an example, the system 100B can operate in the three modes described above for the system 100A, but the system 100B can also operate in at least two additional modes as compared to the system 100A.

In an economizer mode (first mode of the system 100A), only the recovery coil 112B is used to cool the water or other cooling fluid that provides liquid cooling to the heat load 102B. The cold water exiting the recovery coil 112B can pass through the three-way valve 132B which can divert essentially all of the water in the water line 130B to the first tank 122B. The first tank 122B can supply the cold water to the heat load 102B using the pump 124B. In the economizer mode, the pumps 154B and 172B can be turned off since the evaporative cooler 110B and pre-cooler 160B are not being used. The scavenger air can enter the plenum 104B through the bypass dampers 134B.

The system 100B can operate in an adiabatic mode that can considered to be between the economizer mode and the evaporation mode (second mode of the system 100A) in terms of the energy usage of the system 100B and the cooling requirements needed by the heat load 102B. The bypass valve 132B can be in the same position and the delivery of cold water to the heat load 102B can be the same as described above in the economizer mode. In the adiabatic mode, the evaporative cooler 110B can be configured to circulate water from the second tank 123B through the evaporative cooler 110B in a closed fluid circuit. The pump 154B can be on and water can be provided through the water line 121B to the inlet 116B of the evaporative cooler. The bypass valve 182B can be positioned such that essentially all of the water exiting the evaporative cooler 110B at the outlet 118B can be directed to the second tank 123B. Thus the flow of water through each of the evaporative cooler 110B and the recovery coil 112B can be separate from one another via the two tanks 122B and 123B. In this adiabatic mode, the tank 123B can be essentially dedicated to the recovery coil 112B and the tank 122B can be essentially dedicated to the evaporative cooler 110B.

During operation of the evaporative cooler 110B in the adiabatic mode, a temperature of the water (or other cooling fluid) can remain generally constant or have minimal temperature fluctuations. The outdoor air conditions can be such that sufficient conditioning of the scavenger air stream can be provided by the water in the tank 123B through recirculation of the water in the closed fluid circuit. As the scavenger air passes through the evaporative cooler 110B, it can be cooled adiabatically such that its temperature can be reduced, but its humidity level can increase, while its overall enthalpy can remain constant. The reduced-temperature air can be supplied to the recovery coil 112B and the recovery coil 112B can supply water at the required temperature set point. This adiabatic process or mode can significantly reduce or minimize water consumption by the conditioning system 100B and can be used when operation of the system 100B in the economizer mode is not able to reach the set point temperature for the cold water supply to the heat load 102B.

In an evaporation mode (second mode of the system 100A), the evaporative cooler 110B can be switched over from operating adiabatically. A position of the bypass valve 132B can be changed to direct water from the recovery coil 112B to the second tank 123B. Similarly, a position of the bypass valve 182B can be changed to direct water from the evaporative cooler 110B to the first tank 122B. An equalization valve 137B can be located between the two tanks 122B and 123B. The valve 137B can be closed during the economizer and adiabatic modes, and can be opened in the evaporation mode to stabilize the tank levels. The evaporation mode in the system 100B can be similar to that described above for the system 100A in that the fluid circuit through the evaporative cooler 110B can be in fluid connection with the fluid circuit through the recovery coil 112B.

In an example, in the evaporation mode, essentially all or a majority of the water from the recovery coil 112B can be redirected to the second tank 123B and essentially all or a majority of the water from the evaporative cooler 110B can be redirected to the first tank 122B. In another example, in the evaporation mode, the distribution to each tank 122B and 123B can be split for one or both of the water from the evaporative cooler 110B and the recovery coil 112B. In an example, instead of the equalization valve 137B, the tanks 122B and 123B can be separated by a dividing wall (see, for example, FIG. 6) and a height of the wall can be lowered such that the wall can function as a weir. If one tank level rises too high, the water can spill over the weir into the other tank.

During operation in the adiabatic and evaporation modes, the scavenger air can enter the plenum 104B at an inlet 106B and the pre-cooler 160B can be off. In another example, the plenum 104B can include bypass dampers downstream of the pre-cooler 160B and upstream of the evaporative cooler 110B to bypass the pre-cooler 160B and direct the scavenger air into the evaporative cooler 110B.

In an enhanced mode or a super-evaporation mode (third mode of the system 100A), the pump 172B can be turned on to direct water through the pre-cooler 160B. The cold water for the pre-cooler 160B can come from the first tank 122B. After exiting the pre-cooler 160B at an increased-temperature, the water can be delivered to the second tank 123B. Similar to the system 100A, as shown in FIG. 1B, the pre-cooler 160B can have a coupled design within the system 100B. In other examples, the pre-cooler 160B can have a partially decoupled or fully decoupled design, as described below and shown in the figures.

The system 100B can be controlled to run at the lowest operating mode (in terms of energy and water usage) that is sufficient for meeting the cooling requirements for the heat load 102B. The design of the system 100B can allow for an additional mode that can include operating the evaporative cooler 110B adiabatically and running the pre-cooler 160B. This mode can be considered somewhat of a hybrid mode that is generally between the adiabatic mode and the enhanced mode.

The conditioning systems 100A and 100B of FIGS. 1A and 1B can be configured to use the reduced-temperature water from the evaporative cooler 110A, 110B and recovery coil 112A, 112B to provide liquid cooling to the heat load 102A, 102B, which can come from an enclosed space, in one example.

Figure 2:
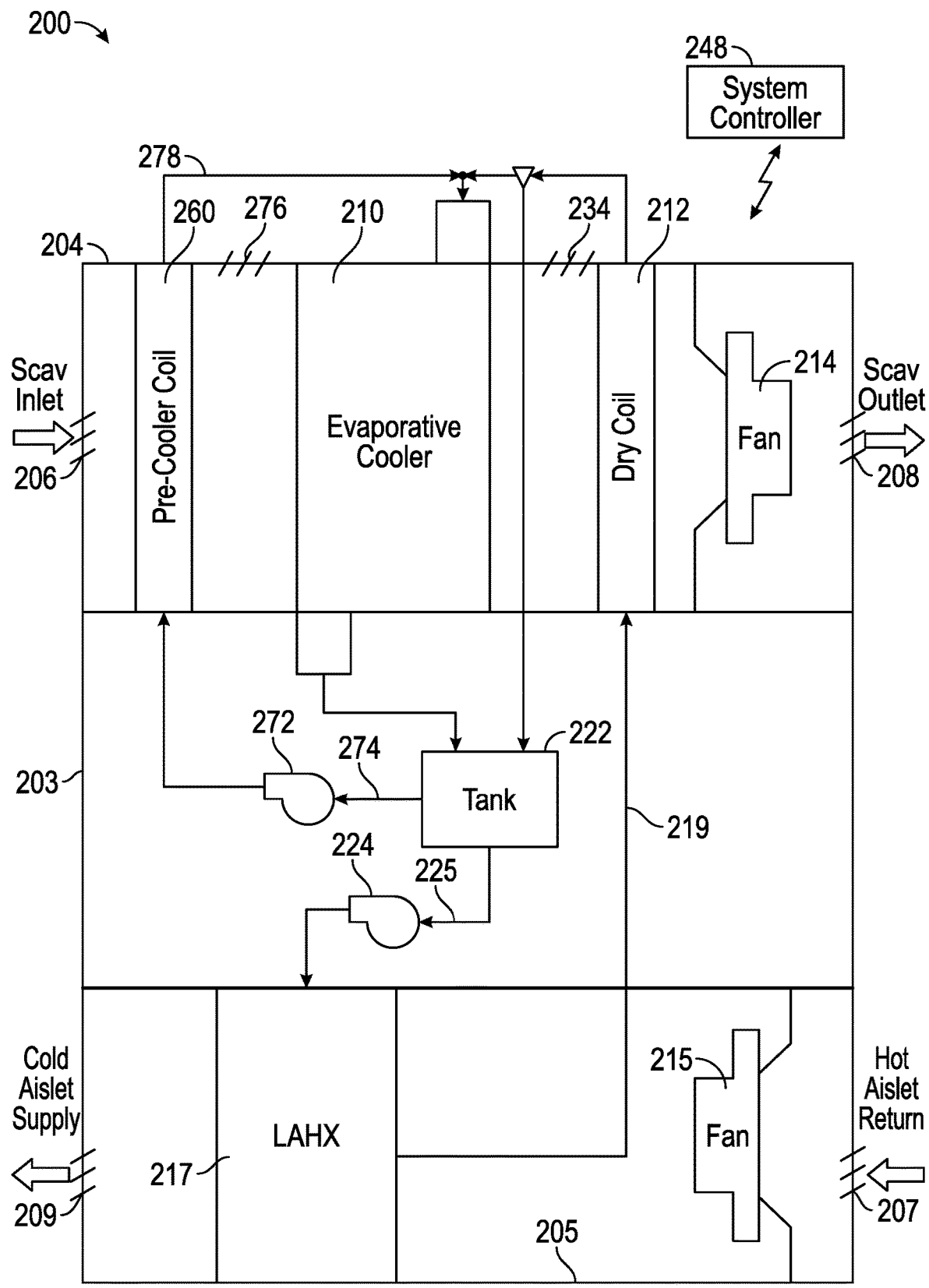
FIG. 2 is a schematic of an example conditioning system for providing air cooling.

FIG. 2 illustrates an example conditioning system 200 for providing air cooling to a process air stream from a data center or other enclosed space. The conditioning system 200 can include many similar components and functions of the conditioning system 100A of FIG. 1A. The conditioning system 200 can include a scavenger plenum 204, similar to the plenum 104A of FIG. 1A, for receiving a scavenger air stream and directing the scavenger air from an air inlet 206 to an air outlet 208. The conditioning system 200 can include a process plenum 205 for receiving a process air stream and directing the process air from a process air inlet 207 to a process air outlet 209. The scavenger plenum 204 and process plenum 205 can be housed within a system cabinet 203, which can also house a tank 222, similar to the tank 122A, described further below.

An interior of the scavenger plenum 204 can be configured similar to the scavenger plenum 104A and can include a pre-cooler 260, an evaporative cooler 210, a dry coil or recovery coil 212, and a scavenger fan (or fan array) 214. The components in the scavenger plenum 204 can operate similar to as described above in reference to the conditioning system 100A of FIG. 1A and the evaporative cooler 210 and recovery coil 212 can reduce a temperature of the cooling fluid passing there through such that a reduced-temperature cooling fluid can be provided to the tank 222 and can ultimately be used for air cooling, as described below. The conditioning system 200 can operate in multiple modes similar to the modes described above in reference to the conditioning system 100A, and selection of the mode can depend, in part, on the outdoor air conditions, as well as a cooling load for the process air stream, as described below. In an example, the scavenger plenum 204 can include first dampers 276 and second dampers 234 to direct the flow of scavenger air into the plenum 204 depending on the operating mode. In another example, the dampers 276 can be excluded from the design of the plenum 204.

Rather than providing liquid cooling to a data center or other enclosed space that needs cooling, the conditioning system 200 can be configured to provide air cooling. Air from the data center or enclosed space can enter the system 200 through the process air inlet 207 of the process plenum 205. The hot aisle return air entering the process plenum 205 has been heated in the data center or enclosed space and requires cooling to a target supply air temperature, which is generally determined based on the amount and characteristics of equipment housed in the enclosed space, for example, computing, networking, data storage and other equipment. The heated process air can be cooled inside the process plenum 205 as described below. The reduced-temperature process air can then exit the process plenum 205 through the process air outlet 209. The reduced-temperature air (cold aisle supply) can be transported to the data center or space at or within an acceptable tolerance of the target supply air temperature.

The scavenger and process plenums 204 and 205, respectively, can be sealed from one another such that the scavenger and process air streams do not intermix with one another (other than ordinary leakage between the two plenums, if collocated). The scavenger plenum 204 and process plenum 205 can be defined by partitioned sub-sections of the interior space of the system cabinet 203, as is schematically depicted in FIG. 2. In other examples, scavenger and process plenums 204 and 205 can be separate from and mounted within the system cabinet 203. Although some components of example systems in accordance with this disclosure are schematically depicted as outside of the overall system cabinet and/or outside of the two separate plenums, at least in some examples all of the cooling/conditioning components of example system(s) are located within a single system enclosure, which can be conveniently packaged, transported, and installed. In such cases, the scavenger and process inlets and outlets can be connected directly to or indirectly via appropriate ducting or other fluid flow conduit to additional scavenger air supply and exhaust flow paths and to additional enclosed space supply and return flow paths. Moreover, example systems in accordance with this disclosure can be employed in combination with other heating, cooling, humidification/dehumidification, recovery, regeneration and other components or systems located within or otherwise along these additional scavenger and process air flow paths.

The process plenum 205 can be configured to provide air cooling to the hot aisle return air using the reduced-temperature water or cooling fluid from the tank 222. A liquid-to-air heat exchanger, LAHX 217 can be arranged inside the process plenum 205 and can be configured to provide cooling to the hot aisle return air. The LAHX 217 can directly and sensibly cool the air from the enclosed space using water cooled in the evaporative cooler 210 (or in the recovery coil 212 in an economizer mode).

The dry coil or recovery coil 212, arranged inside the scavenger plenum 204, can also be a LAHX. Both the LAHX 217 and the recovery coil 212 can include a variety of kinds of liquid-to-air exchangers, including, for example, cooling coils. Cooling coils are commonly formed of coiled copper tubes embedded in a matrix of fins. A variety of particular configurations, capacities, etc. can be employed in examples according to this disclosure. Other example LAHXs that can be used include micro-channel heat exchangers. The cooling fluid circulating through one or both of LAHX 217 and the recovery coil 212 can include water, liquid desiccant, glycol, other hygroscopic fluids, other evaporative liquids, and/or combinations thereof. In an example, the cooling fluid flowing through the LAHX 217 and the recovery coil 212 can be the cooling fluid (for example, water) flowing through the evaporative cooler 210. In another example, the cooling fluid flowing through one or both of the LAHX 217 and the recovery coil 212 can be the same as or different than the cooling fluid flowing through the evaporative cooler 210.

The conditioning system 200 can include a process fan (or fan array) 215 which can be similar to the scavenger fan (or fan array) 214 and can drive the process air through the process plenum 205. Example conditioning system 200 and other example conditioning systems herein can include additional fans than what is shown in the figures. Moreover, the fans can be located in different locations within the system 200 relative to what is shown in FIG. 2. For example, one or both of the scavenger fan 214 and the process fan 215 can be configured as a single fan or multiple fans, including a fan array, such as, for example, FANWALL® Systems provided by Nortek Air Solutions. Although not shown in the figures, example conditioning systems in accordance with this disclosure can include one or more filters disposed in one or both of the scavenger plenum 204 and the process plenum 205.

In the examples of FIGS. 1A, 1B and 2, the scavenger fan 114/214 can be arranged inside the scavenger plenum 104/204 downstream of the recovery coil 112/212. In this position, at least some of the heat generated by the scavenger fan 114/214 can be exhausted out of the scavenger plenum 104/204 through the scavenger outlet 108/208, which is just downstream of scavenger fan 114/214. In other examples, the scavenger fan 114/214 can be located at different positions within scavenger plenum 104/204. In the example of FIG. 2, the process fan 215 can be arranged inside the process plenum 205 upstream of the LAHX 217. In this position, some heat generated by the process fan 215 can be directly removed by the LAHX 217 before the air is supplied back to the space. In other examples, the process fan 215 can be located at different positions within the process plenum 205.

Similar to the conditioning system 100A, the tank 222 in the conditioning system 200 can include two output lines and corresponding pumps. A pump 272 can pump water from the tank 222 to the pre-cooler 260 through a water line 274. Instead of pumping water from the tank 222 to the data center or cold water main, as described above in reference to FIG. 1A, a pump 224 can pump water from the tank 222 through a water line 225 to the LAHX 217 in the process air plenum 205. As such, the reduced-temperature water from the tank 222 can provide cooling (via the LAHX 217) to the process air flowing through the process air plenum 205. In other examples, one water line and one pump can be used to deliver water out of the tank 222 and a split valve can be used to control the delivery of water to the LAHX 217 and to the pre-cooler 260.

As provided above, in the LAHX 217 the reduced-temperature water from the evaporative cooler 210 and recovery coil 212 can cool the hot process air in the process plenum 205. Thus the water exiting the LAHX 217 can be at a higher temperature relative to a temperature at an inlet of the LAHX 217. The increased-temperature water exiting the LAHX 217 can flow back to the recovery coil 212 via a water line 219 to cool the water before it returns to the evaporative cooler 210 or the tank 222.

Although not shown in FIG. 2, the tank 222 can include a make-up valve and a drain valve to maintain the fluid level and hardness level inside the tank 222. The tank 222 can include one or more temperature sensors in or around the tank to monitor a temperature of the fluid stored therein. In an example, the control scheme for conditioning system 200 can be based, in part, on a measured temperature of the fluid in tank 222 compared to a set point temperature. In an example, the set point temperature can be pre-determined based on an estimated cooling load from the enclosed space. The set point water temperature can also vary during operation of conditioning system 200, based in part on conditions in the enclosed space (for example, operation of the data center like periodic processing load variations).

The conditioning system 200 can allow for multiple operating modes and selection of the mode can depend, in part, on the outdoor air conditions and a cooling load for the system 200. Because the type and arrangement of the components in the scavenger plenum 204 is similar to the type and arrangement of the components in the scavenger plenum 104A of FIG. 1A, the conditioning system 200 can operate similar to the conditioning system 100A and the three operating modes for the conditioning system 200 can be generally similar to the modes as described above in reference to FIG. 1A. In an example, the evaporative cooler 210 can operate adiabatically with a closed evaporative fluid circuit, as also described above under FIG. 1B; thus providing additional modes of operation for the conditioning system 200. The conditioning system 200 can include a system controller 248 that can be similar to the system controller 148A of FIG. 1A and described above.

Reference is made to International Application No. PCT/CA2016/050507, filed on May 2, 2016, which is incorporated by reference herein and provides further examples of air cooling applications that can utilize the methods and systems disclosed herein.

Similar to the system 100A of FIG. 1A, the cooling fluid circuit of the pre-cooler 260 can be referred to herein as a coupled design. First, the cooling fluid for the pre-cooler 260 comes from the water in the tank 222, which is produced by the evaporative cooler 210. Second, the fluid at an outlet of the pre-cooler 260 is directed to and flows through the evaporative cooler 210. In other examples, the cooling fluid circuit of the pre-cooler 260 can be decoupled from the evaporative cooler 210.

Figure 3:
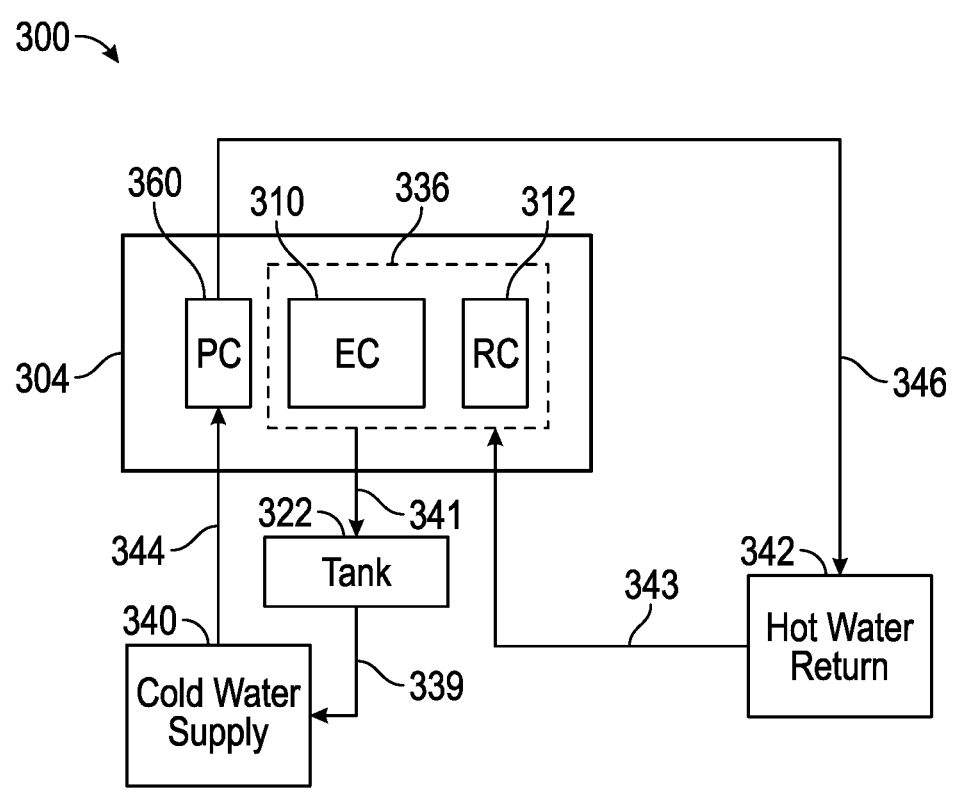
FIG. 3 is a schematic of an example conditioning system having a partially decoupled pre-cooler design.

FIG. 3 illustrates an example conditioning system 300 for providing liquid cooling to a heat load. The conditioning system 300 can include a scavenger plenum 304, which can also be a housing or system cabinet. The scavenger plenum 304 can include the same main components arranged inside the plenums 104A or 104B of FIGS. 1A and 1B, and described above in reference to the conditioning systems 100A and 100B. For simplicity, some features and details of the conditioning system 300 are not specifically shown in FIG. 3. For example, although FIG. 3 excludes a fan (like fan 114A of FIG. 1A), it is recognized that a fan can be included in the system 300. Dampers are not shown in FIG. 3 at the inlet or outlet of the plenum, or at the bypass locations (see dampers 176A and 134A in FIG. 1A). However, it is recognized that any or all of such dampers can be included in the system 300.

Similar to the conditioning system 100A, the conditioning system 300 can be configured to produce reduced-temperature water that can be used for liquid cooling for a heat load. The plenum 304 can also be referred to as the cooling system or cooling unit 304 since it houses the components configured to provide liquid cooling to the heat load. The plenum 304 can include a pre-cooler 360, an evaporative cooler 310 and a recovery coil or dry coil 312, similar to the plenum 104A. FIG. 3 illustrates a design for the conditioning system 300 in which the pre-cooler 360 can be partially decoupled from the evaporative cooler 310 and recovery coil 312, as described further below.

Reduced-temperature water (or other cooling fluid) from the cooling unit 304 can be supplied to the heat load, as represented in FIG. 3 as a cold water supply 340. The reduced-temperature water can be stored in a tank 322 and delivered to the cold water supply 340 via a water line 339. In an example, the cold water supply 340 can be a cold water line configured to transport the water from the tank 322 to the heat load. In an example, the cold water supply 340 can be a cold water manifold that can receive water from more than one scavenger plenum or cooling unit 304 within the conditioning system 300, as described below in reference to FIG. 4. The cold water supply 340 can be part of a process cooling fluid supply circuit that provides the cold water (or other process cooling fluid) to the heat load. The heat load can receive the cold water/process cooling fluid from the supply 340 and thereby reject heat; such heat can be received by the water/process cooling fluid. The water/process cooling fluid can thus be at an increased-temperature after providing cooling to the heat load.

The increased-temperature water/process cooling fluid can be returned from the heat load to the scavenger plenum 304, as represented in FIG. 3 as a hot water return 342. The hot water return 342 can be part of a process cooling fluid return circuit that can return the increased-temperature water/process cooling fluid to the plenum 304 via a water line 343 connected to the hot water return 342. The plenum or cooling unit 304 can cool the increased-temperature water/process cooling fluid such that it can again supply cooling to the heat load. In an example, the hot water return 342 can be a hot water line configured to transport the increased-temperature water/process cooling fluid from the heat load back to the scavenger plenum 304. In an example, the hot water return 342 can be a hot water manifold that can receive water/process cooling fluid coming back from the heat load and distribute the water/process cooling fluid back to more than one scavenger plenum 304 within the conditioning system 300, as described below in reference to FIG. 4.

For simplicity, FIG. 3 does not show a fluid circuit for the water/process cooling fluid through the recovery coil 312 or the evaporative cooler 310. Moreover, FIG. 3 does not show a fluid path between the recovery coil 312 and evaporative cooler 310. Rather, FIG. 3 shows the increased-temperature water in the water line 343 transported to a dotted-line box designated as 336 for labeling purposes only. The increased-temperature water from the line 343 can be cooled using the recovery coil 312 and the evaporative cooler 310. Similarly, FIG. 3 shows the reduced-temperature water leaving the plenum 304 from 336 via a water line 341 to the tank 322. In an example, the fluid circuits for the recovery coil 312 and the evaporative cooler 310 can be configured as shown above in FIG. 1A, including the water line 130A and bypass valve 132A. In an example, the fluid circuits can be configured as shown below in FIGS. 1B and 6 in which separate tanks or tank sections can be used to control the flow of water to and from the evaporative cooler 310 and recovery coil 312. In an example, the evaporative cooler 310 and recovery coil 312 can be fluidly disconnected such that the reduced-temperature water in the recovery coil 312 does not pass through the evaporative cooler 310. In some cases, such fluid disconnection can be selective and under particular air conditions or operating modes when an adiabatic process is used. In other cases, the evaporative cooler 310 can be configured such that the fluid flow path through the evaporative cooler 310 can essentially always be separate from the fluid flow path through the recovery coil 312 (see, for example, FIG. 11).

The conditioning system 300 can be controlled in a similar manner as described above for the conditioning systems 100A and 100B of FIGS. 1A and 1B, respectively. The conditioning system 300 can operate in the multiple modes described above for the conditioning systems 100A and 100B of FIGS. 1A and 1B, respectively.

In an example, as shown in FIG. 3, the pre-cooler 360 can be partially decoupled from the evaporative cooler 310 and the recovery coil 312. Instead of receiving water directly from the tank 322 (see FIG. 1A), the pre-cooler 360 can receive water from the cold water supply 340 via a water line 344 and use the water from cold water supply 340 as the cooling fluid for the pre-cooler 360. Instead of transporting the water exiting the pre-cooler 360 directly to the evaporative cooler 310 (see FIG. 1A), the water exiting the pre-cooler 360 can be delivered to the hot water return 342 via a water line 346. In this partially decoupled design, the pre-cooler 360 can have a fluid circuit, which includes the water lines 344 and 346, separate from a fluid circuit for the evaporative cooler 310 and the recovery coil 312. The pre-cooler 360 can be referred to herein as partially decoupled (rather than wholly decoupled) because the pre-cooler 360 can use reduced-temperature water produced by the evaporative cooler 310 or recovery coil 312, but the pre-cooler 360 can receive the reduced-temperature water from the cold water supply 340, rather than directly from the tank 322. Second, the pre-cooler 360 can be referred to herein as partially decoupled (rather than wholly decoupled) because the water exiting the pre-cooler 360 can be transported to the hot water return 342, rather than directly back to the evaporative cooler 310 (see FIG. 1A) or to one of two tanks (see FIG. 1B). The water in the hot water return 342 can be circulated back to the recovery coil 312.

In the partially decoupled design of FIG. 3, the fluid circuit for the pre-cooler 360 can be separate from the fluid circuits for the evaporative cooler 310 and the recovery coil 312. This can simplify fluid circuitry in the plenum 304, to the evaporative cooler 310, or to the recovery coil 312. Moreover, the pre-cooler 360 can be an optional component of the conditioning system 300 that can be excluded in some applications, depending, for example, on climate. By decoupling the fluid path of the pre-cooler 360 from the other fluid paths through the evaporative cooler 310 and recovery coil 312, it can be easier to include or exclude the pre-cooler 360 in designing a conditioning system for a particular climate and cooling load. Additional benefits of the partially decoupled design of FIG. 3 are described further below in reference to FIG. 4.

Figure 4:
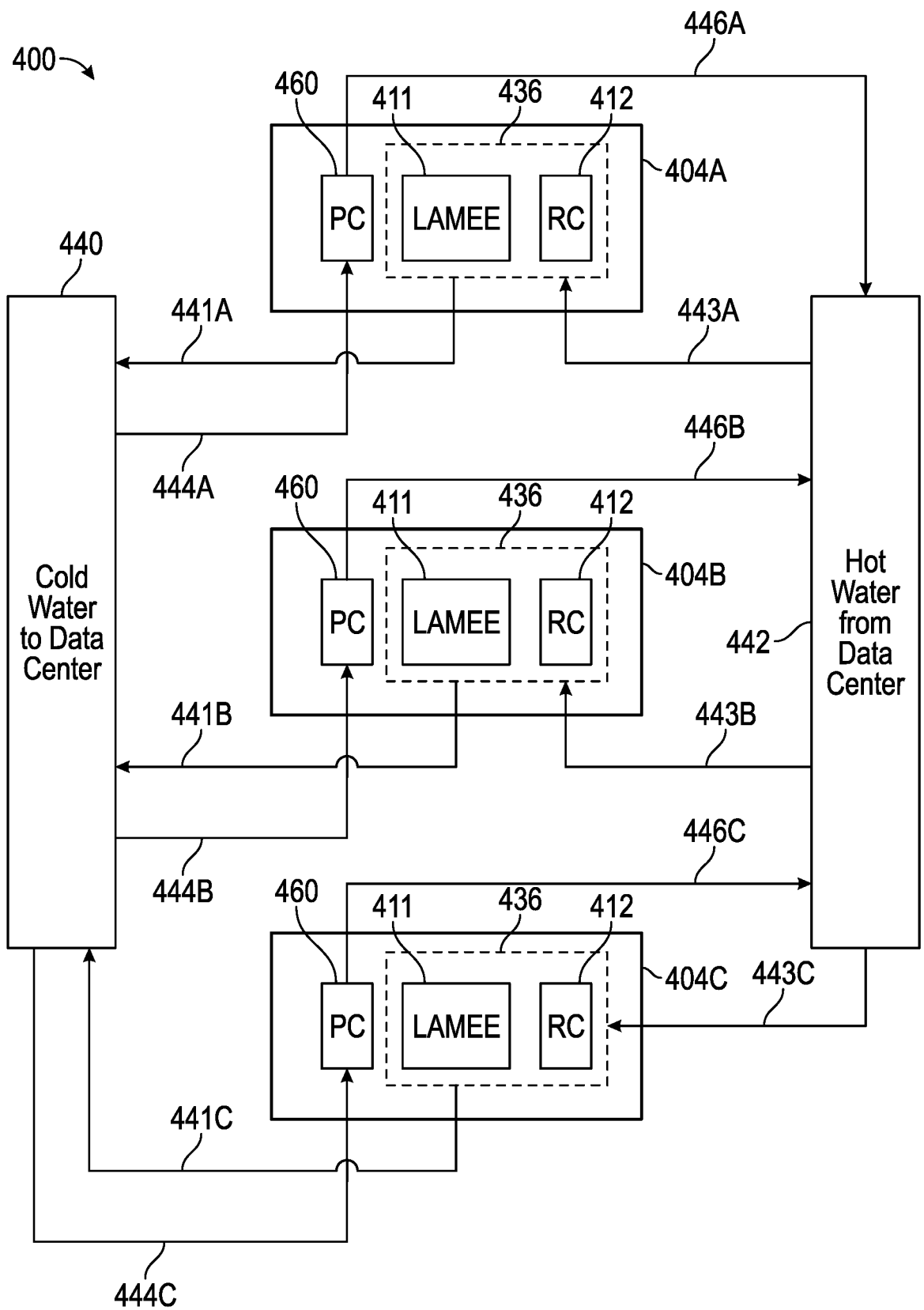
FIG. 4 is a schematic of another example conditioning system having a partially decoupled pre-cooler design.

FIG. 4 illustrates an example conditioning system 400 which includes multiple cooling units 404 (designated as 404A, 404B, and 404C) arranged in parallel. Each cooling unit 404 can be configured similarly to the scavenger plenum 304 and can include the same components, generally arranged in the same way, inside the cooling unit 404. In the example of FIG. 4, the evaporative cooler for each of the cooling units 404 can be a liquid to air membrane energy exchanger (LAMEE) 411, which is one example of the type of evaporative cooler usable in the conditioning systems described herein. The LAMEE 411 is described in further detail below.

Each cooling unit 404 can produce reduced-temperature water that can be provided to a cold water supply 440 to provide liquid cooling to a heat load. In an example, and as shown in FIG. 4, the heat load can be a data center or other enclosed space having one or more heat generating components. In other examples, the heat load can be from one or more devices not contained within an enclosed space and open to the atmosphere. The cold water supply 440 can be part of a process cooling fluid supply circuit and can be fluidly connected to each of the cooling units 404A, 404B and 404C via water lines 441A, 441B and 441C, respectively. Although FIG. 4 does not show any tanks for the cooling units 404, it is recognized that one or more tanks can be included for each cooling unit 404A, 404B, 404C for receiving the water from the LAMEE 411 and recovery coil 412 and transporting the water to the cold water supply 440. Alternatively, a tank can be fluidly connected to more than one of cooling units 404.

After the water has provided liquid cooling to the data center (heat load), the water can be transported back to the cooling units 404 through the hot water return 442. The hot water return 442 can be part of a process cooling return circuit and can be fluidly connected to a dry coil or recovery coil (RC) 412 of each of the cooling units 404A, 404B and 404C via water lines 443A, 443B and 443C, respectively.

As described above in FIG. 3, for simplicity, the fluid circuits of the LAMEE 411 and recovery coil 412 are not shown in FIG. 4 for each of the cooling units 404A, 404B and 404C. Rather, the water lines 443A, 443B and 443C are shown connected to 436 around both the evaporative cooler 410 and recovery coil for each of the cooling units 404A, 404B and 404C and connected to the hot water return 442; similarly, the water lines 441A, 441B and 441C are shown between 436 and the cold water supply 440.

As similarly described above for the conditioning system 300, pre-coolers 460 of each of the cooling units 404A, 404B and 404C can be partially decoupled from the other components (LAMEE 411 and recovery coil 412) of the respective cooling unit 404. Each pre-cooler 460 can receive cold water from the cold water supply 440 via water lines 444A, 444B and 444C. After passing through the pre-cooler 460 of each cooling unit 404A, 404B and 404C, the water can be transported to the hot water return via water lines 446A, 446B and 446C.

In the example of FIG. 4, the conditioning system 400 can include three cooling units 404. It is recognized that more or less cooling units 404 can be included in the conditioning systems described herein. Any number of cooling units can be used in parallel. The number of cooling units 404 can depend on a cooling capacity of each unit 404 and the heat load of the data center or other enclosed space. As provided above in the description of FIG. 3, a pre-cooler having a partially decoupled cooling circuit can provide advantages over a coupled pre-cooler design. When the pre-cooler 460 is not needed, the entire flow rate of cold water produced by the LAMEE 411 and recovery coil 412 can be delivered to the heat load via the cold water supply 440. This can maximize available cooling power that can be delivered to the heat load during a majority of the operating time of the conditioning system 400 (when the pre-cooler 460 of each unit 404 is not needed). This can also provide flexibility to the conditioning system 400 in that individual units 404 can be cycled on and off depending on outdoor air conditions and demands of the heat load.

Moreover, with the design shown in FIG. 4, a gross cooling capacity of each unit 404 (i.e. the total cooling produced by the LAMEE 411 and recovery coil 412) can be a standard value given by the design of the system 400, which can include the maximum water flow rate through each unit 404 and a peak capacity of the recovery coil 412 and LAMEE 411. In any given cooling application, a ratio of cooling allocated to the pre-cooler 460 can be varied depending in part on climate conditions and requirements from the heat load. When the pre-coolers 460 are not being run, a flow rate through the units 404 can be reduced and all of the units 404 can remain running, or the maximum water flow rate can be maintained and some units 404 can be shut down. The partially decoupled pre-cooler layout of FIG. 4 provides flexibility in configuring each cooling unit 404 and thus the conditioning system 400 for different cooling applications. Reference is made to Table 4 below for a modeled conditioning system having a plurality of process cooling units with a partially decoupled pre-cooler design similar to that shown in FIG. 4.

As provided above and shown in FIG. 4, some or all of the cooling units 404 can include a LAMEE 411 as the evaporative cooler in the cooling units 404. The LAMEE 411 can also be referred to herein as an exchanger or an evaporative cooler LAMEE. A liquid to air membrane energy exchanger (LAMEE) can be used as part of a heating and cooling system (or energy exchange system) to transfer heat and moisture between a liquid desiccant and an air stream to condition the temperature and humidity of the air flowing through the LAMEE.

In an example, the membrane in the LAMEE 411 can be a non-porous film having selective permeability for water, but not for other constituents that form the liquid desiccant. Many different types of liquid desiccants can be used in combination with the non-porous membrane, including, for example, glycols. The non-porous membrane can make it feasible to use desiccants, such as glycols, that had been previously determined to be unacceptable or undesirable in these types of applications. In an example, the membrane in the LAMEE can be semi-permeable or vapor permeable, and generally anything in a gas phase can pass through the membrane and generally anything in a liquid phase cannot pass through the membrane. In an example, the membrane in the LAMEE can be micro-porous such that one or more gases can pass through the membrane. In an example, the membrane can be a selectively-permeable membrane such that some constituents, but not others, can pass through the membrane. It is recognized that the LAMEEs included in the conditioning systems disclosed herein can use any type of membrane suitable for use with an evaporative cooler LAMEE.

In an example, the LAMEE or exchanger 411 can use a flexible polymer membrane, which is vapor permeable, to separate air and water. The water flow rate through the LAMEE 411 may not be limited by concerns of carryover of water droplets in the air stream, compared to other conditioning systems. The LAMEE 411 can operate with water entering the LAMEE 411 at high temperatures and high flow rates, and can therefore be used to reject large amounts of heat from the water flow using latent heat release (evaporation).

The cooling fluid circulating through the LAMEE or exchanger 411 can include water, liquid desiccant, glycol, other hygroscopic fluids, other evaporative liquids, and/or combinations thereof. In an example, the cooling fluid is a liquid desiccant that is a low concentration salt solution. The presence of salt can sanitize the cooling fluid to prevent microbial growth. In addition, the desiccant salt can affect the vapor pressure of the solution and allow the cooling fluid to either release or absorb moisture from the air. The concentration of the liquid desiccant can be adjusted for control purposes to control the amount of cooling of the scavenger air or cooling fluid within the LAMEE or exchanger 411.

Using a LAMEE in the cooling units 404 can offer advantages over conventional cooling systems, such as cooling towers, for example. The membrane separation layer in the LAMEE can reduce maintenance, can eliminate the requirement for chemical treatments, and can reduce the potential for contaminant transfer to the liquid loop. The use of LAMEEs along with an upstream or downstream cooling coil can result in a lower temperature of the water leaving the LAMEE and a higher cooling potential. Various configurations of cooling systems having a LAMEE can boost performance in many climates. Higher cooling potential and performance can result in lower air flow and fan power consumption in the cooling system, which is the main source of energy consumption in liquid-cooling systems, and can increase the overall data center cooling system efficiency.

The cooling units 404, which can each include the LAMEE 411, can be smaller in size relative to conventional cooling systems, such as a cooling tower having a similar cooling capacity. The cooling units 404 can require less water treatment and water filtration compared to conventional cooling systems since the water and the scavenger air in the LAMEE 411 do not come into direct contact with each other.

In the exemplary system 400 of FIG. 4, the LAMEE 411 can be configured to receive the water exiting the recovery coil 412 such that the water can circulate through the LAMEE 411 for further cooling, prior to being transported to the cold water supply 440. Under some conditions, the LAMEE 411 can be configured to operate adiabatically such that the fluid flow path through the LAMEE 411 can be selectively disconnected from the fluid flow path in the recovery coil 412. Each of these scenarios are described above for an evaporative cooler in reference to and as shown in FIGS. 1A and 1B.

It is recognized that a LAMEE can be used in the other conditioning systems which are described as including an evaporative cooler, and the LAMEE can provide the features and benefits described above in reference to the LAMEE 411 of FIG. 4.

In another example, as an alternative to a LAMEE, some or all of the cooling units 404 can include a cooling tower including one or more evaporative coolers. A cooling tower including an associated evaporative cooler can also be used in any of the other conditioning systems described herein.

Figure 5:
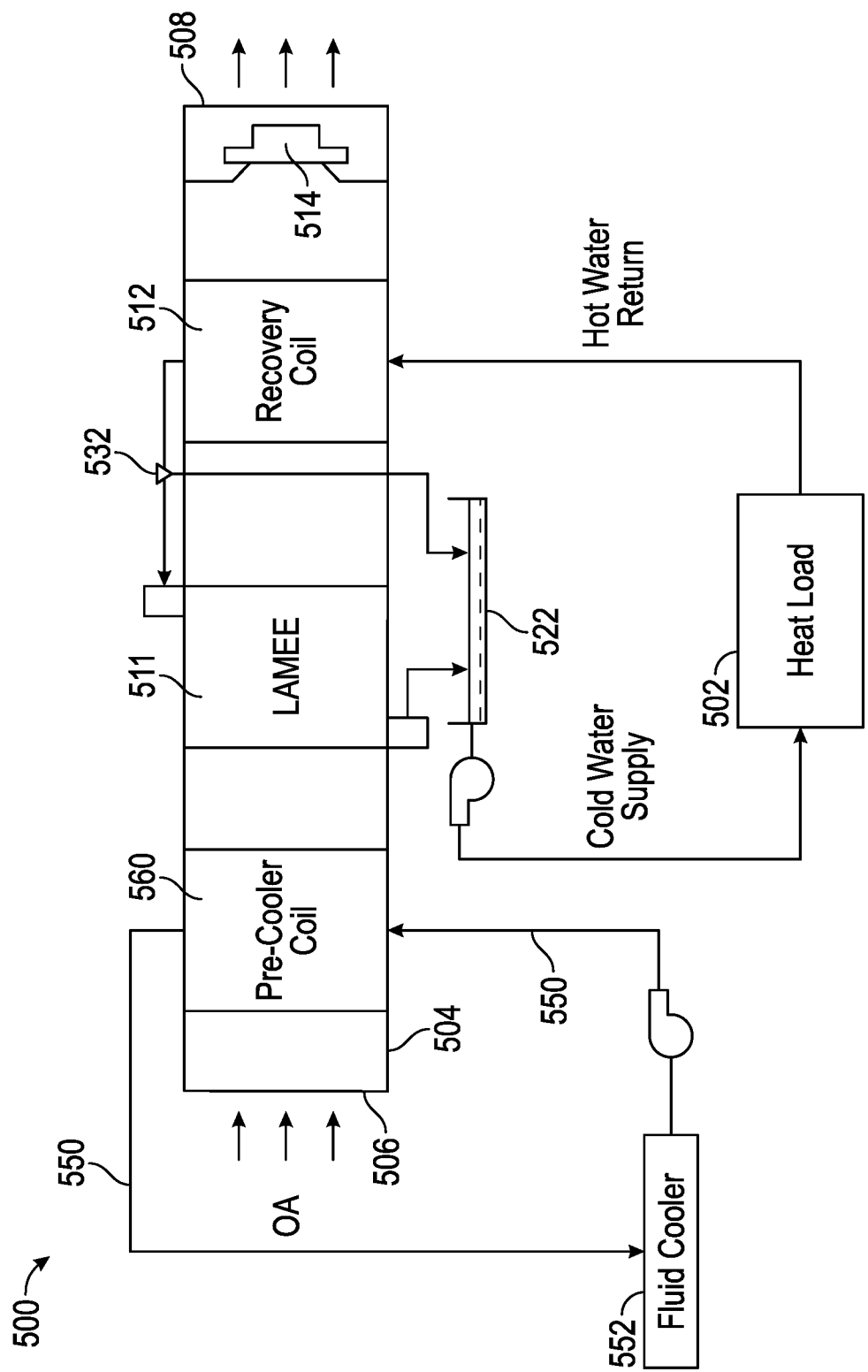
FIG. 5 is a schematic of an example conditioning system having a wholly or fully decoupled pre-cooler design.

FIG. 5 illustrates an example conditioning system 500, having a cooling unit (or scavenger air plenum) 504 having an inlet 506 and an outlet 508. The cooling unit 504 can include a pre-cooler 560, a LAMEE 511, a dry coil or recovery coil 512, and a fan 514, all of which can be arranged inside the cooling unit 504.

The cooling unit 504 can generally operate similar to the cooling units described above to produce cold water that can be temporarily stored in a tank 522 and then delivered to a heat load 502, as cold water supply, to provide liquid cooling. The cold water supply can be part of a process cooling fluid supply circuit. The increased-temperature water exiting the heat load 502 can then be returned to the recovery coil 512, as hot water return, for recirculation. The hot water return can be part of a process cooling fluid return circuit. The cooling unit 504 can operate in the multiple modes of operation described above in reference to the conditioning system 100A of FIG. 1A. A bypass valve 532 can control a distribution of the water from the recovery coil 512, depending on the operating mode.

The pre-cooler 560, as shown in the example of FIG. 5, can have an external cooling circuit 550. For purposes herein, the cooling circuit 550 for the pre-cooler 560 is described as being an external cooling circuit when the cooling fluid for the pre-cooler 560 is decoupled from the process water circuit of reduced-temperature water produced by the LAMEE 511 or recovery coil 512. In other words, the cooling circuit 550 for the pre-cooler 560 can be wholly or fully separate from the fluid circuit flowing through the LAMEE 511 or recovery coil 512, which provide liquid cooling to the heat load 502.

The external cooling circuit 550 for the pre-cooler 560 can allow the exchanger or LAMEE 511 to develop a higher cooling capacity in the process water circuit, which can significantly improve the cost per kW of the conditioning system 500. In other words, essentially the entire gross cooling capacity of the LAMEE 511 and recovery coil 512 can go to the heat load. As provided below, the external cooling circuit 550 can include a low-cost fluid cooler, such as, for example, an open cooling tower, which can be used only when needed by the load of the pre-cooler 560. In an example, the pre-cooler 560 can be an optional add-on to the conditioning system 500 depending on application or climate conditions, and the pre-cooler 560 can be sized accordingly. The gross cooling capacity of the cooling unit 504 can be potentially twice as much as the net cooling capacity of a cooling unit similar to the cooling system 104A of FIG. 1A which has a coupled pre-cooler 160A. In an example in which multiple cooling units 504 are used to provide cooling to the heat load 502, a reduced number of cooling units can be used to achieve the same amount of cooling. This can reduce the overall footprint of the collective units and can markedly improve the cost-effectiveness and profitability of the conditioning system.

The fluid circuit 550 for the pre-cooler 560 can include a fluid cooler 552 through which the cooling fluid can pass after the cooling fluid exits the pre-cooler 560. The fluid cooler 552 can reduce a temperature of the cooling fluid, at which point the cooling fluid can then be recirculated through the pre-cooler 560 in order to continue cooling the outdoor or scavenger air passing through the plenum 504.

The fluid cooler 552 of FIG. 5 can be any type of cooling device configured to reduce a temperature of the cooling fluid passing there through. In an example, the fluid cooler 552 of FIG. 5 can include but is not limited to a liquid to liquid heat exchanger, a refrigerant to liquid exchanger (such as an evaporator in a mechanical cooling system), an adiabatic or other type of evaporative fluid cooler, a cooling tower (closed or open circuit), or a combination thereof.

In an example, the fluid cooler 552 can be external to the cooling unit 504 and can be physically separate from the cooling unit/plenum 504 containing the LAMEE 511 and other components. In an example, the fluid cooler 552 can be housed within the cooling unit/plenum 504 containing the LAMEE 511 and other components.

Primarily for purposes of distinction and clarity, the cooling unit 504 can be referred to herein as a process cooling unit and the fluid cooler 552 can be referred to herein as an auxiliary cooling unit. This terminology can also be applicable to the conditioning systems in FIGS. 6-10. The auxiliary cooling unit (i.e. fluid cooler 552) can receive the increased-temperature water exiting the pre-cooling coil 560 from the process cooling unit (i.e. cooling unit 504). The auxiliary cooling unit 552 can reduce a temperature of the water and then recirculate the water back through the pre-cooling coil 560 of the process cooling unit 504. The fluid cooler 552 can be used during operation of the cooling unit 504 in an enhanced mode in which the pre-cooler 560 can be used to condition the scavenger air prior to passing the scavenger air through the LAMEE 511. In other modes, the pre-cooler 560 can be bypassed or turned off, in which case the fluid cooler or auxiliary cooling unit 552 is not running.

Figure 6:
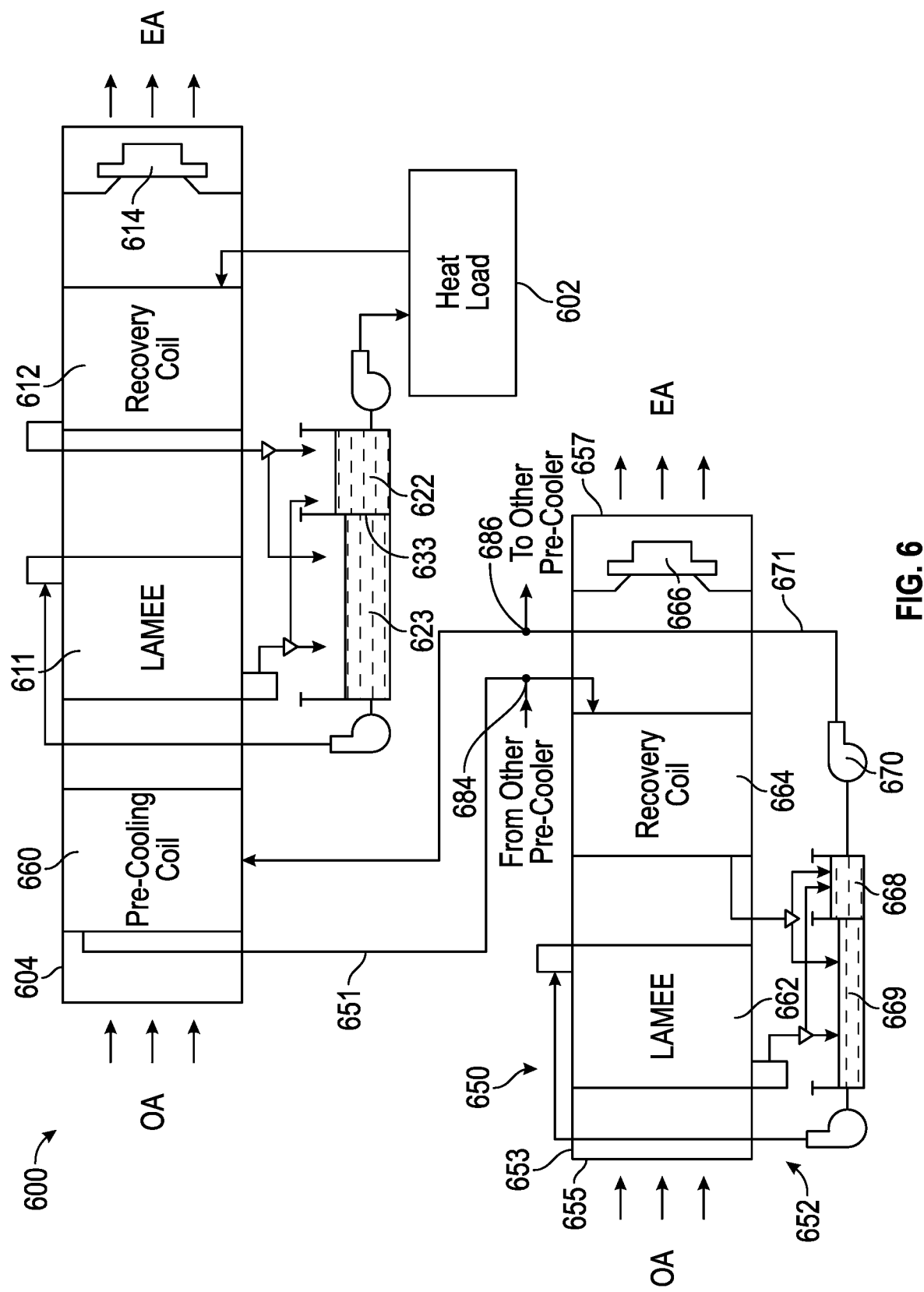
FIG. 6 is a schematic of another example conditioning system having a wholly decoupled pre-cooler design.

FIG. 6 illustrates another example conditioning system 600 having a cooling unit 604 (process cooling unit), which can be configured similarly to the conditioning system 500 and include an external cooling circuit 650 for a pre-cooler 660 of the cooling unit 604. The external cooling circuit 650 can be separate or decoupled from a fluid circuit for the process water used for liquid cooling of a heat load 602. The external cooling circuit 650 can include a fluid cooler 652, also referred to as an auxiliary cooling unit 652, configured to provide cooling for the cooling fluid in the pre-cooler 660.

The cooling unit 604 can operate generally similar to the cooling unit 504 of FIG. 5 and can include the pre-cooler 660, a LAMEE 611, a dry coil or recovery coil 612 and a fan 614. The conditioning system 600 of FIG. 6 is included herein to illustrate an example of a type of fluid cooler that can be used in the external cooling circuit 650. Such exemplary fluid cooler 652 can include a LAMEE and is described further below. It is recognized that any type of fluid cooler can be used in the auxiliary cooling unit 652.

The configuration of the LAMEE 611 and the recovery coil 612 can be configured similar to the design of the evaporative cooler 110B and the recovery coil 11B of FIG. 1B. The system 600 can include a first tank 622 and a second tank 623 for the LAMEE 611 and the recovery coil 612. In an example, the first tank 622 and second tank 623 can be connected to each other but can have a partition 633 or other type of separation between them. In an example, the partition 633 can be configured such that it can be lowered to reduce a height of the partition 633 during operation in the evaporation mode (as described above in reference to FIG. 1B). The partition 633 can function similar to a weir between the tanks 622 and 623 such that when the partition 633 is lowered, the water can spill over the partition if the level gets too high in one of the tanks. In another example, as shown in FIG. 1B, the two tanks 622 and 623 can be separate tanks disconnected from one another with an equalization valve there between.

The fluid circuits for the LAMEE 611 and the recovery coil 612 can be similar to those shown in FIG. 1B and described in detail above. Thus the water lines and valves for the LAMEE 611 and recovery coil 612 are not labeled in FIG. 6 or described in detail for the system 600. The LAMEE 611 can operate adiabatically as described above in reference to the evaporative cooler 110B of FIG. 1B. The cooling unit 604 can operate in the multiple modes described above in reference to the system 100B of FIG. 1B. However, in contrast to FIG. 1B, the conditioning system 600 of FIG. 6 can have the decoupled pre-cooler 660 design. The fluid cooler or auxiliary cooling unit 652 can provide the cooling fluid to the decoupled pre-cooler 660.

In the example of FIG. 6, the fluid cooler or auxiliary cooling unit 652 can include a LAMEE 662, a recovery coil 664, and a fan 666 arranged in a scavenger air plenum 653 and configured to reduce a temperature of the cooling fluid from the pre-cooler 660. The scavenger air plenum 653 can include an inlet 655 configured to receive an outdoor air stream such that the outdoor or scavenger air flows through the plenum 653 and out of the plenum 653 via an outlet 657. The LAMEE 662 can condition the scavenger air flowing there through such that the scavenger air can reduce a temperature of the cooling fluid passing through the recovery coil 664.

In the example, as shown in FIG. 6, the auxiliary cooling unit 652 can operate similar to the systems 100A or 100B, with the exception that the auxiliary cooling unit 652 as shown in FIG. 6 excludes a pre-cooler. As it is shown in FIG. 6, the auxiliary cooling unit 652 can be configured to operate in multiple modes (excluding the super-evaporation mode), including economizer, adiabatic and evaporation modes. However, in some examples, the design of the auxiliary cooling unit 652 can be simplified and may not include the capability to operate in multiple operating modes. It is recognized that it is not practical to run the auxiliary cooling unit 652 in an economizer mode. In most cases, the auxiliary cooling unit 652 can be operational during high ambient conditions since it is running when the pre-cooler 660 of the process unit 604 is running. As such, the auxiliary cooling unit 652 can be configured for an evaporation mode, similar to the description above under FIG. 1B, and in some cases, the auxiliary cooling unit 652 can be configured for selectively operating in an adiabatic mode.

In an example, the water lines to and from the LAMEE 662 and the recovery coil 664 can be similar to those shown in FIG. 6 for the LAMEE 611 and recovery coil 612, both of the process cooling unit 604, or similar to those shown in FIG. 1B for the evaporative cooler 110B and the recovery coil 112B. In an example, the auxiliary cooling unit 652 can include a first tank 668 and a second tank 669.

The external cooling circuit 650 can include a water line 651 fluidly connected to an outlet of the pre-cooler 660 and an inlet of the recovery coil 664. As such, the increased-temperature fluid exiting the pre-cooler 660 can be delivered to the auxiliary cooling unit 652. The increased-temperature fluid can pass through the recovery coil 664 at which point the conditioned air exiting the LAMEE 662 can be used to reduce a temperature of the cooling fluid in the recovery coil 664. The reduced-temperature fluid can then be delivered to at least one of the first tank 668 and the second tank 669. The cooling fluid in the tank 669 can be circulated through the LAMEE 611 and then delivered to at least one of the first tank 668 and the second tank 669.

FIG. 6 includes the control valves for the distribution of the cooling fluid among the tanks 668 and 669 (similar to the valves 132B and 182B described above in reference to the system 100B of FIG. 1B); however, it is recognized that the control valves in FIG. 6 can be excluded depending on whether the unit 652 is configured for multiple operating modes. A pump 670 can deliver the fluid from the tank 668 back to the pre-cooler 660 of the process cooling unit 604 via a water line 671, which can be part of the external cooling circuit 650.

As it is shown in FIG. 6, the auxiliary cooling unit 652 can include the LAMEE 662 and recovery coil 664 in combination. In another example, to simplify a design of the unit 652, the recovery coil 664 can be excluded from the unit 652 and the LAMEE 662 can operate essentially alone to reduce a temperature of the cooling fluid from the pre-cooler 660.

As described above in reference to the conditioning system 500, the auxiliary cooling unit 652 can be used when the process cooling unit 604 is operating in an enhanced mode in which the pre-cooler 660 can be used to precondition the scavenger air entering the cooling unit 604. In the economizer and evaporation modes for the process cooling unit 604, the pre-cooler 660 can be bypassed or turned off, in which case the auxiliary cooling unit 652 can be inactive or turned off. The process cooling unit 604 can be operated in an adiabatic mode for the LAMEE 611 with the pre-cooler 660 turned on. In this hybrid mode (as it is referred to above in reference to FIG. 1B), the auxiliary cooling unit 652 can be active since the pre-cooler 660 is being used in the process cooling unit 604.

The auxiliary cooling unit 652 can serve more than one process cooling unit. As shown in FIG. 6, the water line 651 can include a junction 684 or common return line that can receive increased temperature fluids from multiple pre-coolers of multiple process cooling units. Similarly, the reduced temperature fluid exiting the auxiliary cooling unit 652 via the line 671 can be delivered back to more than one process cooling unit. The line 671 can include a junction 686 or common supply line for distributing the reduced temperature fluid back to multiple process cooling units, including the process cooling unit 504 of FIG. 6. In an example, each of junctions 684 and 686 can represent a manifold. In such an example, the various outlets of the pre-coolers (from the process cooling units) can be hooked in parallel with one another and connected via a manifold pipeline that can deliver the increased temperature water from each process cooling unit to the recovery coil 664 of the auxiliary cooling unit 652. Similarly, the outlet of the water tank 668 of the auxiliary cooling unit 652 can be fluidly connected to a manifold to distribute the reduced temperature water from the auxiliary cooling unit 652 to the inlet of the pre-cooler for each of the process cooling units. This is further illustrated in an example conditioning system shown in FIG. 9 and described below.

In another example, the auxiliary cooling unit 652 can include a pre-cooler upstream of the LAMEE 662, in which case the unit 652 can operate similar to the systems 100A and 100B of FIGS. 1A and 1B, respectively, and can include an enhanced mode of operation. In such an example, the pre-cooler can have a coupled or a decoupled cooling circuit. In the example in which the pre-cooler of the auxiliary cooling unit 652 has a decoupled cooling circuit, the cooling fluid used in the pre-cooler could be cooled by another auxiliary cooling unit, which similarly could have a pre-cooler cooled by yet another auxiliary cooling unit and so on. These stages of auxiliary cooling units can use various types of evaporative coolers in addition to or as an alternative to a LAMEE.

With regard to FIGS. 5 and 6, typically the auxiliary cooling unit 552 or 652 can run at higher water temperatures compared to the process water circuit of the process cooling unit 504 or 604. As such, in an example in which the auxiliary cooling unit includes a LAMEE (for example, LAMEE 511 or 611), a pre-cooler may not be needed in the auxiliary cooling unit 552 or 652 to reach sufficiently cool temperatures for the cooling fluid for the pre-coolers 560 and 660 of the process cooling units 504 and 604, respectively. Because of the higher operating temperatures of the auxiliary cooling units 552 and 652, the auxiliary cooling units 552 and 652 can develop even higher cooling capacities for the same size unit.

In an example, one auxiliary cooling unit can be dedicated to one process cooling unit. In an example, an auxiliary cooling unit can be a module attached externally (on top or on the side or end) of the process cooling unit, or the auxiliary cooling unit can be a separate unit connected with water piping to the process cooling unit.

The decoupled pre-cooler circuits 550 and 650 of FIGS. 5 and 6 can improve the control characteristics of the process cooling units 504 and 604 in the enhanced or super-evaporative mode of the process cooling units 504 and 604. In a coupled design in which the pre-cooler uses the reduced temperature water (or process water) from the evaporative cooler and recovery coil (see, for example, FIG. 1A), the system capacity can peak at less than the maximum scavenger air flow rate, and thus would not increase further with additional air flow. For example, the system capacity could peak at about ⅔ to ¾ of the maximum scavenger air flow rate. This is a result of the pre-cooler or pre-cooling coil in the unit 504 or 604 continuing to increase its heat load, and such heat load needs to be rejected by the evaporative cooler (LAMEE 511 or 611), with no net cooling benefit to the process water circuit. With the de-coupled pre-cooler 560 and 660 shown in FIGS. 5 and 6, respectively, and described herein, the LAMEE 511 or 611 can develop all of its cooling power potential in the process water flow up to the maximum scavenger air flow rate. In other words, through the design of a decoupled pre-cooler, the scavenger air flow rates through the process cooling units 504 or 604 can be increased up to the peak flow rate capacity of the LAMEE 511 or 611. This can support an increased cooling power of the process cooling units 504 or 604.

Figure 7:
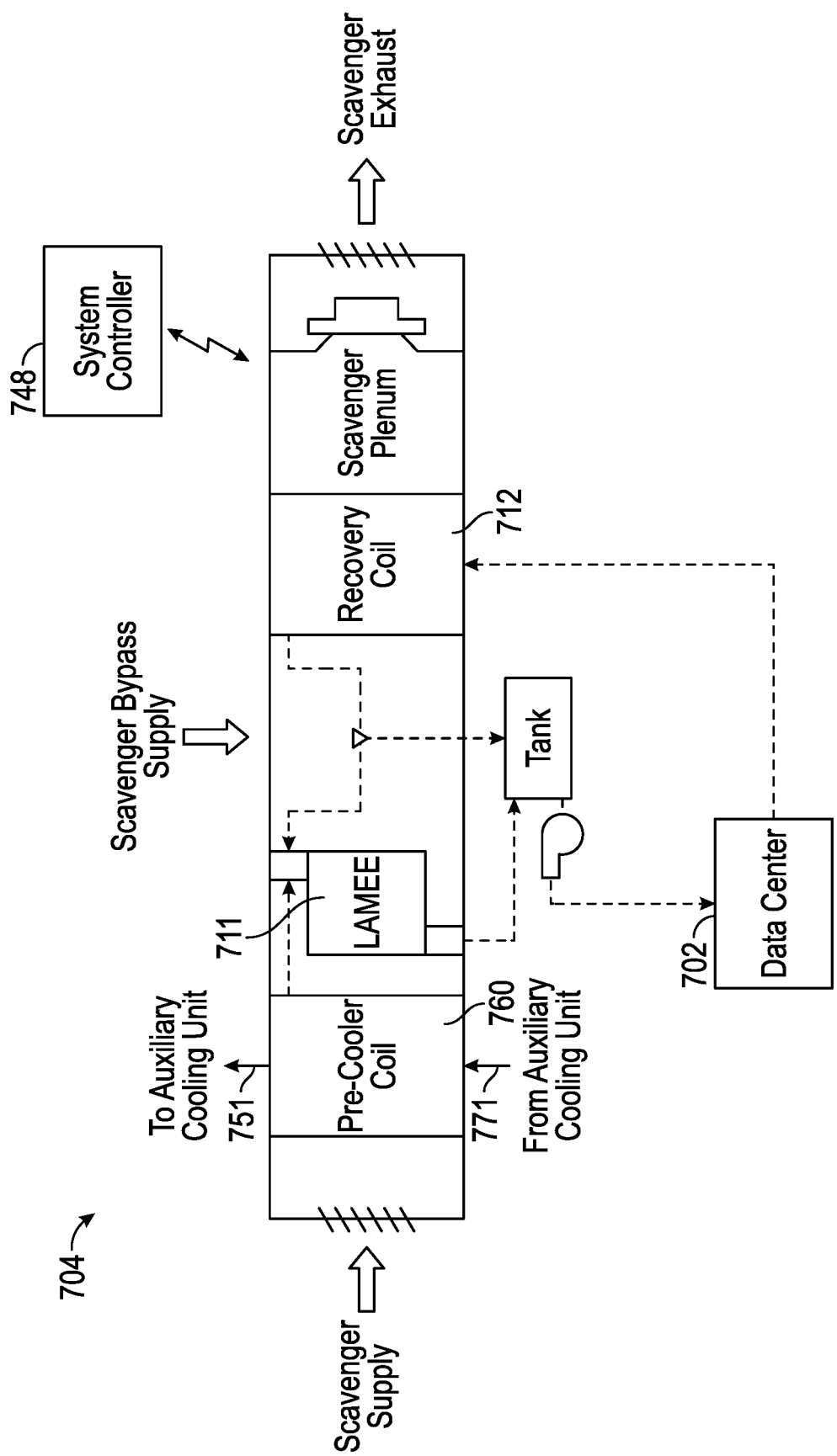
FIG. 7 is a schematic of a process cooling unit of an example conditioning system having a wholly decoupled pre-cooler design.
Figure 8:
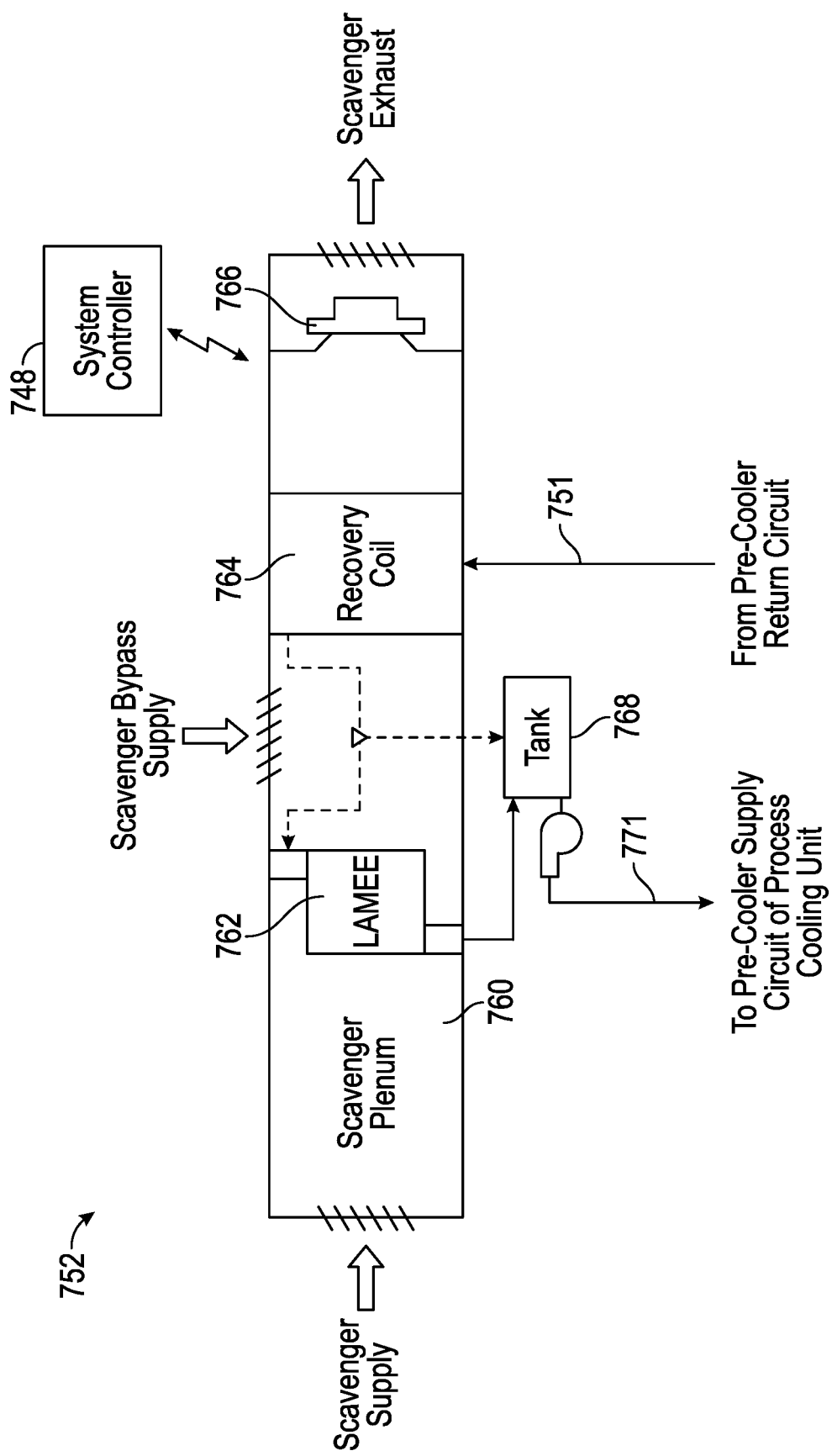
FIG. 8 is a schematic of an auxiliary cooling unit for the example conditioning system of FIG. 7.

The tables below illustrate the performance for a modeled cooling or conditioning system as an example having a plurality of process cooling units and a plurality of auxiliary cooling units, which can be similar to those shown in the conditioning system 600 of FIG. 6. FIG. 7 depicts one process cooling unit for this exemplary system as a process cooling unit 704. FIG. 8 depicts one auxiliary cooling unit for this exemplary system as an auxiliary cooling unit 752. A system controller 748 is shown in FIGS. 7 and 8 and can be included in the conditioning system for controlling operation of the process cooling units 704 and auxiliary cooling units 752.

The modeled cooling or conditioning system can be configured to provide cooling to a data center 702 with a cooling load of 5 megawatts. The data for the process cooling units 704 is shown in Table 1 below. In this example, a set point temperature for the cold process water produced by the cooling unit 704 (for the data center 702) can be set at 80 degrees Fahrenheit—this is referred to below in Table 1 as the "Cooling Coil water inlet set point." (The set point temperature can vary depending on the application and other factors.)

TABLE 1

5 MW Data Center
95FDB/78FWB Outdoor Air Conditions
80 F. EWT, 18 F. Delta
Sea Level
Process Cooling Units - 12 Units (See FIG. 7)

| | Flow Rate | |
|---|---|---|
| Pre-cooling coil 760 | 60 | GPM |
| Recovery coil 712 | 160 | GPM |
| LAMEE711 | 160 | GPM |
| Airflow (through plenum) | 30,000 | SCFM |

| | Pre-cooler | | LAMEE | | Recovery | |
|---|---|---|---|---|---|---|
| | F. | C. | F. | C. | F. | C. |
| DB in | 95 | 35.0 | 85 | 29.4 | 87.1 | 30.6 |
| WB in | 78 | 25.6 | 75.4 | 24.1 | 83.3 | 28.5 |
| Tw in | 81.1 | 27.3 | 93.7 | 34.3 | 98.0 | 36.7 |
| DB out | 85 | 29.4 | 87.1 | 30.6 | 97.3 | 36.3 |
| WB out | 75.4 | 24.1 | 83.3 | 28.5 | 85.5 | 29.7 |
| Tw out | 91.8 | 33.2 | 80.0 | 26.7 | 93.7 | 34.3 |
| ACFM | 31766 | | 31207 | | 31380 | |

| | F. | C. |
|---|---|---|
| LAMEE water inlet | 93.7 | 34.3 |
| Cooling Coil water inlet set point | 80 | 26.7 |

Water Properties at 32 C.

| Rho | 995 | kg/m^3 |
|---|---|---|
| Cp | 4.1795 | kJ/kgK |
| Total Cooling per Unit | 420.1 | kW |

The cooling fluid exiting the pre-cooler 760 of each of the twelve (12) process units 704 can be transported to an auxiliary cooling unit (via a supply circuit 751) and then recirculated back through the pre-cooler 760 (via a return circuit 771). Each process cooling unit 704 can provide 420 kW of cooling to the data center 702.

At a flow rate of 160 gallons per minute and 12 units, the data center is receiving the cold water at a total flow rate of 1920 gallons per minute. This is the flow rate for which sufficient cold water is supplied to the data center to meet the 5 MW cooling load.

In this example, five (5) auxiliary cooling units 752 can be used in combination with the twelve (12) process cooling units 704. The data for the auxiliary cooling units 752 is shown in Table 2 below.

TABLE 2

| Auxiliary Cooling Units - 5 Units (See FIG. 8) | | | | |
|---|---|---|---|---|
| | Flow Rate | | | |
| Recovery coil 764 | 144 | GPM | | |
| LAMEE 762 | 144 | GPM | | |
| Airflow (through plenum) | 35,000 | SCFM | | |

| | LAMEE | | Recovery | |
|---|---|---|---|---|
| | F. | C. | F. | C. |
| DB in | 95 | 35.0 | 86.9 | 30.5 |
| WB in | 78 | 25.6 | 81.8 | 27.7 |
| Tw in | 89.4 | 31.9 | 91.8 | 33.2 |
| DB out | 86.9 | 30.5 | 91.3 | 32.9 |
| WB out | 81.8 | 27.7 | 82.8 | 28.2 |
| Tw out | 80.8 | 27.1 | 89.4 | 31.9 |
| ACFM | 37060 | | 36696 | |

TABLE 2-continued

| Auxiliary Cooling Units - 5 Units (See FIG. 8) | | |
|---|---|---|
| | F. | C. |
| LAMEE water inlet | 89.4 | 31.9 |
| Pre-cooler water inlet | 80.8 | 27.1 |
| Water Properties at 32 C. | | |
| Rho | 995 | kg/m^3 |
| Cp | 4.1795 | kJ/kgK |
| Total Cooling per Unit | 231.7 | kW |

As shown in Tables 1 and 2 above, the water exiting the pre-cooler 760 of the process cooling unit 704 is at a temperature of 91.8 degrees Fahrenheit; the water can enter the recovery coil 764 of the auxiliary cooling unit 752 via a water circuit or line 751 fluidly connected to the pre-cooler 760 and the recovery coil 764, where it can be reduced to 89.4 degrees Fahrenheit. The water can then pass through the LAMEE 762 at which point a temperature of the water is reduced to 80.8 degrees Fahrenheit. The water at 80.8 degrees Fahrenheit can be returned to the process cooling unit (via a water circuit or line 771 fluidly connected to a tank 768 and the pre-cooler 760) for recirculation through the pre-cooling coil 760 of the process cooling unit 704.

The cooling or conditioning system of FIGS. 7 and 8 can provide approximately 5040 kW (or 5 megawatts) of cooling since each of the twelve (12) process cooling units 704 can provide 420 kW of cooling.

The cooling or conditioning system of FIGS. 7 and 8 can be compared to a modeled cooling or conditioning system having a plurality of cooling units with a similar configuration to the process cooling units of FIG. 7 but with a coupled cooling circuit that uses the cold process water produced by the unit as the cooling fluid for the pre-cooler coil. Such system can be similar to the conditioning system 100B of FIG. 1B in an example in which the evaporative cooler 110 is a LAMEE and the system can operate at the same outdoor air conditions provided above under Table 1. The data for such process cooling units is provided in Table 3 below.

TABLE 3

| Comparison for Process Cooling Unit with Coupled Pre-coolers Total Units: 22 | | | | | | |
|---|---|---|---|---|---|---|
| | Flow Rate | | | | | |
| Pre-cooling coil (160) | 60 | GPM | | | | |
| Recovery coil (112) | 80 | GPM | | | | |
| LAMEE (110) | 140 | GPM | | | | |
| Airflow (through plenum) | 25,000 | SCFM | | | | |

| | Pre-cooler | | LAMEE | | Recovery | |
|---|---|---|---|---|---|---|
| | F. | C. | F. | C. | F. | C. |
| DB in | 95 | 35.0 | 82.2 | 27.9 | 84.5 | 29.2 |
| WB in | 78 | 25.6 | 74.7 | 23.7 | 81.7 | 27.6 |
| Tw in | 78.37 | 25.8 | 89.8 | 32.1 | 98.0 | 36.7 |
| DB out | 82.2 | 27.9 | 84.5 | 29.2 | 96.6 | 35.9 |
| WB out | 74.7 | 23.7 | 81.7 | 27.6 | 84.4 | 29.1 |
| Tw out | 90.1 | 32.3 | 78.4 | 25.8 | 89.6 | 32.0 |
| ACFM | 26483 | | 25934 | | 26114 | |

| | F. | C. |
|---|---|---|
| Mixed LAMEE water inlet | 89.81429 | 32.12 |
| Cooling Coil water inlet set point | 80 | 26.67 |
| Water Properties at 32 C. | | |
| Rho | 995 | kg/m^3 |
| Cp | 4.1795 | kJ/kgK |
| Total Cooling per Unit | 228.9 | kW |

The set point temperature for delivery to the data center is the same at 80 degrees Fahrenheit. Each process cooling unit produces 229 kW of cooling. As such, in order to produce a comparable amount of total cooling for the data center (approximately 5000 kW), 22 process cooling units are needed for the coupled design.

In summary, the modeled cooling system illustrates that 12 process cooling units (each having a decoupled pre-cooler circuit) in combination with 5 auxiliary cooling units (17 units total) can provide equivalent cooling to 22 process units that have a coupled pre-cooler design. This reduction in the total number of cooling units, using the decoupled designs and external cooling described and shown herein, can significantly decrease the costs and size of the cooling system for a data center.

Table 4 below shows the data for a modeled conditioning system that can be similar in configuration to the conditioning system 400 of FIG. 4 and thus can have a partially decoupled pre-cooler design for each of the process cooling units. The modeled conditioning system for Table 4 can operate at the same outdoor air conditions provided above under Table 1.

lates 37 gallons per minute of cold water, an additional 629 gallons per minute of cold water is delivered to the cold water supply or main. Thus a total of 2550 gallons per minute of cold water is delivered to the cold water main for both the data center and the pre-coolers.

The water exits the pre-cooler 460 of each unit at a flow rate of 629 gpm and at 94 degrees Fahrenheit and is delivered to the hot water return. That water mixes with the water returning from the data center at a flow rate of 1920 gpm and a temperature of 98 degrees Fahrenheit. A mixing calculation is used to determine that the temperature of the water in the hot water return is 97 degrees Fahrenheit. That is also the inlet temperature for the recovery coil 412 (see Table 4) since the hot water from the hot water return is then recirculated back to the recovery coil 412.

Figure 9:
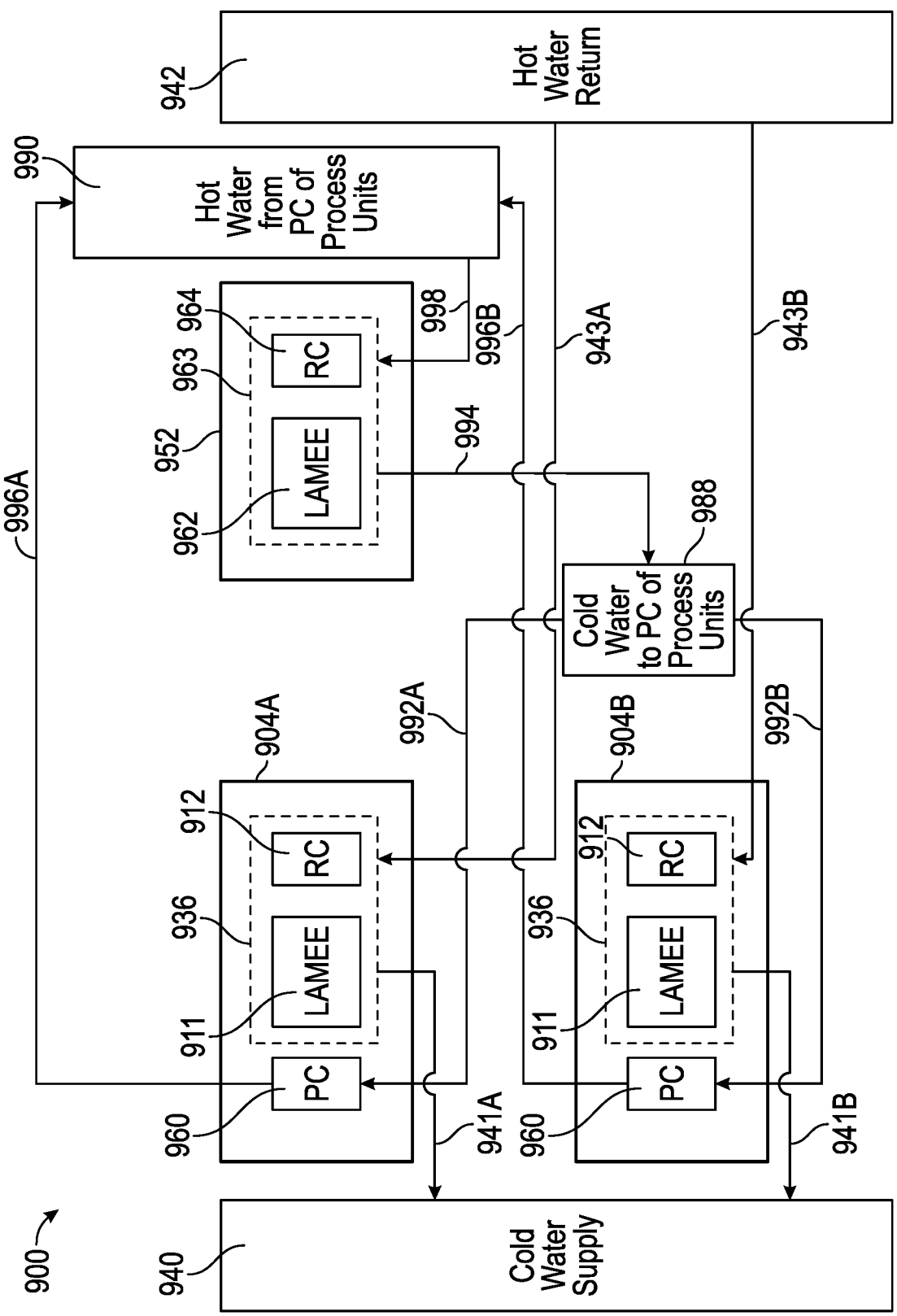
FIG. 9 is a schematic of another example conditioning system having a wholly decoupled pre-cooler design with process cooling units and an auxiliary cooling unit.

FIG. 9 illustrates an example conditioning system 900 having two process cooling units 904A and 904B and one auxiliary unit 952. As shown in FIG. 9, the design of the system 900 is similar to the conditioning systems in FIGS. 6-8 and can include a decoupled fluid circuit for each pre-cooler 960 in the process cooling units 904 that can be wholly separate from the process water circuit used to

TABLE 4

Comparison for Process Cooling Unit with Partially Decoupled Pre-Coolers (See FIG. 4)
Total Units: 17

| | Flow Rate | |
|---|---|---|
| Pre-cooling coil (460) | 37 | GPM |
| Recovery coil (412) | 150 | GPM |
| LAMEE (410) | 150 | GPM |
| Airflow | 30,000 | SCFM |

| | Pre-cooler | | LAMEE | | Recovery | |
|---|---|---|---|---|---|---|
| | F. | C. | F. | C. | F. | C. |
| DB in | 95.0 | 35.0 | 87.1 | 30.6 | 86.8 | 30.5 |
| WB in | 78.0 | 25.6 | 76.0 | 24.4 | 82.9 | 28.3 |
| Tw in | 79.9 | 26.6 | 92.8 | 33.8 | 97.0 | 36.1 |
| DB out | 87.1 | 30.6 | 86.8 | 30.5 | 96.3 | 35.7 |
| WB out | 76.0 | 24.4 | 82.9 | 28.3 | 85.0 | 29.4 |
| Tw out | 94.0 | 34.4 | 79.9 | 26.6 | 92.8 | 33.8 |
| ACFM | 31766 | | 31207 | | 31380 | |

| | F. | C. |
|---|---|---|
| Cooling coil return water temperature | 98.0 | 36.7 |
| Mixed return water temperature | 97.0 | 36.1 |
| LAMEE water inlet | 92.8 | 33.8 |
| Cooling Coil water inlet set point | 80 | 26.67 |

Water Properties at 32 C.

| Rho | 995 | kg/m^3 |
|---|---|---|
| Cp | 4.1795 | kJ/kgK |
| Total Cooling per Unit | 374.27 | kW |

The set point temperature for delivery to the data center is the same at 80 degrees Fahrenheit. Each process cooling unit produces 374 kW of gross cooling that is provided to the cold water main. However, each process cooling unit draws cold water from the cold water main in order to direct cold water through the pre-cooler 460 at a flow rate of 37 gallons per minute. The flow rate through the recovery coil 412 and LAMEE 411 is at 150 gallons per minute.

At a flow rate of 150 gpm through the LAMEE and recovery coil, 17 process cooling units are needed to meet the 5 MW cooling load for the data center. As provided above under the description in Table 1, to meet the cooling load, 1920 gallons per minute of cold water is provided to the data center. Because the pre-coolers of each unit circuprovide liquid cooling to a heat load (for example, a data center or other enclosed space). The design in FIG. 9 shows a process cooling circuit (through each LAMEE 911 and RC 912) for multiple cooling units 904, each of which is separate from the pre-cooler cooling circuit (or auxiliary cooling circuit).

Each cooling unit 904 can produce reduced-temperature water that can be provided to a cold water supply 940 to provide liquid cooling to the heat load. The cold water supply 940 can be fluidly connected to each of the cooling units 904A and 904B via water lines 941A and 941B. Even though FIG. 9 does not show any tanks for the cooling units 904, in an example, one or two tanks can be fluidly connected and dedicated to each cooling unit 904A and 904B for receiving the water from a LAMEE 911 and a recovery coil 912 of each cooling unit 904A and 904B. The water can be transported from one or more tanks to the cold water supply 940.

After the water has provided liquid cooling to the heat load, the increased temperature water can be transported back to the cooling units 904A and 904B through the hot water return 942. The hot water return 942 can be fluidly connected to the recovery coil 912 of each of the cooling units 904A and 904B via water lines 943A and 943B, respectively.

For simplicity, a dotted line box 936 is designated for labeling purposes only around the LAMEE 911 and recovery coil 912 of each unit 904 as described above under FIGS. 3 and 4. FIG. 9 shows the outlet lines 941A, 941B and the inlet lines 943A, 943B connected to the box 936.

Because the pre-cooler fluid circuit is separate from the process water circuit in the example of FIG. 9, the conditioning system 900 can include a PC cold water main 988 and a PC hot water return 990, both for the pre-cooler fluid circuit. Each pre-cooler 960 of the cooling units 904A and 904B can be fluidly connected to the PC cold water main 988 via water line 992A and 992B such that reduced-temperature cooling fluid can flow from the PC cold water main 988 and into the pre-cooler 960 of each cooling unit 904A, 904B. Such reduced-temperature cooling fluid for the pre-coolers 960 can be produced by the auxiliary cooling unit 952 which can be configured similar to the auxiliary cooling unit 652 of FIG. 6. The reduced temperature cooling fluid can exit the auxiliary cooling unit 952 and be directed to the PC cold water main 988 via a water line 994.

After circulating through the pre-coolers 960 of the cooling units 904A and 904B, the cooling fluid in the pre-cooler fluid circuit can be at an increased temperature. Such increased temperature fluid can flow from each pre-cooler 960 to the PC hot water return 990 via water lines 996A and 996B. The increased-temperature fluid can be housed in the PC hot water return 990 and then can transported back through the auxiliary cooling 952 (via a water line 998) to be cooled again using the LAMEE 962 and recover coil 964. The reduced-temperature fluid can exit the auxiliary cooling unit 952 and can be housed in the PC cold water main 988. The reduced-temperature fluid can then be circulated back through the pre-cooler 960 of each cooling unit 904A and 904B.

For simplicity, the fluid circuits of the LAMEE 962 and recovery coil 964 are not shown in FIG. 9 for the auxiliary cooling unit 952. Rather the water lines 994 and 998 are shown as being connected to a dotted-line box designated as 963 for labeling purposes only. In an example, the LAMEE 962 and the recovery coil 964, and each of their corresponding fluid circuits, can be configured similarly to the LAMEE 662 and recovery coil 664 of FIG. 6.

In the example of FIG. 9, the conditioning system 900 can include two cooling units 904 and one auxiliary unit 952. It is recognized that more or less cooling units 904 and more or less auxiliary units 952 can be included in the conditioning systems described herein. Multiple auxiliary units 952 can be connected in parallel and can be connected to multiple process cooling units 904 through the PC cold water main 988 and the PC hot water return 990. The process cooling units 904 can also be connected in parallel as described above. This design can improve overall resiliency and redundancy of the system 900. For example, if any of the auxiliary units 952 fail, the process cooling units 904 can remain functioning at reduced flow rates to account for the failed auxiliary unit.

Figure 10:
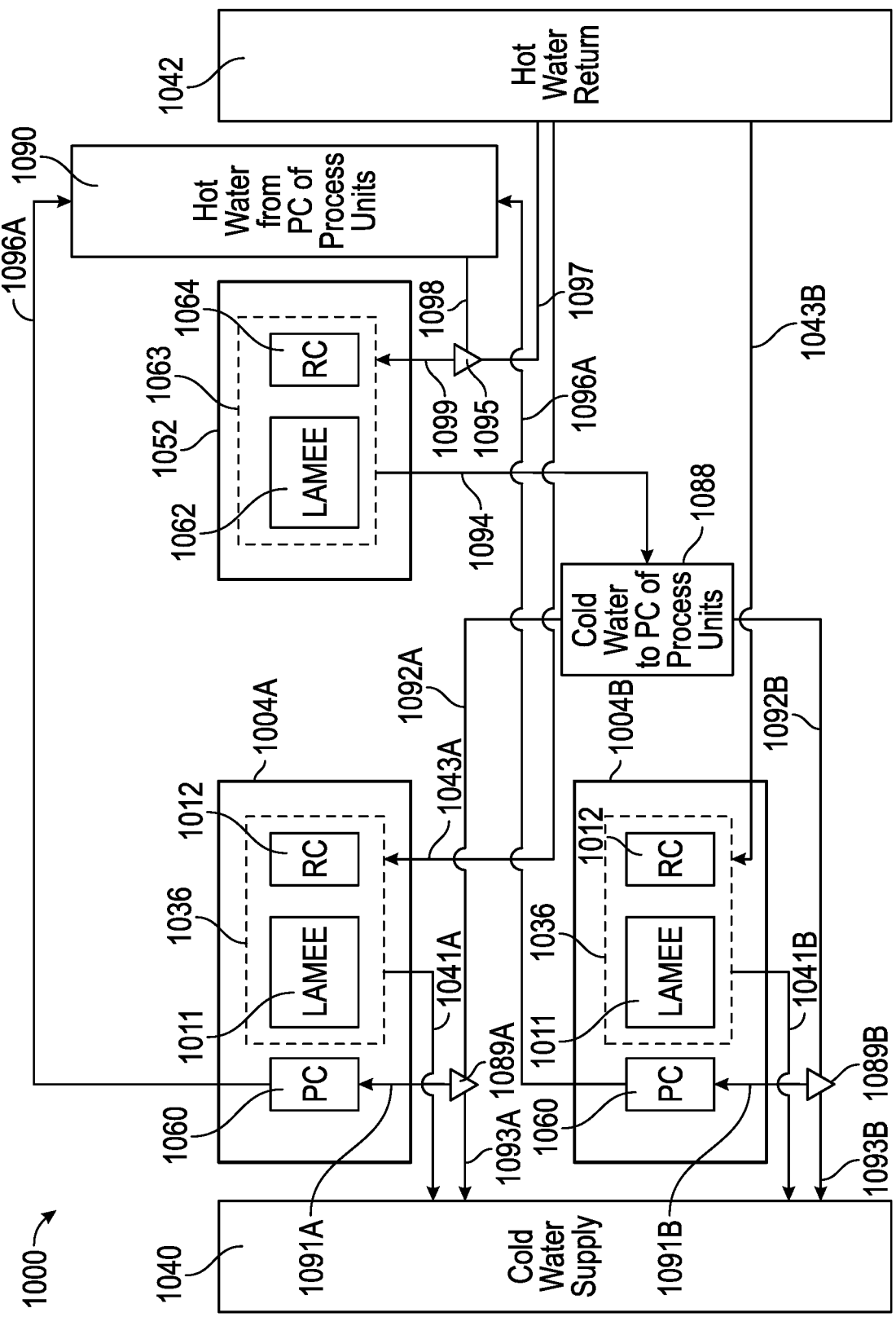
FIG. 10 is a schematic of another example conditioning system with process cooling units and an auxiliary cooling unit capable of operating as a process cooling unit.

FIG. 10 illustrates an example conditioning system 1000 that can be configured similar to the conditioning system 900 of FIG. 9 and can include two or more process cooling units 1004 and one or more auxiliary cooling units 1052. However, in contrast to the conditioning system 900, the auxiliary cooling unit 1052 can function as both an auxiliary cooling unit and a process cooling unit, as described below. Each process cooling unit 1004A and 1004B can include a pre-cooler 1060, a LAMEE 1011 and a recovery or dry coil 1012. The auxiliary cooling unit 1052 can include a LAMEE 1062 and recovery coil 1064. Dotted line boxes 1036 and 1063 are included in FIG. 10 for simplicity as described above in reference to FIG. 9.

As described above in reference to the other example conditioning systems described above, the auxiliary cooling unit 1052 can provide cooling to the pre-cooler 1060 by reducing a temperature of a cooling fluid that circulates through the pre-cooler 1060. The pre-cooler 1060 can be operational within the process cooling units 1004 during an enhanced operating mode. During the normal and economizer modes, the pre-cooler 1060 can be bypassed or turned off. As such, the auxiliary cooling unit 1052 may not be needed at all times that the process cooling units 1004 are operating for providing the cooling fluid to the pre-cooler 1060. In an example, as shown in FIG. 10, the conditioning system 1000 can be configured such that the auxiliary cooling unit 1052 can provide process cooling (to the heat load) when it is not needed for providing reduced-temperature cooling fluid to the pre-cooler 1060.

In the conditioning system 1000, the auxiliary cooling unit 1052 can be switched from being part of an external cooling circuit for the pre-cooler 1060 to operating as a process cooling unit to provide cooling to the heat load. The conditioning system 1000 can include the same water lines and fluid circuits as the conditioning system 900, with the difference being that the conditioning system 1000 can include additional lines and bypass valves to allow for switching of the auxiliary cooling unit 1052 between operating as a fluid cooler for the pre-coolers 1060 and operating as a process cooling unit for producing reduced-temperature water for delivery to the cold water supply 1040. First, the water lines 1092A and 1092B can each be fluidly connected to bypass valves 1089A and 1089B which can be used to control the distribution of the cooling fluid from a PC cold water main 1088. When the auxiliary cooling unit 1052 is operating as a fluid cooler for each pre-cooler 1060, the water can be delivered to each pre-cooler 1060 via water lines 1091A and 1091B. When the auxiliary cooling unit 1052 is operating as a process cooling unit to deliver cold water to the heat load, the water from PC cold water main 1088 can be delivered to the cold water supply 1040 via water lines 1092A and 1092B, which can be fluidly connected to the water lines 1093A and 1093B. The water can flow from the PC cold water main 1088 to the cold water supply 1040 when the valves 1089A and 1089B are positioned to direct the water through lines 1093A and 1093B, rather than through the lines 1091A and 1091B.

Second, the water line 1098 between the PC hot water supply 1090 and the auxiliary cooling unit 1052 can be in connection with a bypass valve 1095 that can allow increased-temperature water from the hot water return 1042 to be delivered to the auxiliary cooling unit 1052 via a line 1097 when the auxiliary cooling unit 1052 is operating as a process cooling unit. When the auxiliary cooling unit 1052 is operating as a fluid cooler for each pre-cooler 1060 of the process cooling units 1004, the bypass valve 1095 can be configured to close the line 1097 and thus deliver water from the PC hot water return 1090 to the recovery coil 1064 via the water line 1098, which can be connected to the water line 1099 into the auxiliary cooling unit 1052. When the auxiliary cooling unit 1052 is operating as a process cooling unit, the bypass valve 1095 can be configured to open the line 1097 from the hot water return 1042 to the recovery coil 1064 and close the water line 1098 from the PC hot water return 1090. Thus the water from the hot water return 1042 can enter the auxiliary cooling unit 1052 through the line 1099.

The conditioning system 1000 can include a system controller, similar to the system controller 148A of FIG. 1A described above, which can control operation of the conditioning system 1000 between the multiple operating modes for the process cooling units 1004A and 1004B. The system controller can also control switching the auxiliary cooling unit 1052 between operation as a fluid cooler or as a process cooling unit, depending in part on the operating mode of the process cooling units 1004A and 1004B and the quantity of the heat load.

In the conditioning systems shown in FIGS. 1-10, the cooling system or process cooling units can be configured such that the evaporative cooler can produce a reduced-temperature fluid, such as water, for providing liquid or air cooling to a heat load. The reduced-temperature fluid from the evaporative cooler can be as an alternative to or in addition to reduced-temperature fluid from the recovery coil of the cooling system or process cooling unit.

Figure 11:
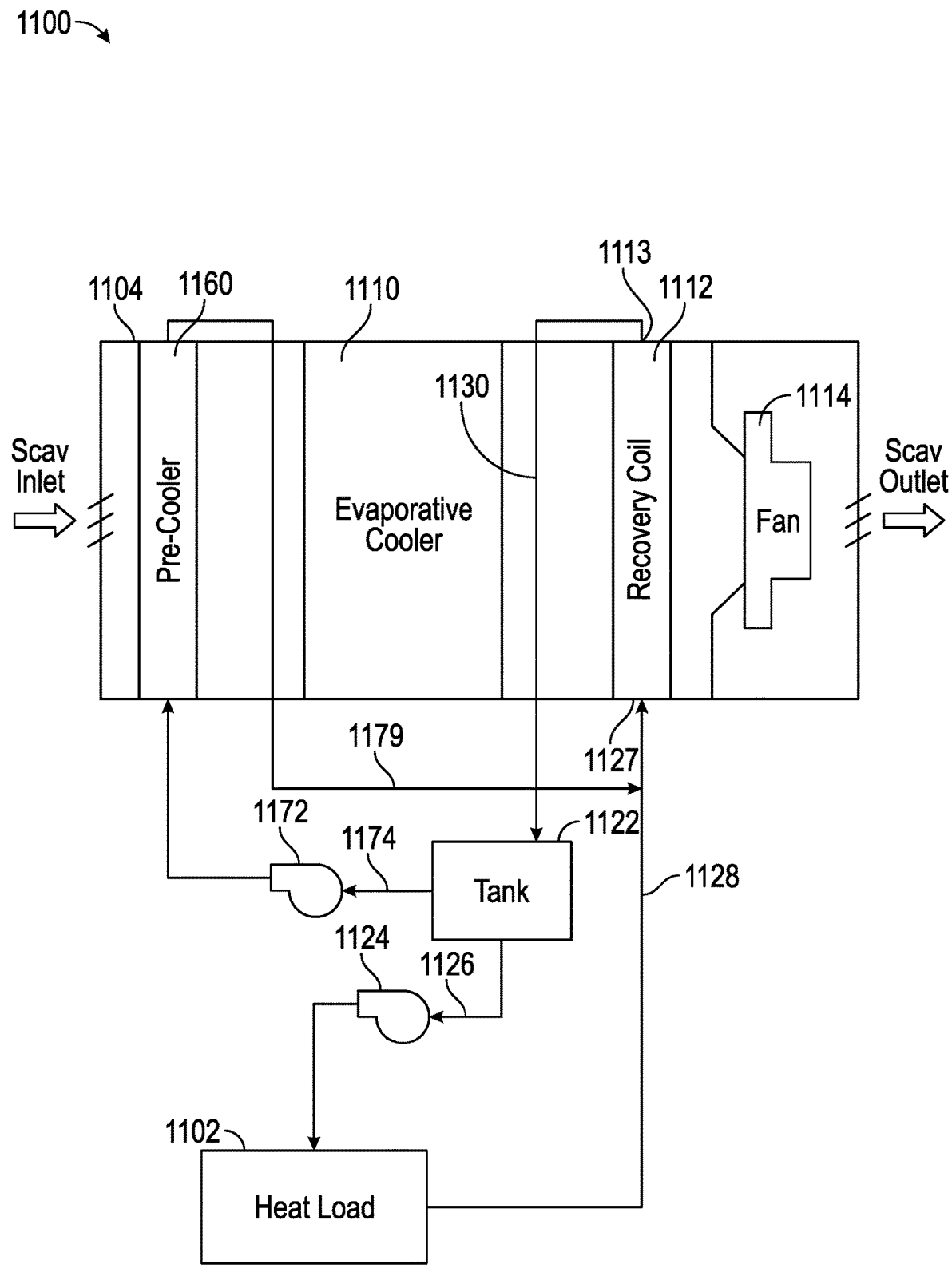
FIG. 11 is a schematic of an example conditioning system for providing liquid cooling.

FIG. 11 illustrates an example conditioning system 1100 for providing cooling to a heat load 1102. The conditioning system 1100 can include a pre-cooler 1160, an evaporative cooler 1110, recovery coil 1112 and a fan (or array) 1114, all of which can be arranged inside a scavenger air plenum 1104 (in a similar manner to the components in the scavenger air plenum 104A of FIG. 1A) and thus the plenum 1104 can also be referred to herein as a cooling unit or system 1104. As shown in FIG. 11, the cooling system 1104 can be configured to provide liquid cooling to the heat load 1102 using a scavenger air stream and a reduced-temperature cooling fluid from the recovery coil 1112. In an example, the reduced-temperature cooling fluid can be water.

In an example, the reduced-temperature water exiting the recovery coil 1112 at an outlet 1113 can be transported to a tank 1122 via a water line 1130. The water can be transported from the tank 1122 to the heat load 1102 (or to a cold water supply) via a water line 1126 and a pump 1124. In another example, a tank 1122 can be excluded from the system 1000 since the evaporative cooler 1110 is not included in the cooling circuit that provides cold water for liquid cooling to the heat load 1102. The circuit for the evaporative cooler 1110 can be a closed, pressurized hydraulic circuit and does not require an atmospheric pressure tank, as compared to at least some of the systems described above. After providing liquid cooling, the increased-temperature water can be returned to an inlet 1127 of the recovery coil 1112 via a line 1128 and the water can be recirculated back through the recovery coil 1112.

In contrast to the other conditioning systems shown in FIGS. 1-10, in the example shown in FIG. 11, a cooling fluid from the evaporative cooler 1110 is not collected for use in providing liquid cooling to the heat load 1102. Rather, in the conditioning system 1100, all of the cold water for liquid cooling essentially comes directly from the recovery coil 1112 in all operating modes. The evaporative cooler 1110 can operate adiabatically and condition the scavenger air such that the scavenger air exiting the evaporative cooler 1110 can cool the increased-temperature water passing through the recovery coil 1112. Through this adiabatic process, a temperature of the scavenger air at an outlet of the evaporative cooler 1110 can be less than a temperature of the scavenger air at an inlet of the evaporative cooler.

The evaporative cooler 1110 can include an evaporative fluid, which, in some cases, can be recirculated back through the evaporative cooler 1110. However, in contrast to the examples described above (which can include a LAMEE, for example), the evaporative fluid in the evaporative cooler 1110 is not collected for use in cooling the heat load 1102. As such, FIG. 11 does not include a water line from the evaporative cooler 1110 to the tank 1122 or a water line from the recovery coil outlet 1113 to the evaporative cooler 1110.

In an example, the evaporative cooler 1110 can use media that can be saturated with water. One or more media pads can be configured within the plenum 1104 in a generally vertical orientation such that a top of the pad can be sprayed with water and the water can drip down the pad to maintain saturation of the pad. The media pads can be configured to have a large surface area and, in some examples, can be corrugated. As the scavenger air passes through the media pads, the water can be evaporated, thus cooling the air. Any excess water that drips from the pads can be collected and recirculated to the top of the pad. The media pads can include known materials used in evaporative cooling, such as, for example, cellulose, fiberglass, and paper.

An evaporative media system for the evaporative cooler 1110 can be efficient, low maintenance and have a high cooling capacity. On the other hand, such a system can have low air and water flow limits, limited lifespan of the media (for example, 3-5 years) and water carry over into the scavenger air stream exiting the evaporative cooler 1110. Moreover, the system can have higher water consumption compared to other evaporative cooler designs.

In an example, the evaporative cooler 1110 can use a water sprayer to inject water into the scavenger air stream. The evaporative cooler 1110 can include a plurality of orifices, which can be arranged in an array, to distribute water into the scavenger air. The water can be pressurized for sufficient interjection of the water from the nozzle and into the air stream. A water sprayer can be low cost and efficient, but in some cases can require high maintenance and high quality water, such as reverse osmosis water. Depending on the design of the sprayer, it can be beneficial to have 6 to 8 feet of open space downstream of the sprayer.

In an example, the pre-cooler 1160 can be configured for operating similar to the pre-cooler 160A of FIG. 1A. Water from the tank 1122 can be delivered to the pre-cooler 1160 using a pump 1172 and a water line 1174. However, instead of the increased-temperature water exiting the pre-cooler 1160 being directed into the evaporative cooler 1110, the water from the pre-cooler 1160 can be delivered through a line 1179 to the inlet 1127 of the recovery coil 1112 (or to a junction with the water line 1128) for circulation through the recovery coil 1112.

As shown in FIG. 11, the pre-cooler 1160 can have a coupled cooling fluid circuit such that the cooling fluid circulating through the pre-cooler 1160 can be the water from the tank 1122 and the heated water exiting the pre-cooler 1160 can be recirculated back through the recovery coil 1112 with the heated water from the heat load 1102 in the water line 1128. In other examples, the conditioning system 1100 can be configured such that the pre-cooler 1160 can have a partially decoupled cooling circuit (see, for example, FIGS. 3 and 4) or a wholly or fully decoupled cooling circuit (see, for example, FIGS. 5-6 and 9-10).

The conditioning system 1100 can operate in multiple operating modes, including an economizer mode, an adiabatic mode and an enhanced adiabatic mode, which includes the addition of the pre-cooler 1060 to the adiabatic mode. The selection of the mode can depend in part on the outdoor air conditions as described above in reference to the other conditioning systems. Although not shown in FIG. 11, the system 1100 can include a system controller that can operate similar to the system controllers 148A and 148B of FIGS. 1A and 1B, respectively.

It is recognized that the conditioning system 1100 can include additional components or features not specifically shown in FIG. 11 but described above in reference to other example conditioning systems, such as, for example, bypass dampers or a LLHX for using the water to cool a coolant that receives heat rejected from the enclosed space or one or more devices.

The design of the scavenger plenum 1104 of FIG. 11, in which the evaporative cooler 1110 does not provide direct liquid cooling to the heat load 1102, can also be used for the air cooling design shown in FIG. 2. In an example, the scavenger plenum 204 of the conditioning system 200 of FIG. 2 can be replaced with the scavenger plenum 1104 as shown in FIG. 11. In such an example, the recovery coil alone, rather than the evaporative cooler and recovery coil in combination, can supply the reduced-temperature water used to provide air cooling to a process air stream through flowing through a LAHX. The design of the scavenger plenum 1104 of FIG. 11 can be used in a conditioning system having multiple process cooling units. For example, one or more of the multiple cooling units 404 shown in FIG. 4 can be substituted with the scavenger plenum 1104 of FIG. 11.

Figure 12:
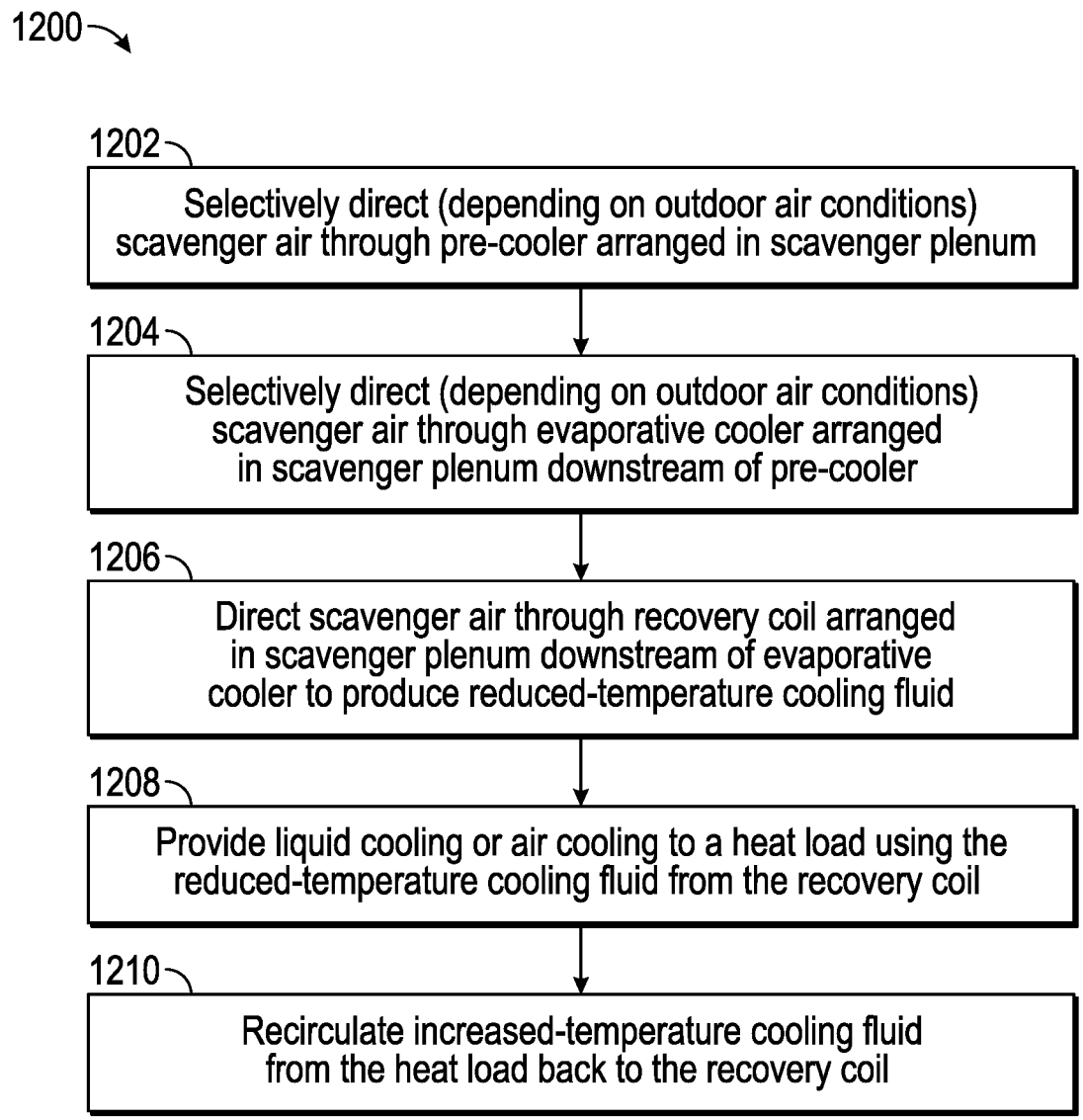
FIG. 12 is a flowchart of an example method of operating a conditioning system in accordance with the present application.

FIG. 12 is a flow chart depicting an example method 1200 of operating a conditioning system in accordance with the present application. The method 1200 can include in 1202 selectively directing scavenger air through a pre-cooler arranged in a scavenger air plenum to condition the scavenger air using a cooling fluid in the pre-cooler. The pre-cooler can selectively be used depending on the conditions of the outdoor air, which can determine an operating mode of the conditioning system. The method 1200 can include in 1204 selectively directing scavenger air through an evaporative cooler arranged in the scavenger air plenum downstream of the pre-cooler. The evaporative cooler can selectively be used depending on the conditions of the outdoor air and the determined operating mode of the conditioning system. The method 1200 can include in 1206 directing scavenger air through a recovery coil arranged in the scavenger air plenum downstream of the evaporative cooler to produce a reduced-temperature cooling fluid. The cooling fluid can circulate through the recovery coil and the conditioned scavenger air can be used to cool the cooling fluid.

The method 1200 can include in 1208 providing liquid cooling or air cooling to a heat load using the reduced-temperature cooling fluid from the recovery coil. In an example, the reduced-temperature cooling fluid can be delivered to the heat load as a process cooling fluid to provide liquid cooling. In an example, some or all of the reduced-temperature cooling fluid exiting the recovery coil can pass through the evaporative cooler prior to being delivered to the heat load. The heat load can be from an enclosed space that contains one or more heat generating components or the heat load can be from one or more devices or components open to the atmosphere. In an example, the reduced-temperature cooling fluid can cool a secondary coolant in a liquid to liquid heat exchanger and the secondary coolant can receive heat rejected from the enclosed space or one or more devices. In an example, providing cooling to the heat load in 1208 can include moving hot process air from the enclosed space through a process air plenum to cool the process air through air cooling.

After providing cooling to the heat load, the process cooling fluid can be at an increased temperature. The method 1200 can include in 1210 recirculating the increased-temperature cooling fluid from the heat load back to the recovery coil.

In an example, the evaporative cooler in 1204 can be configured to provide liquid or air cooling in combination with the reduced-temperature cooling fluid from the recovery coil. The evaporative fluid from the evaporative cooler can be collected for use in providing liquid or air cooling in 1208. In an example, a cooling fluid circuit of the evaporative cooler can be in fluid communication with a cooling fluid circuit of the recovery coil and the reduced temperature cooling fluid from the recovery coil can flow through the evaporative cooler for further cooling, prior to being provided to the heat load. In an example, the evaporative cooler in 1204 can selectively operate in an adiabatic mode in which an evaporative fluid in the evaporative cooler can be recirculated back through the evaporative cooler in a closed circuit and thus separate from the cooling fluid circuit in the recovery coil.

In an example, the cooling fluid in the pre-cooler in 1202 can be coupled with the cooling fluid circuit in one or both of the evaporative cooler and recovery coil. In an example, the cooling fluid in the pre-cooler in 1202 can be coupled with the process cooling fluid circuit that provides cooling to the heat load. In an example, the cooling fluid in the pre-cooler 1202 can be separate from the process cooling fluid circuit and can use an external fluid cooler for cooling the cooling fluid in the pre-cooler 1202.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The present application provides for the following exemplary embodiments or examples, the numbering of which is not to be construed as designating levels of importance:

Example 1 provides a conditioning system for providing cooling to a heat load, the conditioning system comprising: a scavenger plenum having an air inlet and outlet, the scavenger plenum configured to direct scavenger air in an air flow path from the air inlet to the air outlet; an evaporative cooler arranged inside the scavenger plenum in the air flow path and having a first cooling fluid circuit configured to circulate a first cooling fluid through the evaporative cooler, the evaporative cooler configured to selectively evaporate a portion of the first cooling fluid; a first cooling component arranged inside the scavenger plenum between the air inlet and the evaporative cooler, the first cooling component configured to selectively condition the scavenger air flowing through the first cooling component; a second cooling component arranged inside the scavenger plenum between the evaporative cooler and the air outlet and having a second cooling fluid circuit configured to circulate a second cooling fluid through the second cooling component, the second cooling component configured to reduce a temperature of the second cooling fluid using scavenger air; and a process cooling fluid circuit connected to at least one of the first cooling fluid circuit and the second cooling fluid circuit, the process cooling fluid circuit configured to provide a process cooling fluid to cool the heat load.

Example 2 provides the system of Example 1 and optionally wherein the first cooling fluid circuit and the second cooling fluid circuit are fluidly connected, and the first and second cooling fluids are the same.

Example 3 provides the system of Examples 1 and/or 2 and optionally also wherein the first cooling fluid and the second cooling fluid provide at least one of liquid cooling or air cooling to the heat load.

Example 4 provides the system of any of Examples 1-3 and optionally wherein the second cooling fluid exiting the second cooling component selectively flows through the evaporative cooler.

Example 5 provides the system of any of Examples 1-4 and optionally wherein the evaporative cooler is a liquid-to-air membrane energy exchanger (LAMEE), and the first cooling fluid is separated from the air flow path by a membrane, the LAMEE configured to condition the scavenger air and evaporatively cool the first cooling fluid.

Example 6 provides the system of any of Examples 1-4 and optionally further comprising a cooling tower, the cooling tower comprising the evaporative cooler.

Example 7 provides the system of Example 1 and optionally wherein the first cooling fluid circuit is separate from the second cooling fluid circuit, and wherein the second cooling fluid is the process cooling fluid.

Example 8 provides the system of Example 7 and optionally wherein the evaporative cooler includes at least one of an evaporative media or a water sprayer.

Example 9 provides the system of Examples 7 and/or 8 and optionally wherein a remaining portion of the first cooling fluid exiting an outlet of the evaporative cooler is recirculated back through the evaporative cooler.

Example 10 provides the system of any of Examples 1-9 and optionally further comprising one or more bypass dampers configured to permit scavenger air to enter or exit the air flow path at one or more locations between the air inlet and outlet.

Example 11 provides the system of Example 10 and optionally wherein the one or more bypass dampers include a first set of bypass dampers configured to direct scavenger air into the air flow path at a location between the first cooling component and the evaporative cooler.

Example 12 provides the system of Examples 10 and/or 11 and optionally wherein the one or more bypass dampers include a second set of bypass dampers configured to direct scavenger air into the air flow path at a location between the evaporative cooler and the second cooling component.

Example 13 provides the system of any of Examples 1-12 and optionally wherein the evaporative cooler cools the scavenger air such that a temperature of the scavenger air at an outlet of the evaporative cooler is less than a temperature of the scavenger air at an inlet of the evaporative cooler.

Example 14 provides the system of any of Examples 1-12 and optionally wherein the evaporative cooler cools the first cooling fluid such that a temperature of the first cooling fluid at an outlet of the evaporative cooler is less than a temperature of the first cooling fluid at an inlet of the evaporative cooler.

Example 15 provides the system of Example 14 and optionally wherein the reduced-temperature first cooling fluid is transported from the evaporative cooler to the process cooling fluid circuit.

Example 16 provides the system of any of Examples 1-13 and optionally wherein the evaporative cooler operates in an adiabatic mode, and the first cooling fluid circuit is a closed circuit within the evaporative cooler.

Example 17 provides the system of any of Examples 1-16 and optionally wherein the heat load is from an enclosed space with one or more heat-generating components.

Example 18 provides the system of Example 17 and optionally further comprising: a process plenum configured to direct process air from the enclosed space in an air flow path from a process air inlet to a process air outlet; and a liquid-to-air heat exchanger (LAHX) arranged inside the process plenum, wherein the LAHX is part of the process cooling fluid circuit and configured to direct the process cooling fluid through the LAHX to provide air cooling to the process air flow path, wherein the process air exiting the process plenum at the process air outlet is returned to the enclosed space as cool supply air.

Example 19 provides the system of Example 17 and optionally wherein the process cooling fluid is delivered to the enclosed space to provide liquid cooling to at least one of process air in the enclosed space or one or more components in the enclosed space.

Example 20 provides the system of any of Examples 17-19 and optionally wherein the enclosed space is a data center.

Example 21 provides the system of any of Examples 1-20 and optionally wherein the first cooling component is a liquid-to-air heat exchanger (LAHX) having a third cooling fluid circuit and configured to selectively circulate a third cooling fluid to condition the scavenger air.

Example 22 provides the system of Example 21 and optionally wherein the third cooling fluid circuit is fluidly connected to the process cooling circuit.

Example 23 provides the system of any of Example 21 and optionally wherein the third cooling fluid circuit is fluidly connected to the first and second cooling fluid circuits.

Example 24 provides the system of any of Example 21 and optionally wherein the third cooling fluid circuit is separate from the process cooling circuit and the first and second cooling fluid circuits.

Example 25 provides the system of any of Example 24 and optionally wherein the third cooling fluid circuit comprises a fluid cooler configured to reduce a temperature of the third cooling fluid exiting the first cooling component.

Example 26 provides the system of any of Example 25 and optionally wherein the fluid cooler includes a liquid-to-air membrane energy exchanger (LAMEE) arranged inside an auxiliary scavenger air plenum and a recovery coil arranged inside the auxiliary scavenger air plenum downstream of the LAMEE, and wherein the third cooling fluid flows through at least one of the LAMEE and the recovery coil to reduce a temperature of the third cooling fluid.

Example 27 provides the system of any of Examples 1-16 and optionally wherein the heat load is from one or more devices.

Example 28 provides the system of Example 27 and optionally wherein the one or more devices are contained within an enclosed space.

Example 29 provides the system of Examples 27 and/or 28 and optionally wherein the one or more devices are open to the atmosphere and an exterior of the one or more devices is exposed to outdoor air.

Example 30 provides a method of providing cooling to a heat load, the method comprising: selectively directing scavenger air through a pre-cooling unit arranged in a scavenger air plenum, the scavenger air entering the plenum at an air inlet and exiting the plenum at an air outlet, and the pre-cooling unit configured to condition the scavenger air entering the plenum; selectively directing the scavenger air exiting the pre-cooling unit through an evaporative cooler arranged in the plenum, the evaporative cooler having a first cooling fluid circuit and configured to selectively evaporate a first cooling fluid in the first cooling fluid circuit; directing the scavenger air exiting the evaporative cooler through a recovery coil arranged in the plenum, the recovery coil having a second cooling fluid circuit and configured to reduce a temperature of a second cooling fluid in the second cooling fluid circuit using the scavenger air; and providing cooling to the heat load using a process cooling fluid in a process cooling fluid circuit, the process cooling fluid circuit connected to at least one of the first cooling fluid circuit and the second cooling fluid circuit.

Example 31 provides the method of Example 30 and optionally wherein the process cooling fluid includes the first cooling fluid exiting the evaporative cooler.

Example 32 provides the method of Examples 30 and/or 31 and optionally the method further comprising: transporting at least one of the first cooling fluid exiting the evaporative cooler and the second cooling fluid exiting the recovery coil to at least one tank to store the at least one of the first and second cooling fluids prior to using the at least one of the first and second cooling fluids to provide cooling to the heat load.

Example 33 provides the method of Example 32 and optionally wherein the process cooling fluid is the cooling fluid from the tank.

Example 34 provides the method of any of Examples 30-33 and optionally wherein providing cooling to the heat load using a process cooling fluid includes: circulating the process cooling fluid through a liquid to liquid heat exchanger (LLHX) to reduce a temperature of a secondary coolant; and cooling at least one of an enclosed space or one or more devices using the reduced-temperature secondary coolant.

Example 35 provides the method of any of Examples 30-34 and optionally wherein providing cooling to the heat load using the process cooling fluid includes at least one of air cooling or liquid cooling.

Example 36 provides the method of Example 35 and optionally wherein the heat load is from an enclosed spaced containing one or more heat generating components.

Example 37 provides the method of any of Example 36 and optionally wherein the process cooling fluid is delivered to the enclosed space to provide liquid cooling.

Example 38 provides the method of Example 36 and optionally wherein providing cooling to the heat load using a process cooling fluid comprises: delivering the process cooling fluid to a liquid-to-air heat exchanger (LLHX) arranged inside a process air plenum; delivering a process air stream from the enclosed space to the LLHX; and reducing a temperature of the process air stream in the LLHX using the process cooling fluid.

Example 39 provides the method of Example 38 and optionally further comprising: returning the process air stream to the enclosed space; and returning the process cooling fluid to at least one of the recovery coil and the evaporative cooler.

Example 40 provides the method of any of Examples 30-34 and optionally wherein providing cooling to the heat load includes delivering the process cooling fluid to one or more devices that are open to the atmosphere, and wherein an exterior of the one or more devices is exposed to outdoor air.

Example 41 provides the method of any of Examples 30-40 and optionally wherein selectively delivering scavenger air through a pre-cooling unit includes using a bypass damper between the pre-cooling unit and the evaporative cooler to bypass the pre-cooling unit depending on outdoor air conditions.

Example 42 provides the method of any of Examples 30-41 and optionally wherein selectively delivering scavenger air through an evaporative cooler includes using a bypass damper between the evaporative cooler and the recovery coil to bypass the pre-cooling unit and the evaporative cooler depending on outdoor air conditions.

Example 43 provides the method of any of Examples 30-42 and optionally wherein selectively directing the scavenger air exiting the pre-cooling unit through an evaporative cooler comprises: operating the evaporative cooler adiabatically to condition the scavenger air stream in the evaporative cooler; and recirculating the first cooling fluid through the evaporative cooler such that the first cooling fluid circuit is a closed circuit in the evaporative cooler.

Example 44 provides the method of Example 43 and optionally wherein a first tank stores the process cooling fluid prior to providing cooling to the heat load, and wherein a second tank is part of the closed circuit in the evaporative cooler.

Example 45 provides the method of any of Examples 30-44 and optionally wherein selectively directing the scavenger air exiting the pre-cooling unit through an evaporative cooler includes reducing a temperature of the scavenger air in the evaporative cooler such that a temperature of the scavenger air at an outlet of the evaporative cooler is less than a temperature of the scavenger air at an inlet of the evaporative cooler.

Example 46 provides the method of any of Examples 30-42 and optionally wherein the first and second cooling fluid circuits are fluidly connected and the first and second cooling fluids are the same fluid.

Example 47 provides the method of Example 46 and optionally wherein the process cooling fluid includes the first and second cooling fluids and the method further comprises: recirculating the first and second cooling fluids through the recovery coil and the evaporative cooler.

Example 48 provides the method of any of Examples 30-47 and optionally wherein selectively directing scavenger air through a pre-cooling unit arranged in a scavenger air plenum includes circulating a third cooling fluid through the pre-cooling unit to condition the scavenger air.

Example 49 provides the method of Example 48 and optionally wherein the third cooling fluid is in a third cooling fluid circuit connected to the process cooling fluid circuit.

Example 50 provides the method of Examples 48 and/or 49 and optionally wherein the third cooling fluid is in a third cooling fluid circuit connected to the first and second cooling fluid circuits.

Example 51 provides the method of Example 48 and optionally wherein the third cooling fluid is in a third cooling fluid circuit separate from the process cooling circuit and the first and second cooling fluid circuits, and the method further comprises: directing the third cooling fluid exiting the pre-cooling unit through an auxiliary cooling unit configured to reduce a temperature of the third cooling fluid; and recirculating the reduced-temperature third cooling fluid through the pre-cooling unit during operation of the pre-cooling unit.

Example 52 provides a conditioning system for providing cooling to a heat load, the conditioning system comprising: a plurality of process cooling units, each process cooling unit configured to produce a reduced-temperature cooling fluid and comprising: a scavenger plenum having an air inlet and outlet, the scavenger plenum configured to direct scavenger air in an air flow path from the air inlet to the air outlet; an evaporative cooler arranged inside the scavenger plenum in the air flow path and having a first cooling fluid circuit configured to circulate a first cooling fluid through the evaporative cooler, the evaporative cooler configured to selectively evaporate a portion of the first cooling fluid; a first cooling component arranged inside the scavenger plenum between the air inlet and the evaporative cooler, the first cooling component configured to selectively condition the scavenger air flowing through the first cooling component; and a second cooling component arranged inside the scavenger plenum between the evaporative cooler and the air outlet and having a second cooling fluid circuit configured to circulate a second cooling fluid through the second cooling component, the second cooling component configured to reduce a temperature of the second cooling fluid; and a process cooling fluid supply circuit connected to at least one of the first and second cooling fluid circuits of each of the plurality of cooling units and configured to supply a process cooling fluid to the heat load to cause heat rejected by the heat load to be received by the process cooling fluid, the process cooling fluid comprising at least one of the first and second cooling fluids; and a process cooling fluid return circuit configured to receive the process cooling fluid after the process cooling fluid receives heat rejected by the heat load and to return the process cooling fluid back to each of the plurality of process cooling units for recirculation through at least one of the second cooling component and the evaporative cooler of each of the plurality of process cooling units.

Example 53 provides the system of Example 52 and optionally wherein each process cooling unit further comprises: a tank configured to receive and temporarily store at least one of the first and second cooling fluids prior to supplying the process cooling fluid to the heat load.

Example 54 provides the system of Example 53 and optionally wherein the tank is located inside the scavenger plenum.

Example 55 provides the system of Example 53 and optionally wherein the tank is located outside of the scavenger plenum.

Example 56 provides the system of any of Examples 52-55 and optionally wherein the evaporative cooler of each process cooling unit is a liquid-to-air membrane energy exchanger (LAMEE) and the first cooling fluid is separated from the scavenger air by a membrane.

Example 57 provides the system of any of Examples 52-56 and optionally wherein the evaporative cooler of each process cooling unit is configured to selectively operate adiabatically and the first cooling fluid circuit includes a selectively closed circuit within the evaporative cooler.

Example 58 provides the system of any of Examples 52-57 and optionally wherein the first cooling fluid circuit of each process cooling unit is connected to the second cooling fluid circuit.

Example 59 provides the system of Example 58 and optionally wherein the reduced-temperature second cooling fluid selectively flows through the evaporative cooler prior to exiting the scavenger plenum.

Example 60 provides the system of any of Examples 52-58 and optionally wherein the first cooling component of each process cooling unit is a liquid-to-air heat exchanger (LAHX) having a third cooling fluid circuit and configured to selectively circulate a third cooling fluid to condition the scavenger air.

Example 61 provides the system of Example 60 and optionally wherein the process cooling fluid supply circuit provides a portion of the process cooling fluid to the first cooling component for use as the third cooling fluid.

Example 62 provides the system of Examples 60 and/or 61 and optionally wherein the third cooling fluid exits the first cooling component at an increased-temperature and is transported to the process cooling fluid return circuit.

Example 63 provides the system of Example 60 and optionally further comprising an auxiliary cooling unit configured to reduce a temperature of the third cooling fluid exiting the first cooling component of one or more of the process cooling units in the plurality of process cooling units.

Example 64 provides the system of Example 63 and optionally wherein the auxiliary cooling unit includes a liquid-to-air membrane energy exchanger (LAMEE) arranged inside an auxiliary scavenger air plenum and a recovery coil arranged downstream of the LAMEE in the auxiliary scavenger air plenum, and wherein the third cooling fluid flows through at least one of the LAMEE and the recovery coil to reduce a temperature of the third cooling fluid.

Example 65 provides the system of Examples 63 and/or 64 and optionally wherein the auxiliary cooling unit selectively operates to provide process cooling fluid to the process cooling fluid supply circuit when the plurality of process cooling units are operating in a mode in which the first cooling component of each process cooling unit is bypassed.

Example 66 provides the system of any of Examples 52-65 and optionally wherein the heat load is from an enclosed space with one or more heat-generating components.

Example 67 provides the system of Example 66 and optionally wherein the enclosed space is a data center.

Example 68 provides a conditioning system for providing cooling to a heat load, the conditioning system comprising: a process cooling unit comprising: a scavenger air plenum having an air inlet and outlet, the plenum configured to direct scavenger air in an air flow path from the air inlet to the air outlet; an evaporative cooler arranged inside the plenum in the air flow path and having a first cooling fluid circuit configured to selectively circulate a first cooling fluid through the evaporative cooler, the evaporative cooler configured to selectively evaporate a portion of the first cooling fluid; a pre-cooler arranged inside the plenum upstream of the evaporative cooler, the pre-cooler having a second cooling fluid circuit configured to selectively circulate a second cooling fluid through the pre-cooler to selectively condition the scavenger air, prior to selectively passing the scavenger air through the evaporative cooler; and a recovery coil arranged inside the plenum downstream of the evaporative cooler, the recovery coil having a third cooling fluid circuit configured to circulate a third cooling fluid through the recovery coil, the recovery coil configured to reduce a temperature of the third cooling fluid; a process cooling fluid circuit connected to at least one of the first cooling fluid circuit and the third cooling fluid circuit, the process cooling fluid circuit configured to supply at least one of the first cooling fluid and the third cooling fluid to the heat load to cause heat rejected by the heat load to be received by the at least one of the first and third cooling fluids; and an auxiliary cooling unit configured to cool the second cooling fluid exiting the pre-cooler, wherein the auxiliary cooling unit is part of the second cooling fluid circuit and separate from the first and third cooling fluid circuits.

Example 69 provides the system of Example 68 and optionally wherein the evaporative cooler is a LAMEE, and the process cooling fluid circuit supplies the first and third cooling fluids to the heat load.

Example 70 provides the system of Examples 68 and/or 69 and optionally wherein the evaporate cooler selectively operates adiabatically and the first cooling fluid circuit is a closed circuit, and wherein the process cooling fluid circuit supplies the third cooling fluid to the heat load.

Example 71 provides the system of any of Examples 68-70 and optionally wherein the auxiliary cooling unit comprises a LAMEE arranged inside an auxiliary scavenger air plenum and a recovery coil arranged downstream of the LAMEE in the auxiliary scavenger air plenum, and wherein the second cooling fluid flows through at least one of the LAMEE and the recovery coil to reduce a temperature of the second cooling fluid.

Example 72 provides the system of any of Examples 68-71 and optionally wherein the auxiliary cooling unit is configured to selectively operate when the pre-cooler is used to condition the scavenger air, and the auxiliary unit is not in operation when the pre-cooler is bypassed.

Example 73 provides the system of any of Examples 68-72 and optionally wherein the auxiliary cooling unit is configured to selectively provide an auxiliary cooling fluid to the heat load when the pre-cooler is bypassed.

Example 74 provides a method of providing cooling to a heat load, the method comprising: selectively directing scavenger air through a pre-cooler arranged inside a scavenger air plenum, the scavenger air entering the plenum at an air inlet and exiting the plenum at an air outlet, the pre-cooler having a first cooling fluid circuit configured to selectively circulate a first cooling fluid through the pre-cooler to selectively condition the scavenger air; selectively directing the first cooling fluid exiting the pre-cooler through an auxiliary cooling unit to decrease a temperature of the first cooling fluid; selectively directing the scavenger air through an evaporative cooler arranged inside the scavenger air plenum downstream of the pre-cooler, the evaporative cooler having an evaporative cooler fluid circuit configured to circulate an evaporative cooler fluid through the evaporative cooler, and the evaporative cooler configured to selectively evaporate a portion of the evaporative cooler fluid; directing the scavenger air through a recovery coil arranged inside the scavenger air plenum downstream of the evaporative cooler, the recovery coil having a second cooling fluid circuit configured to circulate a second cooling fluid, and the recovery coil configured to reduce a temperature of the second cooling fluid using scavenger air; and supplying a process cooling fluid in a process cooling fluid circuit to the heat load, the process cooling fluid receiving heat rejected by the heat load, wherein the process cooling fluid circuit is connected to the second cooling fluid circuit and the process cooling fluid comprises the second cooling fluid, and wherein the first cooling fluid circuit is separate from the second cooling fluid circuit.

Example 75 provides the method of Example 74 and optionally further comprising: delivering the reduced-temperature first cooling fluid back to the pre-cooler after the first cooling fluid circulates through the auxiliary cooling unit.

Example 76 provides the method of Examples 74 and/or 75 and optionally wherein the process cooling fluid is at an increased-temperature after receiving heat rejected by the heat load, and the method further comprise: delivering the increased-temperature process cooling fluid to the recovery coil.

Example 77 provides the method of any of Examples 74-76 and optionally wherein selectively directing the first cooling fluid exiting the pre-cooler through an auxiliary cooling unit comprises: directing the first cooling fluid through a recovery coil arranged in an auxiliary scavenger air plenum to reduce a temperature of the first cooling fluid; and selectively directing the reduced-temperature first cooling fluid exiting the recovery coil through a LAMEE arranged in the auxiliary scavenger air plenum upstream of the recovery coil.

Example 78 provides the method of any of Examples 74-77 and optionally wherein a portion of the evaporative cooler fluid is collected and used as the process cooling fluid in the process cooling fluid circuit.

Example 79 provides the method of any of Examples 74-78 and optionally wherein the evaporative cooler is a LAMEE comprising an evaporative fluid flow path separate from an air flow path, and wherein the flow paths are separated by a membrane.

Example 80 provides a system or method of any one or any combination of Examples 1-79, which can be optionally configured such that all steps or elements recited are available to use or select from.

Various aspects of the disclosure have been described. These and other aspects are within the scope of the following claims.

What is claimed is:

1. A conditioning system for providing cooling to a heat load, the conditioning system comprising:
a plurality of process cooling units, each process cooling unit configured to produce a reduced-temperature cooling fluid and comprising:
a scavenger plenum having an air inlet and outlet, the scavenger plenum configured to direct scavenger air in an air flow path from the air inlet to the air outlet;
an evaporative cooler arranged inside the scavenger plenum in the air flow path and having a first cooling fluid circuit configured to circulate a first cooling fluid through the evaporative cooler, the evaporative cooler configured to selectively evaporate a portion of the first cooling fluid;
a first cooling component arranged inside the scavenger plenum between the air inlet and the evaporative cooler, the first cooling component configured to selectively condition the scavenger air flowing through the first cooling component; and
a second cooling component arranged inside the scavenger plenum between the evaporative cooler and the air outlet and having a second cooling fluid circuit configured to circulate a second cooling fluid through the second cooling component, the second cooling component configured to reduce a temperature of the second cooling fluid; and
a process cooling fluid supply circuit connected to at least one of the first and second cooling fluid circuits of each of the plurality of cooling units and configured to supply a process cooling fluid to the heat load to cause heat rejected by the heat load to be received by the process cooling fluid, the process cooling fluid comprising at least one of the first and second cooling fluids; and
a process cooling fluid return circuit configured to receive the process cooling fluid after the process cooling fluid receives heat rejected by the heat load and to return the process cooling fluid back to each of the plurality of process cooling units for recirculation through at least one of the second cooling component and the evaporative cooler of each of the plurality of process cooling units.

2. The conditioning system of claim 1 wherein each process cooling unit further comprises:
a tank configured to receive and temporarily store at least one of the first and second cooling fluids prior to supplying the process cooling fluid to the heat load.

3. The cooling system of claim 2 wherein the tank is located inside the scavenger plenum.

4. The cooling system of claim 2 wherein the tank is located outside of the scavenger plenum.

5. The cooling system of claim 1 wherein the evaporative cooler of each process cooling unit is a liquid-to-air membrane energy exchanger (LAMEE) and the first cooling fluid is separated from the scavenger air by a membrane.

6. The cooling system of claim 1 wherein the evaporative cooler of each process cooling unit is configured to selectively operate adiabatically and the first cooling fluid circuit includes a selectively closed circuit within the evaporative cooler.

7. The cooling system of claim 1 wherein the first cooling fluid circuit of each process cooling unit is connected to the second cooling fluid circuit.

8. The cooling system of claim 7 wherein the reduced-temperature second cooling fluid selectively flows through the evaporative cooler prior to exiting the scavenger plenum.

9. The cooling system of claim 1 wherein the first cooling component of each process cooling unit is a liquid-to-air heat exchanger (LAHX) having a third cooling fluid circuit and configured to selectively circulate a third cooling fluid to condition the scavenger air.

10. The conditioning system of claim 9 wherein the process cooling fluid supply circuit provides a portion of the process cooling fluid to the first cooling component for use as the third cooling fluid.

11. The conditioning system of claim 10 wherein the third cooling fluid exits the first cooling component at an increased-temperature and is transported to the process cooling fluid return circuit.

12. The conditioning system of claim 9 further comprising an auxiliary cooling unit configured to reduce a temperature of the third cooling fluid exiting the first cooling component of one or more of the process cooling units in the plurality of process cooling units.

13. The conditioning system of claim 12 wherein the auxiliary cooling unit includes a liquid-to-air membrane energy exchanger (LAMEE) arranged inside an auxiliary scavenger air plenum and a recovery coil arranged downstream of the LAMEE in the auxiliary scavenger air plenum, and wherein the third cooling fluid flows through at least one of the LAMEE and the recovery coil to reduce a temperature of the third cooling fluid.

14. The conditioning system of claim 12 wherein the auxiliary cooling unit selectively operates to provide process cooling fluid to the process cooling fluid supply circuit when the plurality of process cooling units are operating in a mode in which the first cooling component of each process cooling unit is bypassed.

15. The conditioning system of claim 1, wherein the heat load is from an enclosed space with one or more heat-generating components.

16. The conditioning system of claim 15 wherein the enclosed space is a data center.

17. A method of providing cooling to a heat load, the method comprising:
selectively directing scavenger air through a pre-cooler arranged inside a scavenger air plenum, the scavenger air entering the plenum at an air inlet and exiting the plenum at an air outlet, the pre-cooler having a first cooling fluid circuit configured to selectively circulate a first cooling fluid through the pre-cooler to selectively condition the scavenger air;
selectively directing the first cooling fluid exiting the pre-cooler through an auxiliary cooling unit to decrease a temperature of the first cooling fluid;
selectively directing the scavenger air through an evaporative cooler arranged inside the scavenger air plenum downstream of the pre-cooler, the evaporative cooler having an evaporative cooler fluid circuit configured to circulate an evaporative cooler fluid through the evaporative cooler, and the evaporative cooler configured to selectively evaporate a portion of the evaporative cooler fluid;
directing the scavenger air through a recovery coil arranged inside the scavenger air plenum downstream of the evaporative cooler, the recovery coil having a second cooling fluid circuit configured to circulate a second cooling fluid, and the recovery coil configured to reduce a temperature of the second cooling fluid using scavenger air; and
supplying a process cooling fluid in a process cooling fluid circuit to the heat load, the process cooling fluid receiving heat rejected by the heat load, wherein the process cooling fluid circuit is connected to the second cooling fluid circuit and the process cooling fluid comprises the second cooling fluid, and
wherein the first cooling fluid circuit is separate from the second cooling fluid circuit.

18. The method of claim 17 further comprising:
delivering the reduced-temperature first cooling fluid back to the pre-cooler after the first cooling fluid circulates through the auxiliary cooling unit.

19. The method of claim 17 wherein the process cooling fluid is at an increased temperature after receiving heat rejected by the heat load, and the method further comprise:
delivering the increased-temperature process cooling fluid to the recovery coil.

20. The method of claim 17 wherein selectively directing the first cooling fluid exiting the pre-cooler through an auxiliary cooling unit comprises:
directing the first cooling fluid through a recovery coil arranged in an auxiliary scavenger air plenum to reduce a temperature of the first cooling fluid; and
selectively directing the reduced-temperature first cooling fluid exiting the recovery coil through a LAMEE arranged in the auxiliary scavenger air plenum upstream of the recovery coil.

21. The method of claim 17 wherein a portion of the evaporative cooler fluid is collected and used as the process cooling fluid in the process cooling fluid circuit.

22. The method of claim 21 wherein the evaporative cooler is a LAMEE comprising an evaporative fluid flow path separate from an air flow path, and wherein the flow paths are separated by a membrane.

* * * * *

UNITED STATES PATENT AND TRADEMARK OFFICE
CERTIFICATE OF CORRECTION

PATENT NO. : 10,808,951 B2
APPLICATION NO. : 16/083280
DATED : October 20, 2020
INVENTOR(S) : LePoudre et al.

Page 1 of 1

It is certified that error appears in the above-identified patent and that said Letters Patent is hereby corrected as shown below:

On the Title Page

Page 6, Column 1, item [56], Line 4, delete "Witten" and insert --Written-- therefor Page 6, Column 2, item [56], Line 2, delete "Wth" and insert --With-- therefor Page 6, Column 2, item [56], Line 62, delete "Wth" and insert --With-- therefor Page 7, Column 2, item [56], Line 17, delete "Englosed" and insert --Enclosed-- therefor In the Claims Column 52, Line 58, Claim 3, delete "cooling" and insert --conditioning-- therefor Column 52, Line 60, Claim 4, delete "cooling" and insert --conditioning-- therefor Column 52, Line 62, Claim 5, delete "cooling" and insert --conditioning-- therefor Column 52, Line 66, Claim 6, delete "cooling" and insert --conditioning-- therefor Column 53, Line 4, Claim 7, delete "cooling" and insert --conditioning-- therefor Column 53, Line 7, Claim 8, delete "cooling" and insert --conditioning-- therefor Column 53, Line 10, Claim 9, delete "cooling" and insert --conditioning-- therefor Signed and Sealed this
Thirtieth Day of March, 2021

Drew Hirshfeld
*Performing the Functions and Duties of the
Under Secretary of Commerce for Intellectual Property and
Director of the United States Patent and Trademark Office*